(12) United States Patent
Makiyama

(10) Patent No.: US 10,297,613 B2
(45) Date of Patent: *May 21, 2019

(54) METHOD OF MANUFACTURING SEMICONDUCTOR DEVICE

(71) Applicant: Renesas Electronics Corporation, Tokyo (JP)

(72) Inventor: Hideki Makiyama, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/942,754

(22) Filed: Apr. 2, 2018

(65) Prior Publication Data

US 2018/0226431 A1  Aug. 9, 2018

Related U.S. Application Data

(63) Continuation of application No. 15/603,564, filed on May 24, 2017, now Pat. No. 9,960,183.

(30) Foreign Application Priority Data

Jun. 3, 2016 (JP) .................................. 2016-112050

(51) Int. Cl.
*H01L 21/84* (2006.01)
*H01L 27/12* (2006.01)
(Continued)

(52) U.S. Cl.
CPC .... *H01L 27/1207* (2013.01); *H01L 21/76283* (2013.01); *H01L 21/84* (2013.01); *H01L 29/0649* (2013.01)

(58) Field of Classification Search
CPC ................... H01L 227/1207; H01L 21/76283
(Continued)

(56) References Cited

U.S. PATENT DOCUMENTS 6,060,748 A    5/2000 Uchida et al.
9,960,183 B2 *  5/2018 Makiyama ........ H01L 21/76283
(Continued)

FOREIGN PATENT DOCUMENTS

JP    2002-009144 A    1/2002
JP    2004-363121 A    12/2004
(Continued)

*Primary Examiner* — Igwe U Anya
(74) *Attorney, Agent, or Firm* — Sughrue Mion, PLLC

(57) ABSTRACT

Reliability of a semiconductor device is improved. Prepared is a substrate in which an insulating layer, a semiconductor layer, and an insulating film are laminated on a semiconductor substrate, and a device isolation region is embedded in a trench. The insulating film in a bulk region is removed; the semiconductor layer in the bulk region is removed by using a first etching liquid; and thereafter the insulating film in the SOI region and the insulating layer in the bulk region are thinned by using a second etching liquid different from the first etching liquid. An impurity is implanted into the semiconductor substrate in the SOI region, and thereafter the insulating film in the SOI region and the insulating layer in the bulk region are removed. An etching speed of each of the insulating film and the insulating layer due to the first etching liquid is smaller than an etching speed of the semiconductor layer by using the first etching liquid. An etching speed of each of the insulating film and the insulating layer due to a second etching liquid is higher than the etching speed of each of the insulating film and the insulating layer due to the first etching liquid.

11 Claims, 39 Drawing Sheets

(51) Int. Cl.
*H01L 21/762* (2006.01)
*H01L 29/06* (2006.01)

(58) Field of Classification Search
USPC .......................................................... 438/404
See application file for complete search history.

(56) References Cited

U.S. PATENT DOCUMENTS

| | | |
|---|---|---|
| 2005/0196928 A1 | 9/2005 | Bonser et al. |
| 2006/0022270 A1 | 2/2006 | Boyd et al. |
| 2007/0001203 A1 | 1/2007 | Lehr et al. |
| 2009/0111223 A1 | 4/2009 | Wiatr et al. |
| 2010/0289088 A1 | 11/2010 | Li et al. |
| 2012/0086064 A1* | 4/2012 | Cheng ................... H01L 21/84 257/301 |
| 2014/0353756 A1 | 12/2014 | Yamamoto |
| 2015/0155159 A1* | 6/2015 | Igarashi ............ H01L 21/02057 134/28 |
| 2015/0364490 A1 | 12/2015 | Oda |
| 2016/0013207 A1 | 1/2016 | Makiyama |
| 2016/0153857 A1* | 6/2016 | Matsuzawa ........... G01L 9/0054 73/727 |

FOREIGN PATENT DOCUMENTS

| | | |
|---|---|---|
| JP | 2006-222329 A | 8/2006 |
| JP | 2007-526652 A | 9/2007 |

\* cited by examiner

METHOD OF MANUFACTURING SEMICONDUCTOR DEVICE

CROSS-REFERENCE TO RELATED APPLICATION

This application is a Continuation of U.S. patent application Ser. No. 15/603,564, filed on May 24, 2017, which claims priority from Japanese Patent Application No. 2016-112050 filed on Jun. 3, 2016, the disclosures of which are incorporated by reference herein in their entirety.

TECHNICAL FIELD OF THE INVENTION

The present invention relates to a method of manufacturing a semiconductor device and relates to, for example, an effective technique applied to a manufacturing technique of a semiconductor device by using an SOI substrate.

BACKGROUND OF THE INVENTION

To manufacture the semiconductor device, a device isolation region is formed on a semiconductor substrate, a semiconductor device such as a MISFET (Metal Insulator Semiconductor Field Effect Transistor) is formed in an active region of the semiconductor substrate defined by the device isolation region, and a multilayer wiring structure is formed on the semiconductor substrate. Additionally, there is a technique using an SOI substrate as a semiconductor substrate.

Japanese Patent Application Laid-Open No. 2002-9144 (Patent Document 1), Japanese Patent Application Laid-Open No. 2004-363121 (Patent Document 2), Japanese Patent Application Laid-Open No. 2006-222329 (Patent Document 3), and Japanese Patent Application Laid-Open No. 2007-526652 (Patent Document 4) describe techniques relating to semiconductor devices having STI.

SUMMARY OF THE INVENTION

It is desirable to improve reliability in a semiconductor device manufactured by using an SOI substrate.

The other objects and novel characteristics of the present invention will be apparent from the description of the present specification and the accompanying drawings.

According to one embodiment, a method of manufacturing a semiconductor device has (a) preparing a substrate including a semiconductor substrate, an insulating layer on the semiconductor substrate, a semiconductor layer on the insulating layer, a first insulating film on the semiconductor layer, a trench penetrating to the semiconductor substrate through the first insulating film, the semiconductor layer and the insulating layer, and a device isolation region embedded in the trench. The insulating layer, the first insulating film and the device isolation region are made of the same material as one another. The method of manufacturing the semiconductor device further has (b) after a step (a), removing the first insulating film in a first region of the substrate by etching, exposing the semiconductor layer in the first region, and leaving the first insulating film in a second region different from the first region of the substrate, and (c) after a step (b), removing the semiconductor layer in the first region by etching, and exposing the insulating layer in the first region. The method of manufacturing the semiconductor device further has (d) after a step (c), thinning a thickness of the insulating layer in the first region and a thickness of the first insulating film in the second region by etching, and (e) after a step (d), implanting an impurity into the semiconductor substrate in the second region to form a first semiconductor region. The method of manufacturing the semiconductor device further has (f) after a step (e), removing the insulating layer in the first region and the first insulating film in the second region by etching, and exposing the semiconductor substrate in the first region and the semiconductor layer in the second region. The method of manufacturing the semiconductor device further has (g) after a step (f), forming a first transistor on the semiconductor substrate in the first region, and forming a second transistor on the semiconductor layer in the second region. In the step (c), the semiconductor layer in the first region is removed by wet etching using a first etching liquid, and in the step (d), the insulating layer in the first region and the first insulating film in the second region are removed by wet etching using a second etching liquid different from the first etching liquid. An etching speed of each of the first insulating film and the insulating layer by using the first etching liquid is smaller than an etching speed of the semiconductor layer by using the first etching liquid, and an etching speed of each of the first insulating film and the insulating layer by using the second etching liquid is higher than the etching speed of each of the first insulating film and the insulating layer by using the first etching liquid.

Additionally, according to one embodiment, a method of manufacturing a semiconductor device has (a) preparing a substrate including a semiconductor substrate, an insulating layer on the semiconductor substrate, a semiconductor layer on the insulating layer, a first insulating film on the semiconductor layer, a trench penetrating to the semiconductor substrate through the first insulating film, the semiconductor layer and the insulating layer, and a device isolation region embedded in the trench. The insulating layer, the first insulating film and the device isolation region are made of silicon oxide as one another. The method of manufacturing the semiconductor device further has: (b) after a step (a), removing the first insulating film in a first region of the substrate by etching, exposing the semiconductor layer in the first region, and leaving the first insulating film in a second region of the substrate, and (c) after a step (b), removing the semiconductor layer in the first region by wet etching using an APM liquid by etching, and exposing the insulating layer in the first region. The method of manufacturing the semiconductor device further has (d) after a step (c), etching the insulating layer in the first region and the first insulating film in the second region by wet etching using hydrofluoric acid, and thinning a thickness of the insulating layer in the first region and a thickness of the first insulating film in the second region, and (e) after a step (d), implanting an impurity into the semiconductor substrate in the second region, forming a first semiconductor region. The method of manufacturing the semiconductor device further has (f) after a step (e), using hydrofluoric acid, removing the insulating layer in the first region and the first insulating film in the second region by wet etching, and exposing the semiconductor substrate in the first region and the semiconductor layer in the second region. The method of manufacturing the semiconductor device further has (g) after a step (f), forming a first transistor on the semiconductor substrate in the first region, and forming a second transistor on the semiconductor layer in the second region.

According to one embodiment, the reliability of the semiconductor device can be improved.

BRIEF DESCRIPTIONS OF THE DRAWINGS

DESCRIPTIONS OF THE PREFERRED EMBODIMENTS

Figure 1:
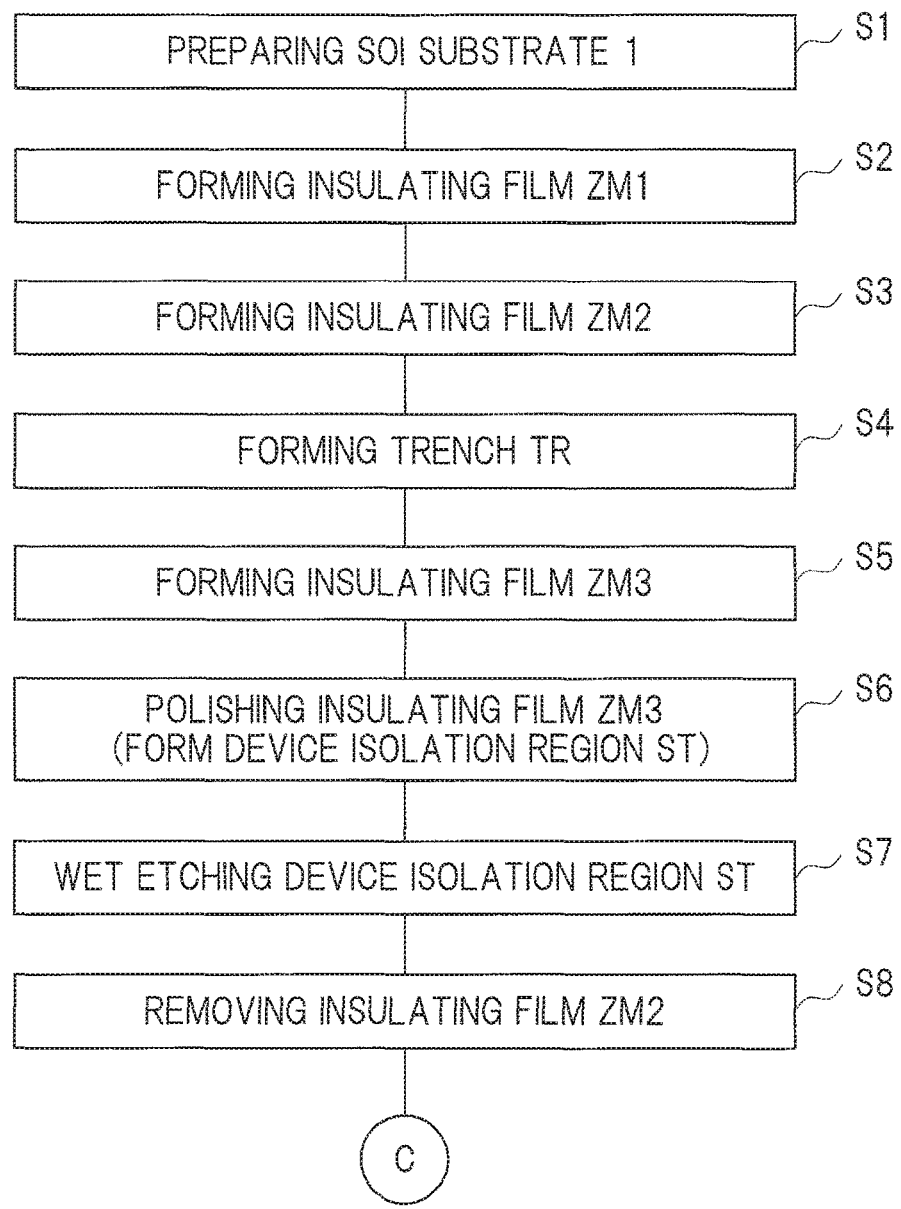
FIG. 1 is a process flow diagram showing a process of manufacturing a semiconductor device according to one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted.

In the drawings used in the embodiments, even if they are cross-sectional views, hatching may be omitted therefrom in order to make the drawing easily seen. Meanwhile, even if they are plan views, hatching may be added thereto to make the drawing easily seen.

Embodiment

<About Process of Manufacturing Semiconductor Device>

Figure 2:
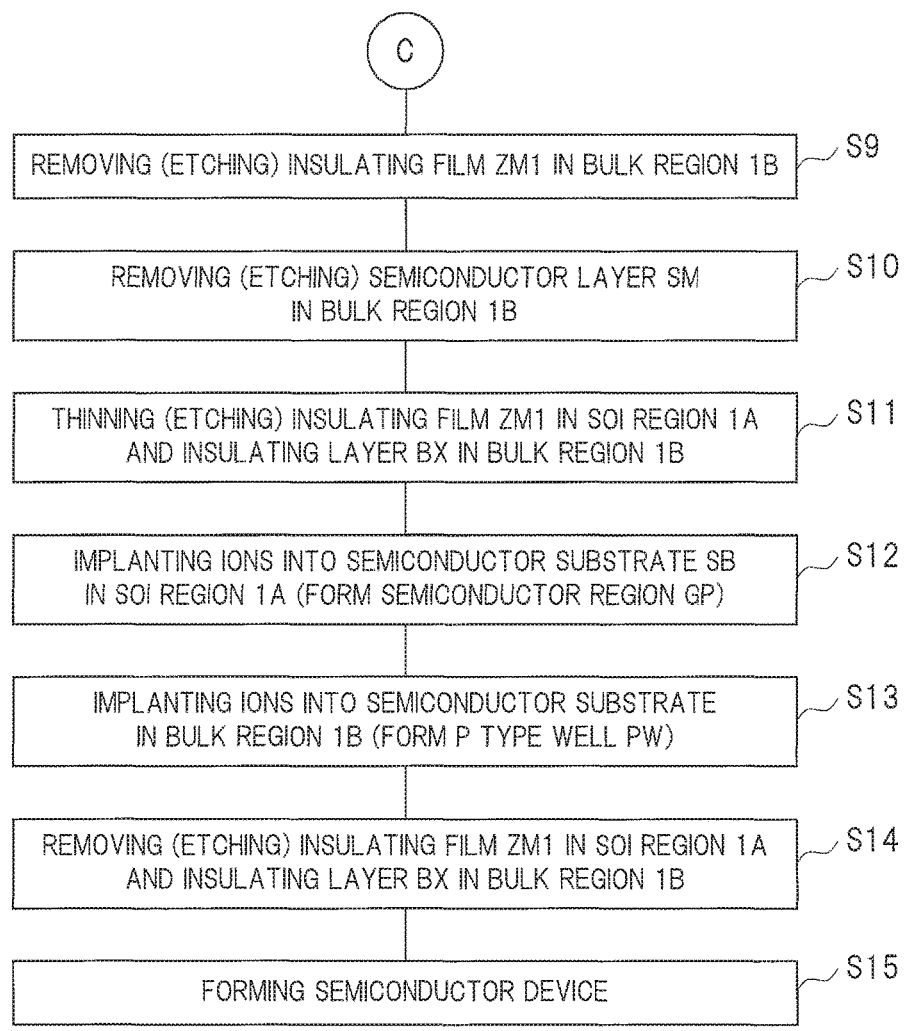
FIG. 2 is a process flow diagram showing the process of manufacturing the semiconductor device subsequent to FIG. 1.
Figure 24:
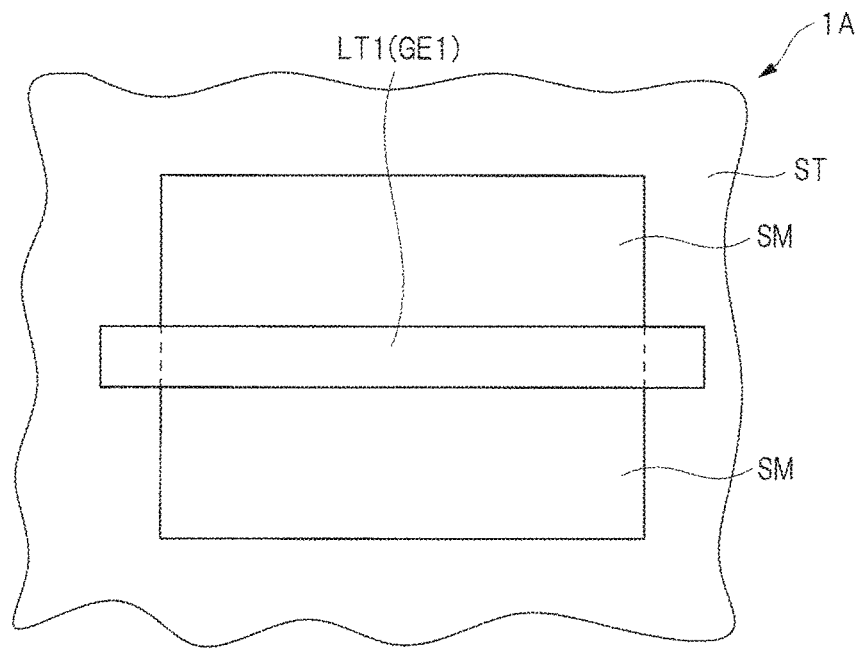
FIG. 24 is a cross-sectional view illustrating a main portion of the semiconductor device during its manufacturing process subsequent to FIG. 23.
Figure 25:
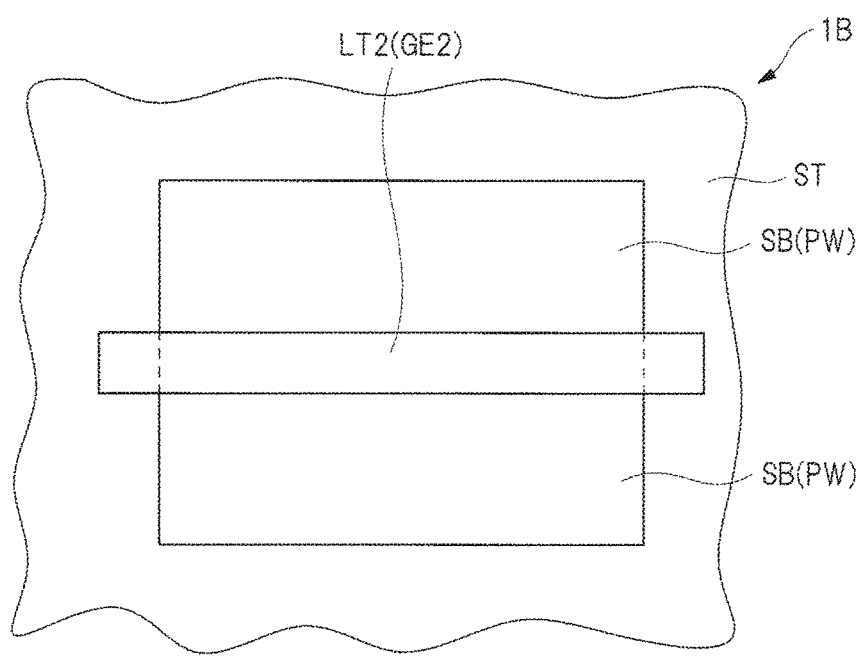
FIG. 25 is a cross-sectional view illustrating a main portion of the semiconductor device during its manufacturing process subsequent to FIG. 24.

A process of manufacturing a semiconductor device according to the present embodiment will be explained with reference to the drawings. FIG. 1 and FIG. 2 are process-flow diagrams showing a process of manufacturing a semiconductor device which is one embodiment of the present invention. FIG. 3 to FIG. 38 are cross-sectional views or plan views of main portions of the semiconductor device, which is one embodiment of the present invention, in the manufacturing process. Incidentally, in FIG. 3 to FIG. 38, FIG. 3 to FIG. 23 and FIG. 26 to FIG. 38 are cross-sectional views of the main portions, and FIG. 24 and FIG. 25 are plan views of the main portions.

Figure 3:
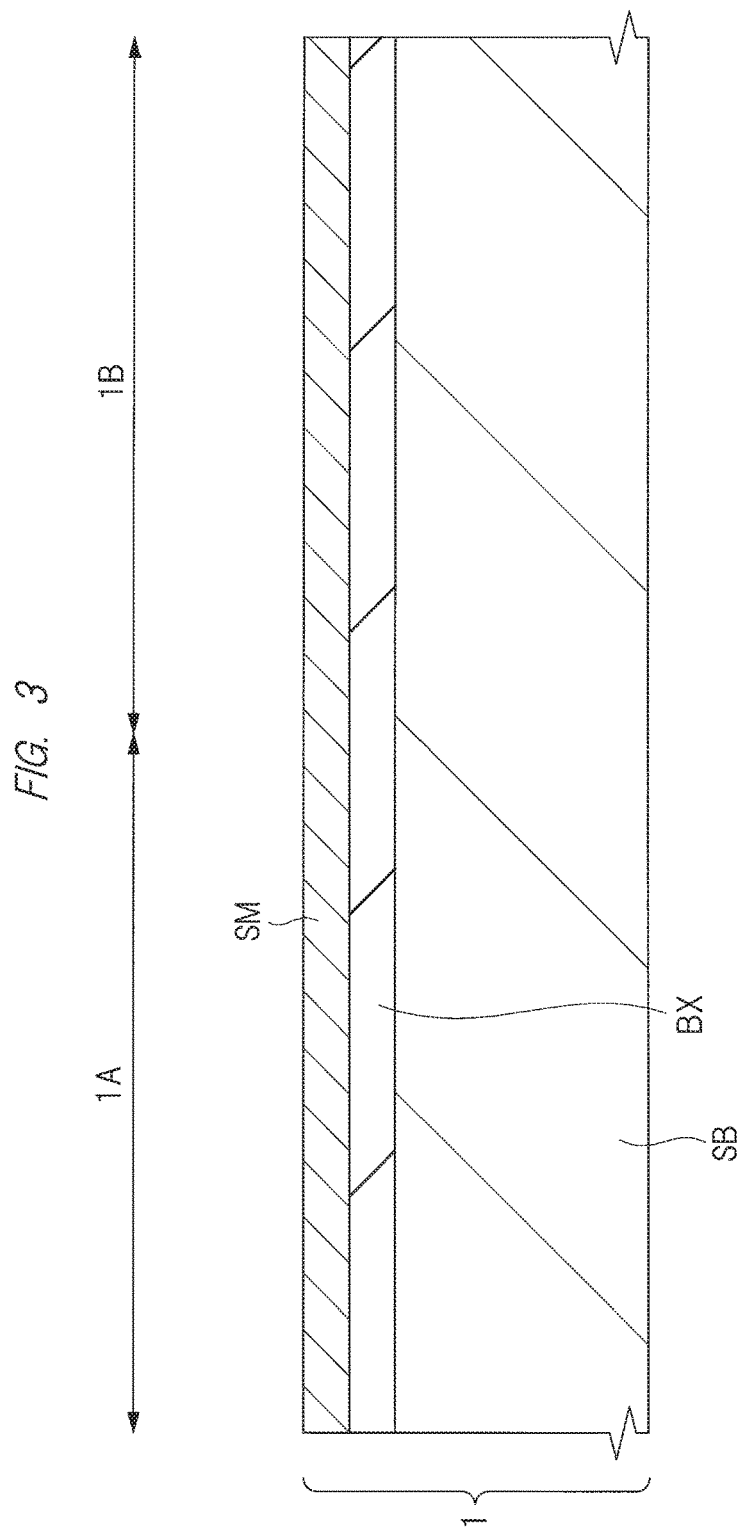
FIG. 3 is a cross-sectional view illustrating a main portion during a process of manufacturing the semiconductor device according to one embodiment.

First, as shown in FIG. 3, an SOI (Silicon On Insulator) substrate 1 is provided (prepared) (step S1 in FIG. 1).

The SOI substrate 1 includes: a semiconductor substrate (support substrate) SB serving as a support substrate; an insulating layer (buried insulating film) BX formed on a main surface of the semiconductor substrate SB; and a semiconductor layer SM formed on an upper surface of the insulating layer BX.

The semiconductor substrate SB is not only a support substrate that supports the insulating layer BX and a structure formed on and above the insulating layer BX but also a semiconductor substrate. The semiconductor substrate SB is preferably a monocrystalline silicon substrate. For example, the semiconductor substrate SB is made of p-type monocrystalline silicon. For example, the semiconductor substrate SB can be formed with monocrystalline silicon having a specific resistance of about 1 to 10 Ωcm. A thickness of the semiconductor substrate SB can be, for example, about 700 to 750 μm. The insulating layer BX is preferably a silicon oxide film, and a thickness of the insulating layer BX can be, for example, about 10 to 20 nm. When the insulating layer BX is a silicon oxide film, the insulating layer BX can be regarded also as a buried oxide film, i.e., a BOX (Buried Oxide) layer. The semiconductor layer SM is made of monocrystalline silicon or the like. For example, the semiconductor layer SM can be formed with monocrystalline silicon having a specific resistance of about 1 to 10 Ωcm. The thickness of the semiconductor layer SM is thinner than the thickness of the semiconductor substrate SB which is the support substrate, and the thickness of the semiconductor layer SM can be, for example, about 15 to 25 nm. The SOI substrate 1 is formed by the semiconductor substrate SB, the insulating layer BX, and the semiconductor layer SM as described above.

Incidentally, the SOI substrate 1 includes: an SOI region 1A which is a region (plane region) where the SOI structure is maintained until the semiconductor device is completed; and a bulk region 1B which is a region (plane region) where the semiconductor layer SM and the insulating layer BX are removed later to lose the SOI structure. The SOI region 1A and the bulk region 1B are regions (plane regions) different from each other. Additionally, in a case of SOI structure, a silicon layer (monocrystalline silicon layer) can be suitably used for the semiconductor layer on the insulating layer, but the embodiment is not limited thereto. A semiconductor layer made of those other than monocrystalline silicon may also be used.

In the SOI substrate 1, a main surface which is one of main surfaces of the semiconductor substrate SB and which is on a side contacting with the insulating layer BX will be referred to as a top surface of the semiconductor substrate SB, and a main surface on a side opposite to the top surface of the semiconductor substrate SB will be referred to as a back surface of the semiconductor substrate SB. In the SOI substrate 1, a main surface which is one of main surfaces of the insulating layer BX and which is on a side contacting with the semiconductor substrate SB will be referred to as a lower surface of the insulating layer BX, and a main surface on a side contacting with the semiconductor layer SM will be referred to as a top surface of the insulating layer BX. The top surface and the lower surface of the insulating layer are surfaces opposite to each other. A main surface which is one of main surfaces of the semiconductor layer SM and which is on a side contacting with the insulating layer BX will be referred to as a lower surface of the semiconductor layer SM, and a main surface on a side opposite to the lower surface of the semiconductor layer SM will be referred to as a top surface of the semiconductor layer SM.

The method of manufacturing the SOI substrate 1 is not particularly limited, but the SOI substrate 1 can be manufactured by a SIMOX (Silicon Implanted Oxide) method, for example. In the SIMOX method, $O_2$ (oxygen) is ion-implanted with high energy into the main surface of a semiconductor substrate made of silicon (Si); Si (silicon) and oxygen are bonded by a subsequent heat treatment; and thereby the insulating layer BX made of silicon oxide is formed at a position slightly deeper than the surface of the semiconductor substrate. In this case, a thin film made of silicon (Si) remaining on the insulating layer BX becomes the semiconductor layer SM, and the semiconductor substrate under the insulating layer BX becomes the semiconductor substrate SB. Alternatively, the SOI substrate 1 may be formed by a laminating method. In the laminating method, for example, a surface of a first semiconductor substrate made of silicon (Si) is oxidized to form the insulating layer BX; thereafter a second semiconductor substrate made of silicon (Si) is compression-bonded with the first semiconductor substrate under a high temperature; and thereafter the second semiconductor substrate is made into a thin film. In this case, the thin film of the second semiconductor substrate remaining on the insulating layer BX becomes the semiconductor layer SM, and the first semiconductor substrate under the insulating layer BX becomes the semiconductor substrate SB. It is also possible to manufacture the SOI substrate 1 by using other techniques, for example, a smart cut process.

Figure 4:
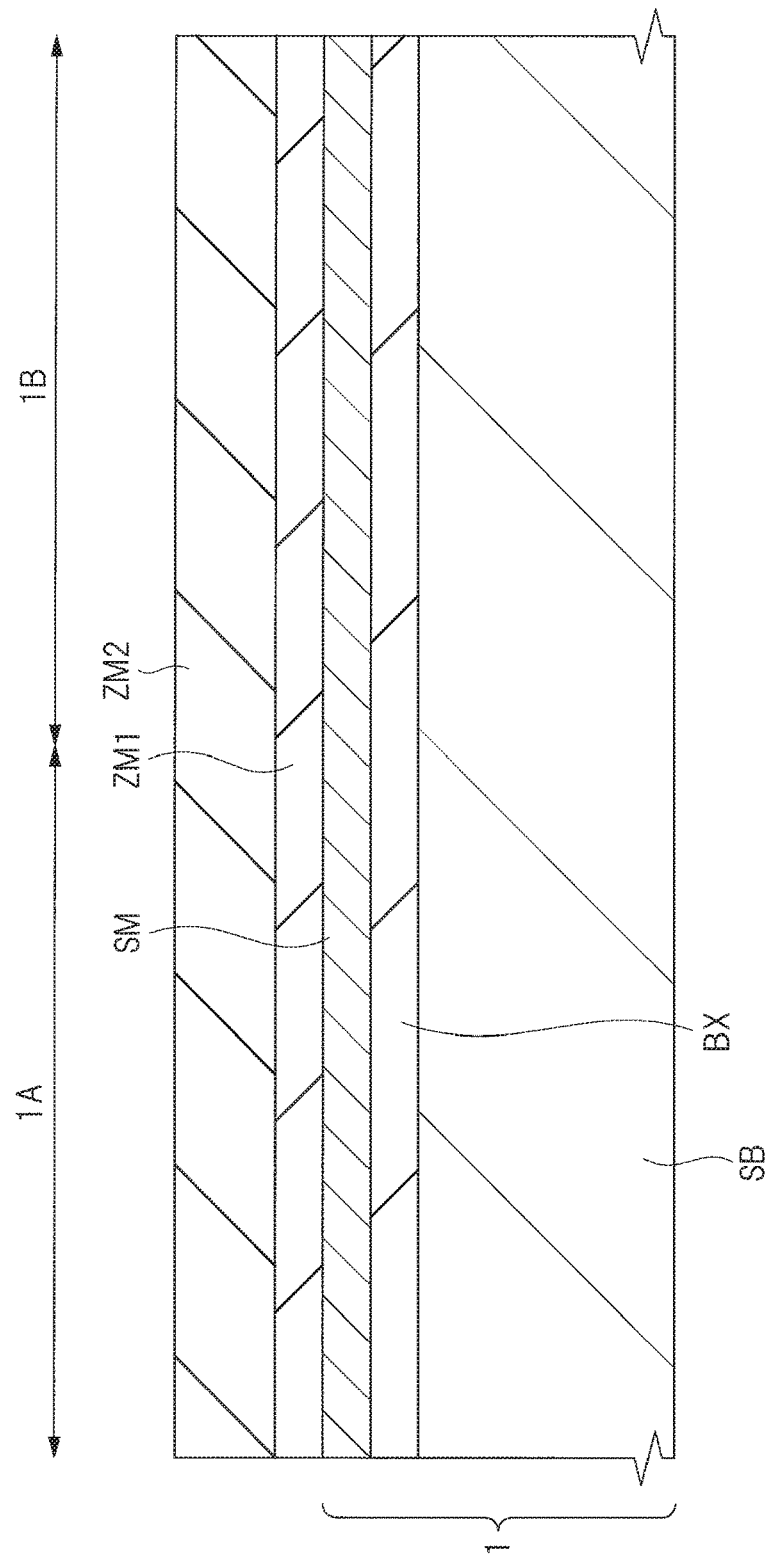
FIG. 4 is a cross-sectional view illustrating a main portion of the semiconductor device during its manufacturing process subsequent to FIG. 3.

Subsequently, as shown in FIG. 4, an insulating film (pad insulating film) ZM1 is formed on the main surface of the SOI substrate 1, i.e., on the top surface of the semiconductor layer SM (step S2 in FIG. 1). The insulating film ZM1 is made of the same material as the insulating layer BX. When the insulating layer BX is made of silicon oxide, the insulating film ZM1 is also made of silicon oxide. The insulating film ZM1 can be formed by using a CVD (Chemical Vapor Deposition) method or the like, for example. A thickness of the insulating film ZM1 is preferably set to a sum of the thickness of the insulating layer BX and an etching thickness (etching amount) of the insulating film ZM1 in the SOI region 1A in step S10 explained later.

Subsequently, an insulating film ZM2 is formed on the insulating film ZM1 (step S3 in FIG. 1). The insulating film ZM2 is made of a material different from the insulating film ZM1. When the insulating layer BX and the insulating film ZM1 are composed of silicon oxide, the insulating film ZM2 is preferably made of silicon nitride. The insulating film ZM2 is made of a material different from an insulating film ZM3 explained later. The insulating film ZM2 can be formed, for example, by a CVD method or the like. A film thickness of the insulating film ZM2 can be, for example, about 80 to 120 nm.

Prepared by the above steps (steps S1 to S3) is the substrate which includes: the semiconductor substrate SB; the insulating layer BX on the semiconductor substrate SB; the semiconductor layer SM on the insulating layer BX; the insulating film ZM1 on the semiconductor layer SM; and the insulating film ZM2 on the insulating film ZM1.

Figure 5:
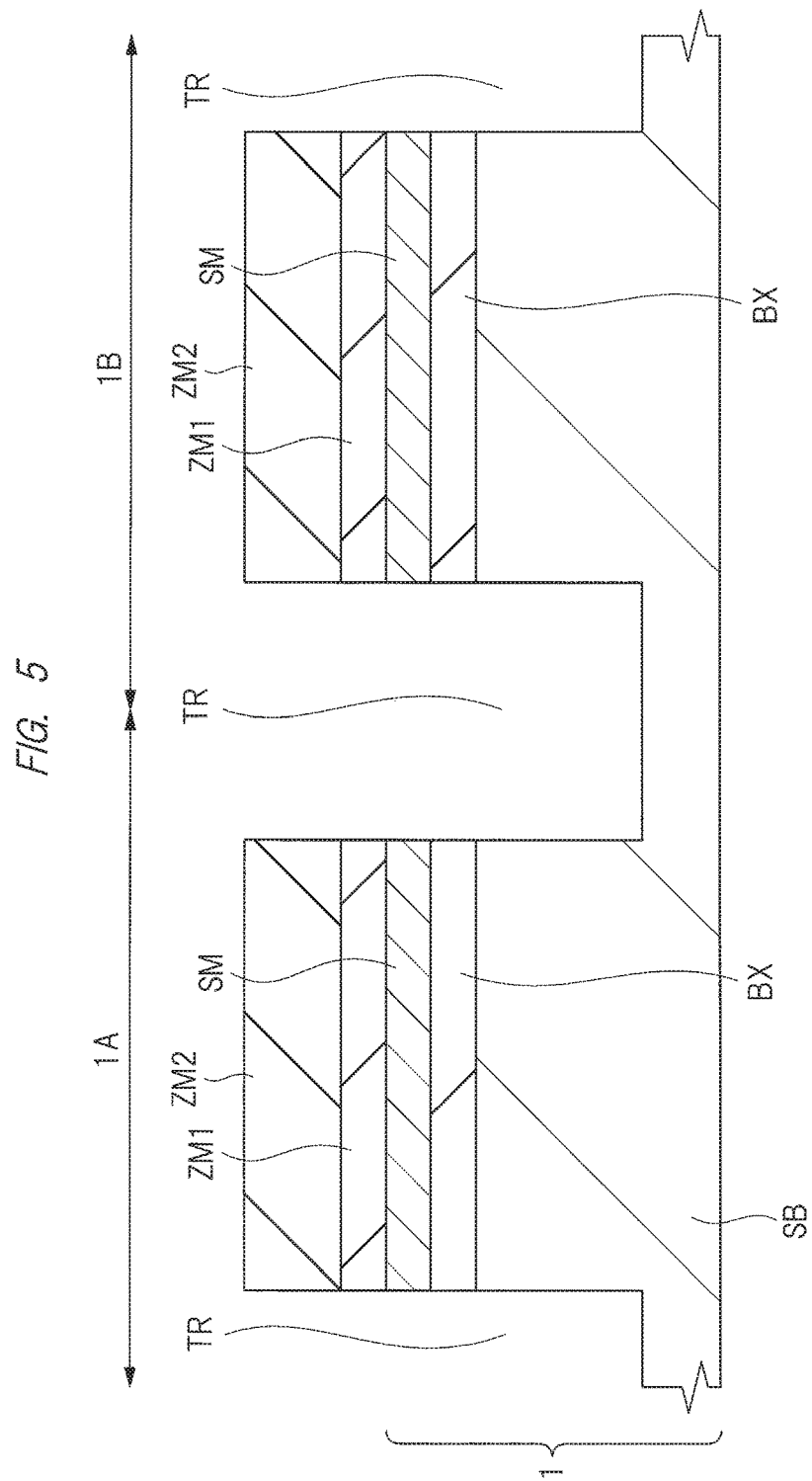
FIG. 5 is a cross-sectional view illustrating a main portion of the semiconductor device during its manufacturing process subsequent to FIG. 4.

Subsequently, as shown in FIG. 5, trenches TR are formed (step S4 in FIG. 1). Each trench TR is a trench for forming a device isolation region ST explained later, i.e., a trench for device isolation.

The trenches TR can be formed as follows. More specifically, first, a photoresist pattern (not shown) is formed on the insulating film ZM2 by using a photolithography technique. This photoresist pattern has such a pattern (planar shape) as to expose the insulating film ZM2 in a planned forming region of each trench TR, and to cover the insulating film ZM2 in the other region. Then, the insulating film ZM2 is etched (preferably dry etched) and patterned by using this photoresist pattern as an etching mask. As a result, the insulating film ZM2 in the planned forming region of each trench TR is selectively removed. Then, this photoresist pattern is removed, and the insulating film ZM1, the semiconductor layer SM, the insulating layer BX, and the semiconductor substrate SB are etched (preferably dry etched) by using the insulating film ZM2 as an etching mask (hard mask), so that the trenches TR can be formed.

Each trench TR penetrates to the semiconductor substrate SB through the insulating film ZM2, the insulating film ZM1, the semiconductor layer SM, the insulating layer BX and a bottom portion (bottom surface) of each trench TR. In other words, the bottom portion (bottom surface) of each trench TR is located on the way of the semiconductor substrate SB in its thickness direction. Therefore, the bottom surface of each trench TR is positioned lower than a lower surface of the insulating layer BX, and the semiconductor substrate SB is exposed from the bottom portion of each trench TR. A depth of each trench TR can be, for example, about 250 to 300 nm.

Figure 6:
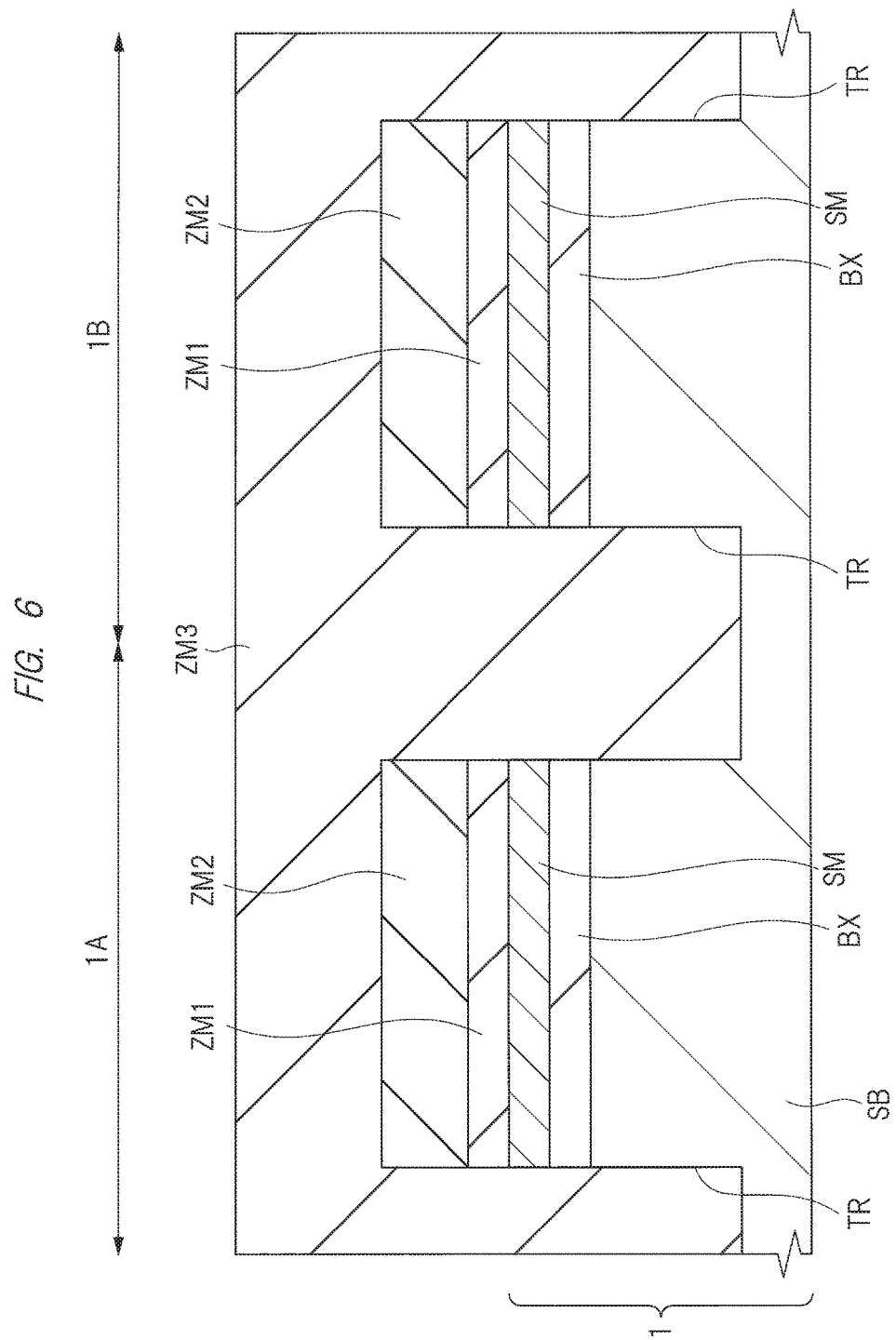
FIG. 6 is a cross-sectional view illustrating a main portion of the semiconductor device during its manufacturing process subsequent to FIG. 5.

Subsequently, as shown in FIG. 6, an insulating film ZM3 is formed on the insulating film ZM2 so as to fill an inside of each trench TR (step S5 in FIG. 1). The insulating film ZM3 is an insulating film for forming the device isolation region ST, and it is preferably a silicon oxide film. Therefore, the insulating film ZM3, the insulating film ZM1, and the insulating layer BX are made of the same material, and preferably all of them are made of silicon oxide. The insulating film ZM3 can be formed by using a CVD method or the like. A film thickness of the insulating film ZM3 is preferably set to have a film thickness sufficient to bury (fill) the inside of each trench TR with the insulating film ZM3.

Figure 7:
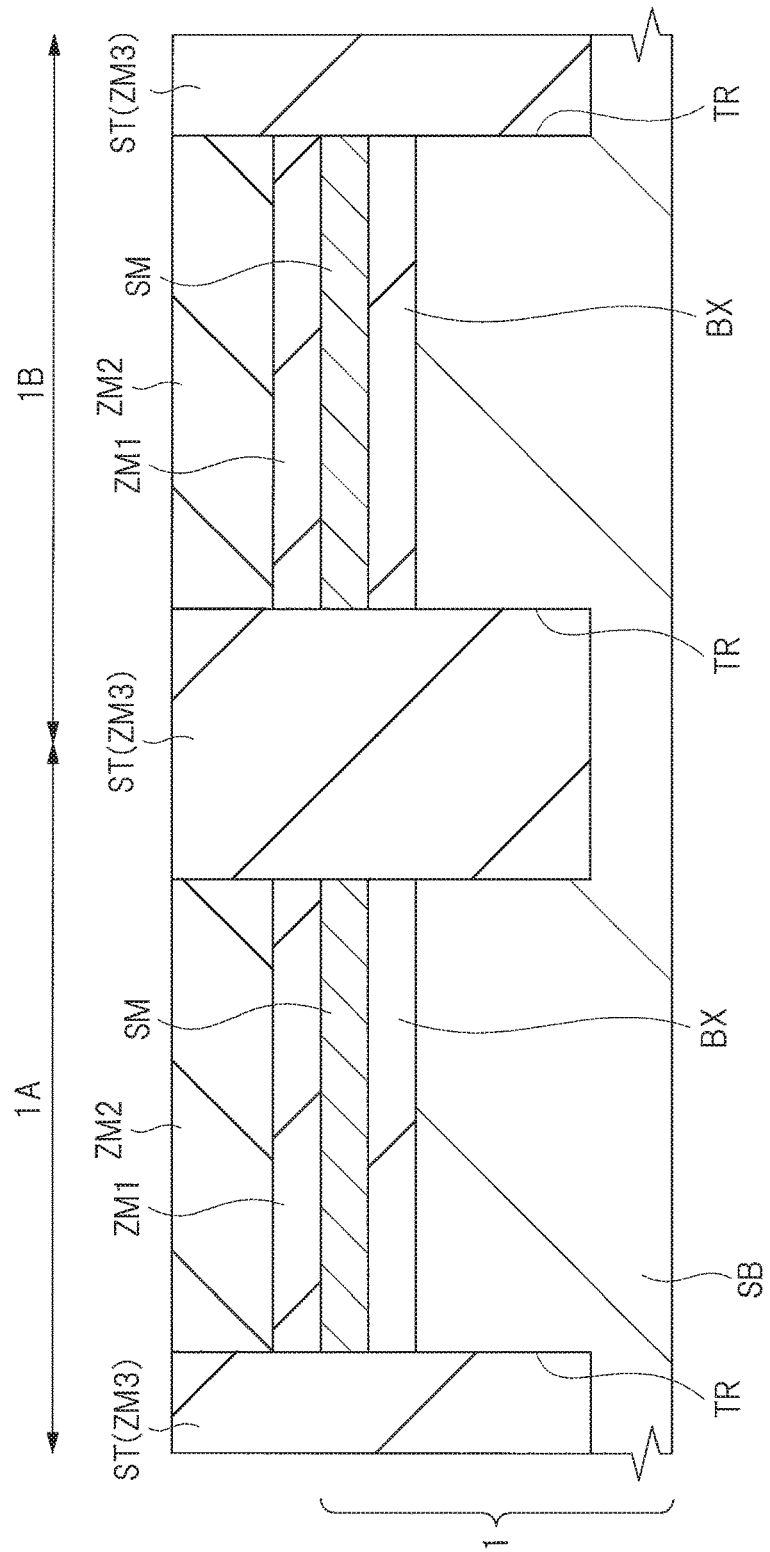
FIG. 7 is a cross-sectional view illustrating a main portion of the semiconductor device during its manufacturing process subsequent to FIG. 6.

Subsequently, as shown in FIG. 7, the insulating film ZM3 is polished (polishing processing) by a CMP (Chemical Mechanical Polishing) method or the like to remove the insulating film ZM3 from outside each trench TR and make the insulating film ZM3 remain in each trench TR (step S6 in FIG. 1). As a result, as shown in FIG. 7, device isolation regions ST each composed of the insulating film ZM3 embedded in the trench TR can be formed. The device isolation regions ST are formed in the respective trenches TR.

During the polishing processing in step S6, the insulating film ZM2 can function as a polishing stopper film. Namely, in step S6, since the polishing processing is performed under the condition that the insulating film ZM2 is polished less easily than the insulating film ZM3, the insulating film ZM2 can be made to function as a polishing stopper film. In other words, in step S6, since the polishing processing is performed under the condition that a polishing speed of the insulating film ZM2 is smaller (slower) than a polishing speed of the insulating film ZM3, the insulating film ZM2 can function as the polishing stopper film. The insulating film ZM2 needs to be formed of a material different from the insulating film ZM3 so that the insulating film ZM2 can function as a polishing stopper film. When the insulating film ZM3 is made of silicon oxide, the insulating film ZM2 is preferably made of silicon nitride. When the polishing processing in step S6 is completed, the top surface of the insulating film ZM2 is exposed and the device isolation region ST is embedded in the trench TR. However, as shown in FIG. 7, the top surface of the device isolation region ST is positioned almost at the same height as the top surface of insulating film ZM2.

Figure 8:
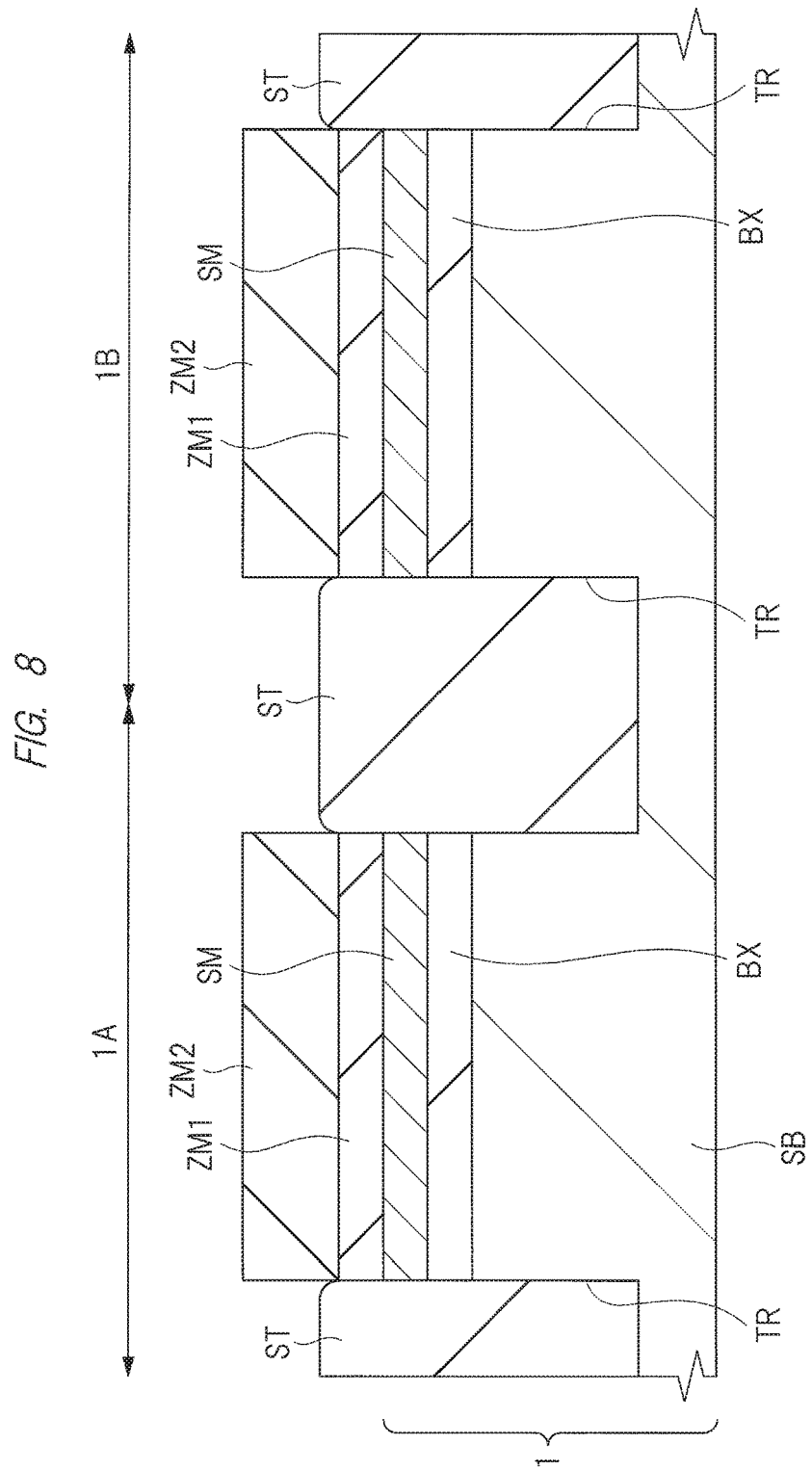
FIG. 8 is a cross-sectional view illustrating a main portion of the semiconductor device during its manufacturing process subsequent to FIG. 7.

Subsequently, as shown in FIG. 8, a top-surface height of the device isolation region ST is lowered by wet etching the top surface of the device isolation region ST (step S7 in FIG. 1). As a result, the top surface of the device isolation region ST is lower than the top surface of the insulating film ZM2 by a predetermined distance (distance in a height direction). Hydrofluoric acid can be suitably used for this wet etching. When the wet etching is completed, a height position of the top surface of the device isolation region ST is lower than that of the top surface of the insulating film ZM2, but it is almost the same as the height position of the top surface of the insulating film ZM1, or higher than the top surface of the insulating film ZM1. Preferably, it is higher than the top surface of the insulating film ZM1.

Incidentally, "hydrofluoric acid" in the present application includes diluted hydrofluoric acid.

Figure 9:
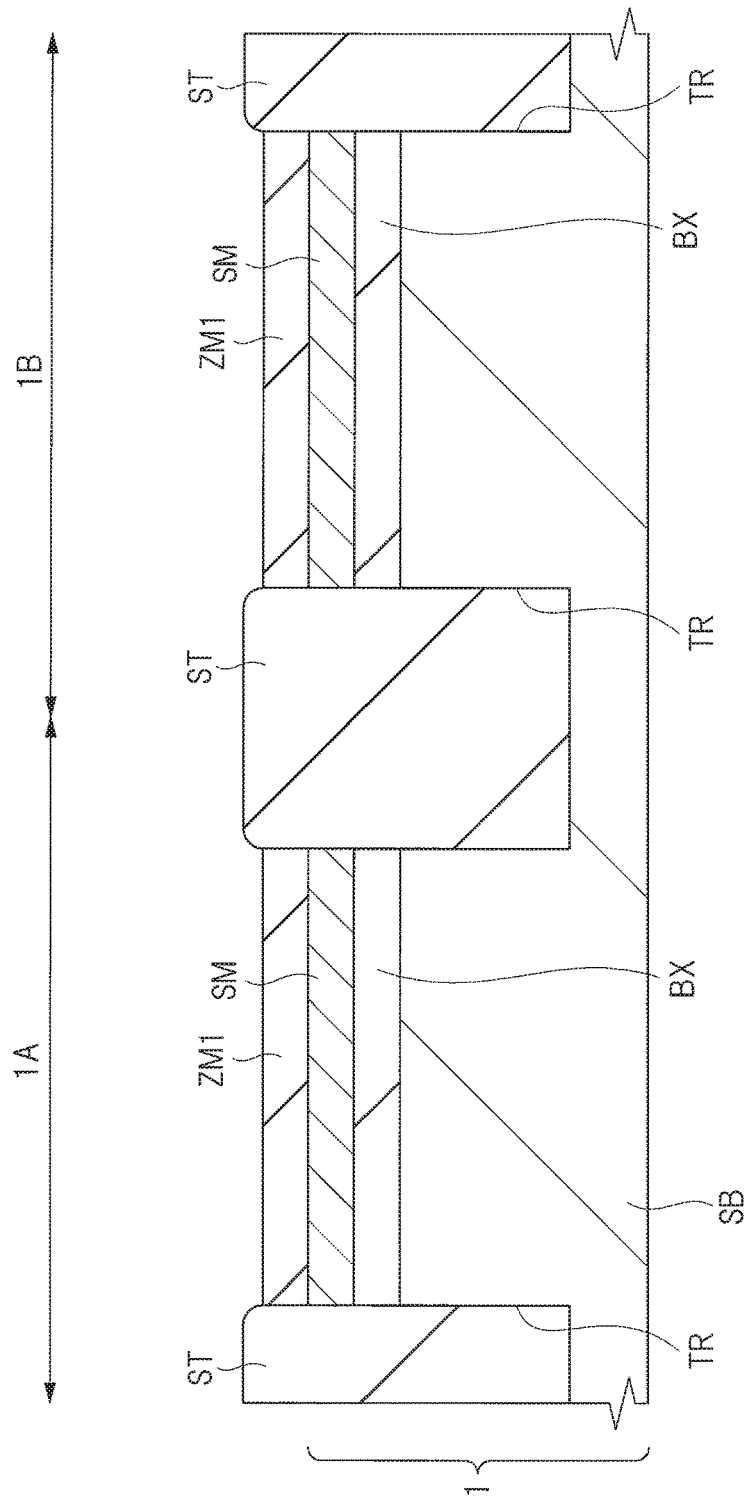
FIG. 9 is a cross-sectional view illustrating a main portion of the semiconductor device during its manufacturing process subsequent to FIG. 8.

Subsequently, as shown in FIG. 9, the insulating film ZM2 is removed by etching (step S8 in FIG. 1). At this case, the insulating film ZM1 can be made to function as an etching stopper film. In step S8, the insulating film ZM2 is preferably removed by etching under the condition that the insulating film ZM1 and the device isolation region ST are etched less easily than the insulating film ZM2. In other words, the insulating film ZM2 is preferably removed by etching under the condition that the etching speed of each of the insulating film ZM1 and the device isolation region ST are smaller than the etching speed of the insulating film ZM2. As a result, the insulating film ZM2 can be selectively removed by etching while suppressing or preventing the insulating film ZM1 and the device isolation region ST from being etched.

Incidentally, the small etching speed (etching rate) is synonymous with a slow etching speed, and it is also synonymous with a low etching speed. A large etching speed is synonymous with a fast etching speed, and is also synonymous with a high etching speed. If it is easy to perform etching, the etching speed will be high and if it is difficult to perform etching, the etching speed will be small.

Wet etching can be suitably used for etching in step S8. When the insulating film ZM2 is made of silicon nitride and the insulating film ZM1 and the device isolation region ST are made of silicon oxide, hot phosphoric acid (heated phosphoric acid) is preferably used as an etching solution used for the wet etching in step S8. When the insulating film ZM2 is removed by etching in step S8, the top surface of the insulating film ZM1 is exposed. More specifically, in step S8, the insulating film ZM2 is removed in both of the SOI region 1A and the bulk region 1B, so that the top surface of the insulating film ZM1 is exposed.

In this way, the device isolation region ST with an STI structure is formed by using a STI (shallow trench isolation) method. When the SOI substrate 1 is prepared, the semiconductor layer SM is formed on the entire top surface of the semiconductor substrate SB via the insulating layer BX. However, when the device isolation region ST is formed, the semiconductor layer SM is partitioned into multiple regions (active regions) surrounded by the respective device isolation regions ST.

The trench TR and the device isolation region ST filling the trench TR penetrate to the semiconductor substrate SB through the insulating film ZM1 and the semiconductor layer SM, and extend into the insulating layer BX, and the bottom portion of the trench TR, and each lower portion of the device isolation regions ST is located in the semiconductor substrate SB. More specifically, the device isolation region ST is embedded in the trench TR formed by penetrating through the insulating film ZM1, the semiconductor layer SM, and the insulating layer BX, and extending into the semiconductor substrate SB. Accordingly, a part of the device isolation region ST is located below the lower surface of the insulating layer BX. More specifically, the bottom surface (lower surface) of the device isolation region ST is located deeper than the lower surface of the insulating layer BX, and a part (lower portion) of the device isolation region ST protrudes down from the lower surface of the insulating layer BX.

At this stage, the SOI region 1A and the bulk region 1B have the same structure. More specifically, the SOI region 1A and the bulk region 1B have a structure in which the insulating layer BX, the semiconductor layer SM, and the insulating film ZM1 are layered in this order on the semiconductor substrate SB. In a plan view, the device isolation region ST is interposed (arranged) between the SOI region 1A and the bulk region 1B. In other words, in a plan view, the device isolation region ST is arranged at a boundary between the SOI region 1A and the bulk region 1B.

Figure 10:
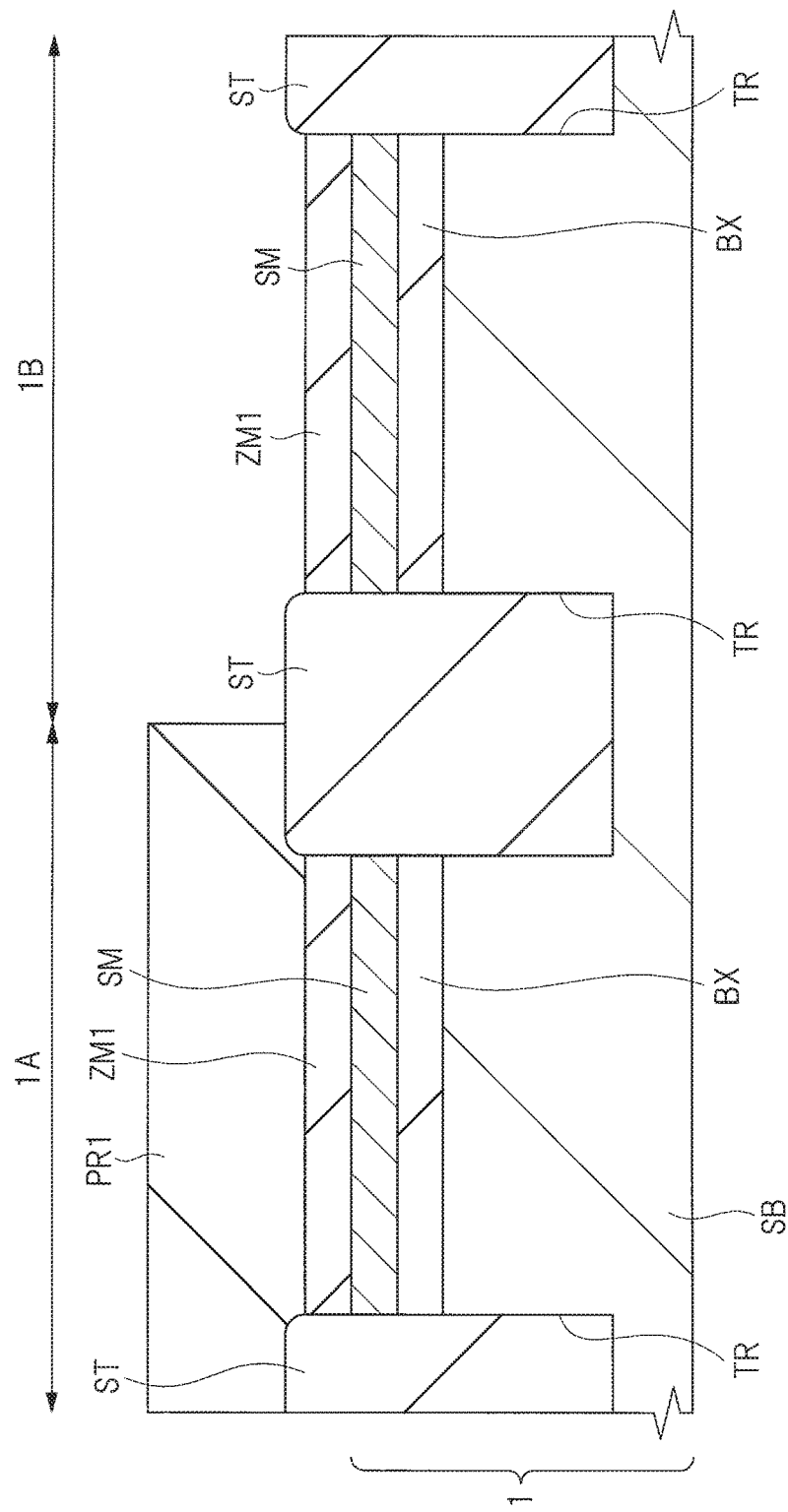
FIG. 10 is a cross-sectional view illustrating a main portion of the semiconductor device during its manufacturing process subsequent to FIG. 9.

Subsequently, as shown in FIG. 10, a photoresist pattern (resist pattern, mask layer) PR1 covering the SOI region 1A and exposing the bulk region 1B is formed as a mask layer on the insulating film ZM1 by using a photolithography technique. The insulating film ZM1 in the SOI region 1A is covered with the photoresist pattern PR1, but the insulating film ZM1 in the bulk region 1B is exposed without being covered with the photoresist pattern PR1. An end portion (side surface) of the photoresist pattern PR1 is located on the device isolation region ST provided between the SOI region 1A and the bulk region 1B.

The photolithography technique is a technique for obtaining a desired photoresist pattern by: forming a photoresist film on the entire main surface of a semiconductor substrate through a coating method and the like; and then exposing and developing the photoresist film to pattern it.

Figure 11:
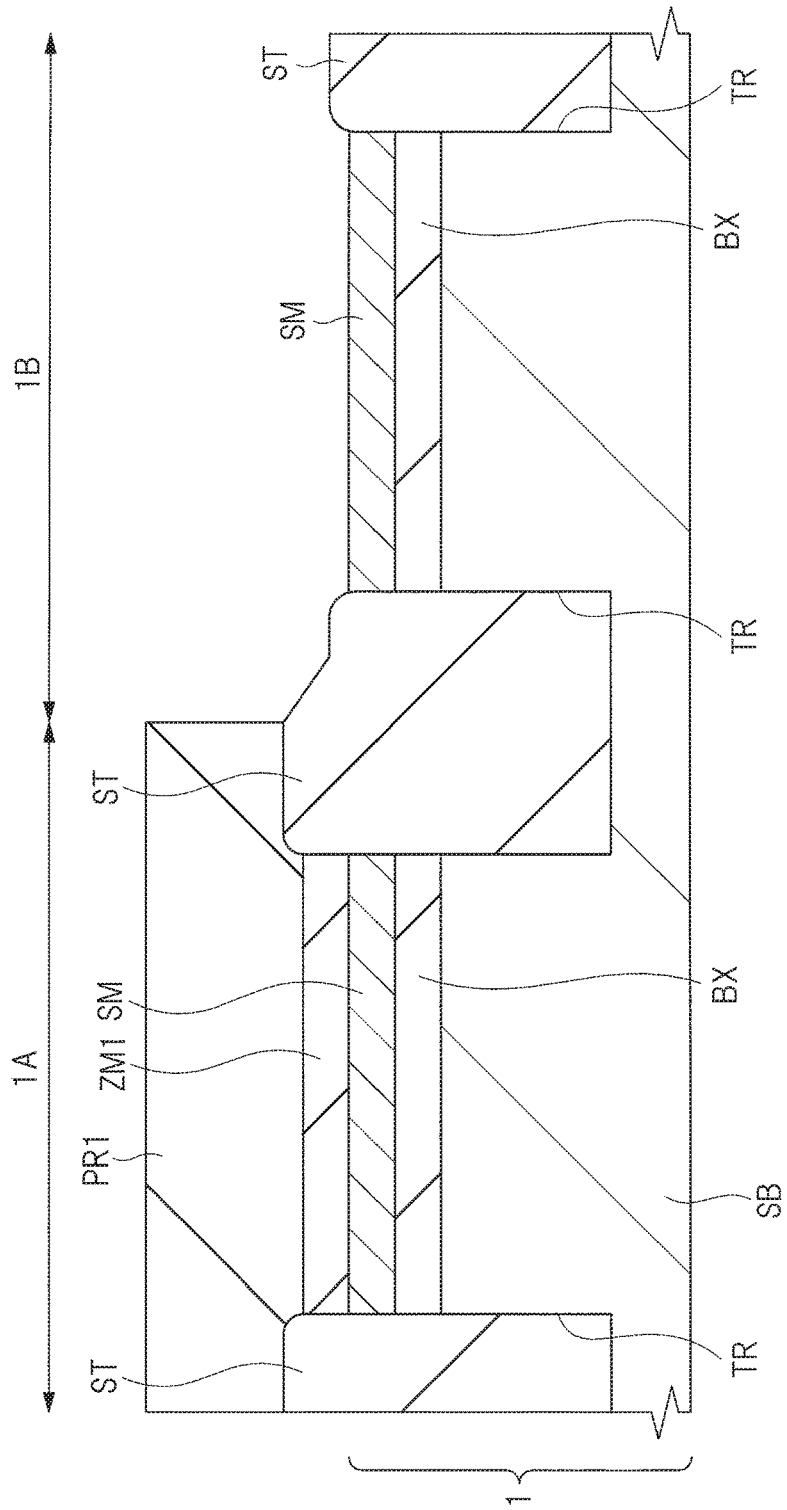
FIG. 11 is a cross-sectional view illustrating a main portion of the semiconductor device during its manufacturing process subsequent to FIG. 10.
Figure 12:
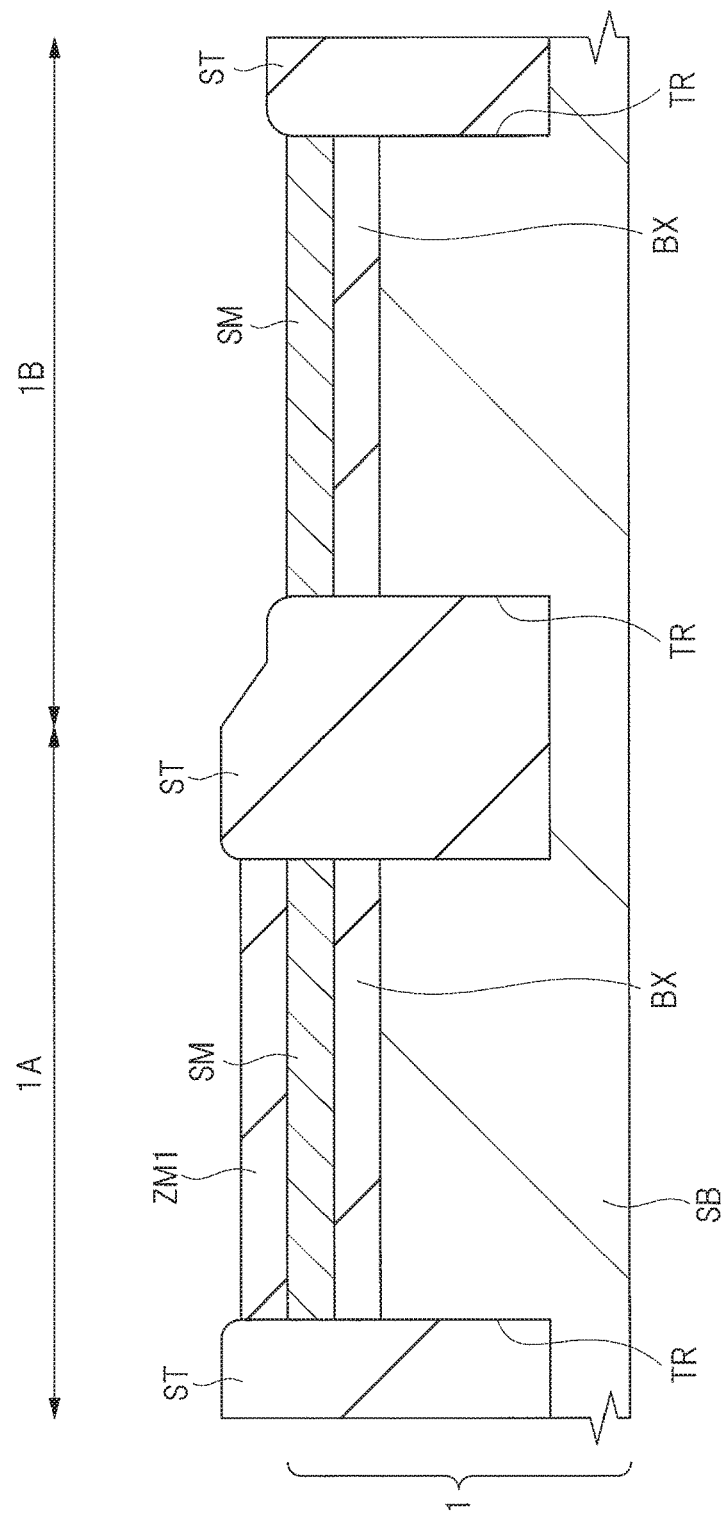
FIG. 12 is a cross-sectional view illustrating a main portion of the semiconductor device during its manufacturing process subsequent to FIG. 11.

Subsequently, as shown in FIG. 11, the insulating film ZM1 in the bulk region 1B is removed by etching using the photoresist pattern PR1 as an etching mask (step S9 in FIG. 2). In this step S9, the insulating film ZM1 is preferably removed by etching under the condition that the semiconductor layer SM is etched less easily than the insulating film ZM1. In other words, in step S9, it is preferable to remove the insulating film ZM1 by etching under the condition that the etching speed of the semiconductor layer SM becomes smaller (slower) than the etching speed of the insulating film ZM1. As a result, the insulating film ZM1 in the bulk region 1B can be removed by performing etching, and the semiconductor layer SM can be made to function as an etching stopper. Wet etching can be suitably used for etching in step S9. When the insulating film ZM1 is made of silicon oxide, hydrofluoric acid can be suitably used as the etching solution used in the wet etching in step S9. In the bulk region 1B, when the insulating film ZM1 is removed by etching, the top surface of the semiconductor layer SM is exposed. On the other hand, in the SOI region 1A, since the insulating film ZM1 is covered with the photoresist pattern PR1, the insulating film ZM1 remains without being etched. A region of the device isolation region ST covered with the photoresist pattern PR1 is not etched, but a region of the device isolation region ST exposed without being covered with the photoresist pattern PR1 can be etched to the same degree as the etching thickness (etching amount) of the insulating film ZM1 in the bulk region 1B. As shown in FIG. 12, the photoresist pattern PR1 is then removed by asking or the like.

At this stage, as shown in FIG. 12, the insulating film ZM1 remains in the SOI region 1A, so that the top surface of the insulating film ZM1 is exposed, whereas, in the bulk region 1B, the insulating film ZM1 is removed and the top surface of the semiconductor layer SM is exposed.

Figure 13:
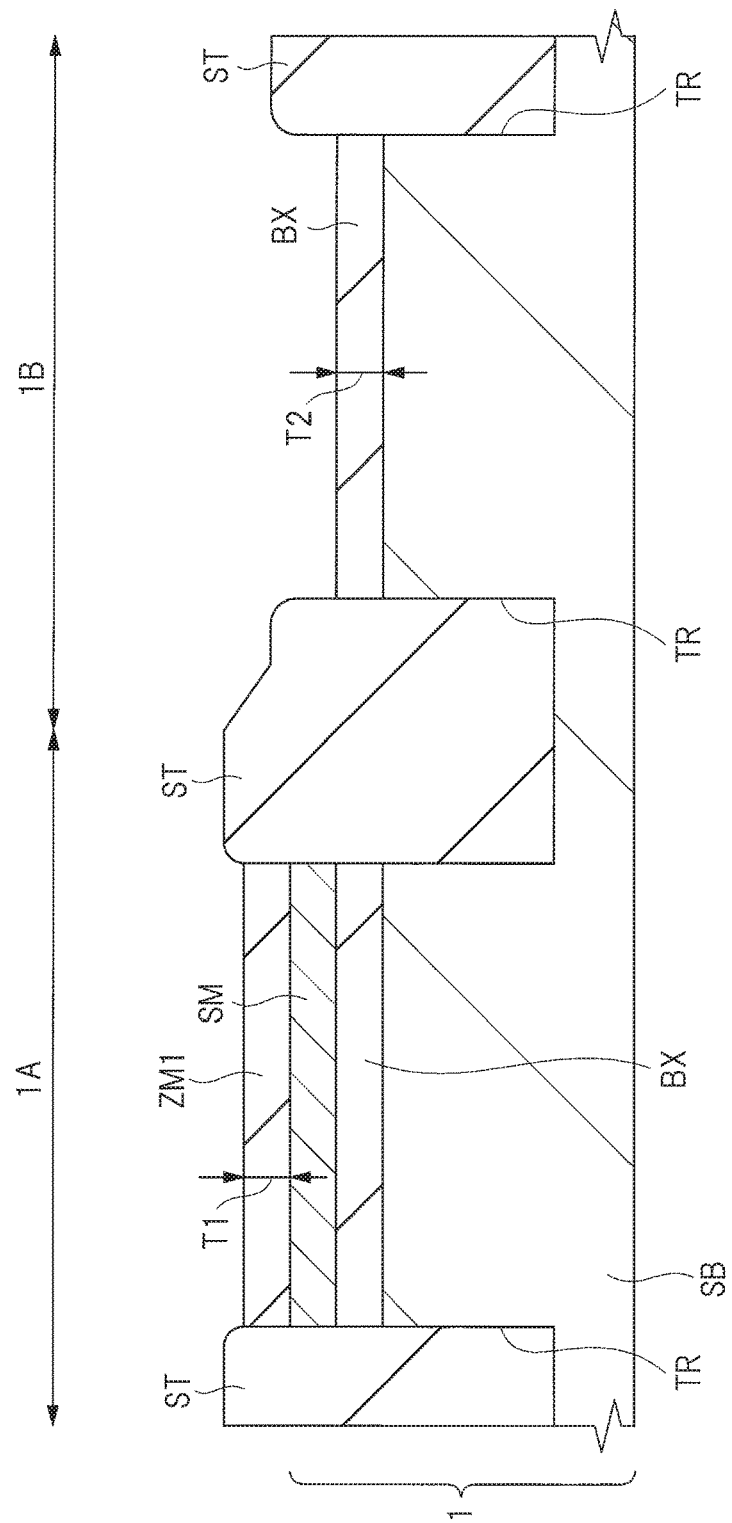
FIG. 13 is a cross-sectional view illustrating a main portion of the semiconductor device during its manufacturing process subsequent to FIG. 12.

Subsequently, as shown in FIG. 13, the semiconductor layer SM in the bulk region 1B is removed by etching (step S10 in FIG. 2). In this step S10, it is preferable to remove the semiconductor layer SM in the bulk region 1B by etching under the condition that the insulating layer BX, the insulating film ZM1, and the device isolation region ST are etched less easily than the semiconductor layer SM. In other words, in step S10, the semiconductor layer SM in the bulk region 1B is preferably removed by etching under the condition that each etching speed of the insulating layer BX, the insulating film ZM1, and the device isolation region ST is smaller (slower) than the etching speed of the semiconductor layer SM. As a result, the semiconductor layer SM in the bulk region 1B can be removed by etching; the insulating layer BX in the bulk region 1B can be made to function as an etching stopper; and the device isolation region ST and the insulating film ZM1 in the SOI region 1A can be suppressed or prevented from being etched. Wet etching can be suitably used for the etching in step S10. When the semiconductor layer SM is made of silicon, and the insulating layer BX, the insulating film ZM1, and the device isolation region ST are made of silicon oxide as one another, an APM liquid (Ammonium Hydrogen-preoxide Mixture: ammonia peroxide solution) can be suitably used as an etchant used for the wet etching in step S10. The APM liquid corresponds to a mixed solution of ammonia water and hydrogen peroxide solution. In the bulk region 1B, when the semiconductor layer SM is removed by etching, the top surface of the insulating layer BX is exposed. On the other hand, in the SOI region 1A, since the semiconductor layer SM is covered with the insulating film ZM1, the semiconductor layer SM remains without being etched.

The etching in step S10 is performed in such a manner that the top surface of the semiconductor layer SM in the bulk region 1B, the top surface of the insulating film ZM1 in the SOI region 1A, and the top surface of the device isolation region ST are exposed. Therefore, when the semiconductor layer SM in the bulk region 1B is etched in step S10, a surface layer portion of the insulating film ZM1 in the SOI region 1A may be slightly etched. But, even in such a case, when the etching is completed in step S10, the insulating film ZM1 in the SOI region 1A remains as a layer, and the semiconductor layer SM in the SOI region 1A is not exposed. More specifically, even if the insulating film ZM1 in the SOI region 1A is etched in step S10, the etching amount (etching thickness) of the insulating film ZM1 is smaller than the thickness of the insulating film ZM1 in the SOI region 1A immediately before performing step S10. In step S10, the device isolation region ST can also be etched as much as the etching amount (etching thickness) of the insulating film ZM1 in the SOI region 1A.

At this stage, as shown in FIG. 13, in the SOI region 1A, the insulating film ZM1 remains in a layer shape and the top surface of the insulating film ZM1 is exposed. Meanwhile, in the bulk region 1B, the insulating film ZM1 and the semiconductor layer SM are removed and the top surface of the insulating layer BX is exposed.

Figure 14:
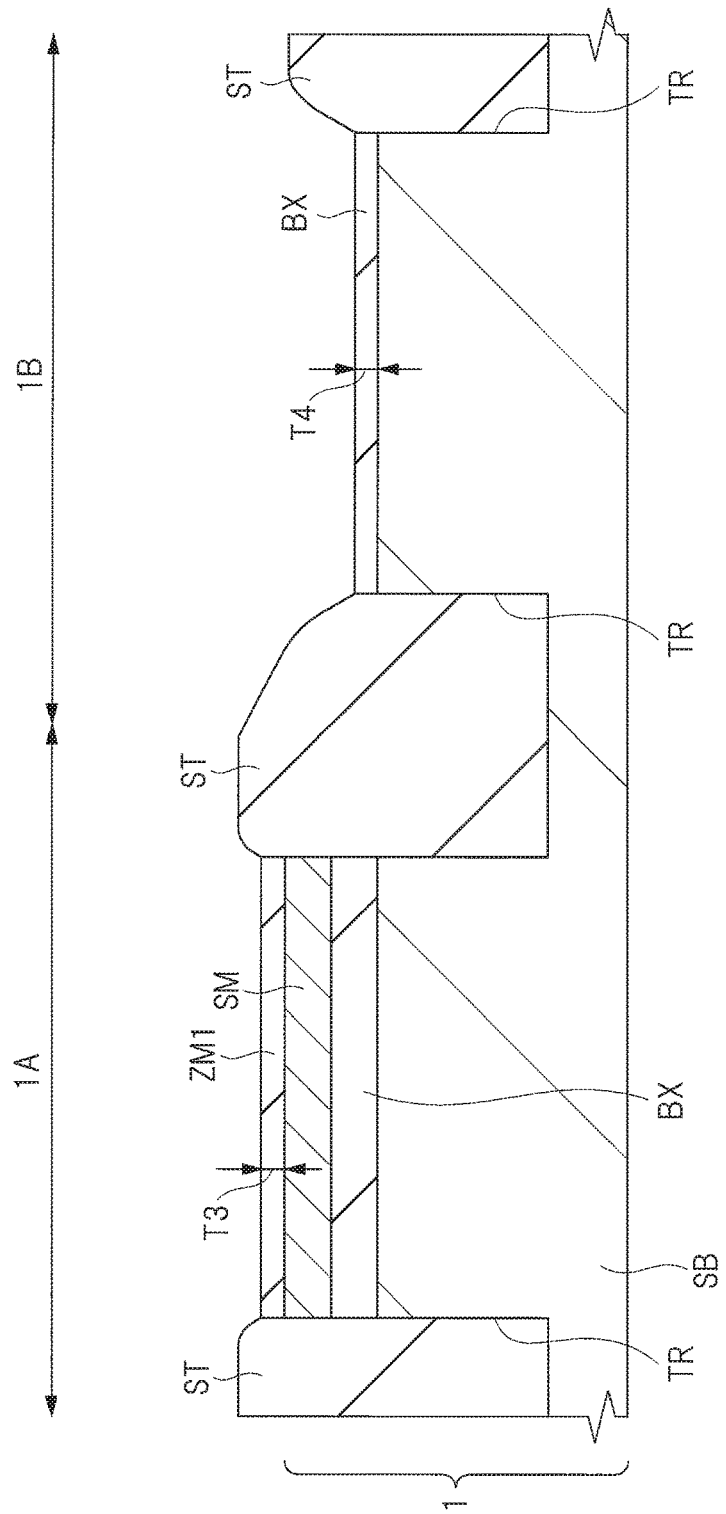
FIG. 14 is a cross-sectional view illustrating a main portion of the semiconductor device during its manufacturing process subsequent to FIG. 13.

Subsequently, as shown in FIG. 14, the insulating film ZM1 in the SOI region 1A and the insulating layer BX in the bulk region 1B are etched, so that the thickness of the insulating film ZM1 in the SOI region 1A and the thickness of the insulating layer BX in the bulk region 1B are made small (step S11 in FIG. 2). Wet etching can be suitably used for the etching in this step S11.

Incidentally, FIG. 13 shows a state after the etching in step S10 is completed and before an etching process in step S11 is performed. FIG. 14 shows a state when the etching process in step S11 is completed.

Since the objects to be etched in step S10 and step S11 are different, the etchant used in step S11 is different from the etchant used in step S10. More specifically, step S10 is a step of positively (intentionally) etching the semiconductor layer SM in the bulk region 1B, whereas step S11 is a step of positively (intentionally) etching the insulating film ZM1 in the SOI region 1A and the insulating layer BX in the bulk region 1B.

In step S10, the semiconductor layer SM is an object to be etched, and so an etchant that can be easily etch the semiconductor layer SM is used, i.e., an etchant that increases the etching speed of the semiconductor layer SM to some extent is used. On the other hand, in step S11, the insulating film ZM1 and the insulating layer BX are objects to be etched, and so an etchant which can easily etch the insulating film ZM1 and the insulating layer BX is used, i.e., an etchant with which the etching speed of each of the insulating film ZM1 and the insulating layer BX are increased to some degree is used.

Therefore, in the case where the etching solution used in step S11 is used, the etching speed of each of the insulating film ZM1 and the insulating layer BX are larger (higher) than the etching speed of each of the insulating film ZM1 and the insulating layer BX in the case where the etching solution used in step S10 is used. More specifically, the etching speed of each of the insulating film ZM1 in the SOI region 1A and the insulating layer BX in the bulk region 1B in an etching step of the step S11 become larger (higher) than the etching speed of each of the insulating film ZM1 in the SOI region 1A and the insulating layer BX in the bulk region 1B in an etching step of the step S10. Incidentally, since the insulating film ZM1 and the insulating layer BX are made of the same material (preferably silicon oxide), the etching speed of the insulating film ZM1 and the etching speed of the insulating layer BX in step S11 are substantially the same, and the etching speed of the insulating film ZM1 and the etching speed of the insulating layer BX in step S10 are substantially the same.

Additionally, in the etching step in step S10, an etchant which etches the semiconductor layer SM more easily than the insulating layer BX and the insulating film ZM1 is used, and so the etching speed of each of the insulating layer BX and the insulating film ZM1 become smaller (slower) than the etching speed of the semiconductor layer SM. On the other hand, a purpose of the etching step in step S11 is to etch the insulating layer BX and the insulating film ZM1, and so such an etchant is used that the insulating layer BX and the insulating film ZM1 are etched more easily than the semiconductor layer SM, i.e., the each etching speed of each of the insulating layer BX and the insulating film ZM1 are larger (faster) than the etching speed of the semiconductor layer SM.

When the insulating film ZM1 and the insulating layer BX are made of silicon oxide, hydrofluoric acid can be suitably used as an etchant used in the wet etching in step S11.

The etching in step S11 is performed in order to thin the thickness of the insulating film ZM1 in the SOI region 1A and the thickness of the insulating layer BX in the bulk region 1B. Therefore, the etching in step S11 is terminated before the entire thickness of the insulating film ZM1 in the SOI region 1A is removed and the semiconductor layer SM is exposed, and before the entire thickness of the insulating layer BX in the bulk region 1B is removed and the semiconductor substrate SB is exposed. Accordingly, immediately before the etching in step S11 or immediately after the etching in step S11, the insulating film ZM1 remains as a layer sharp in the SOI region 1A, and the insulating layer BX remains as a layer shape in the bulk region 1B. For this reason, immediately before the etching in step S11 or immediately after the etching in step S11, the semiconductor layer SM is not exposed in the SOI region 1A, and the semiconductor substrate SB is not exposed in the bulk region 1B.

A thickness T3 of the insulating film ZM1 in the SOI region 1A immediately after the etching in step S11 is thinner than a thickness T1 of the insulating film ZM1 in the SOI region 1A immediately before the etching in step S11 (i.e., 0<T3<T1). A thickness T4 of the insulating layer BX in the bulk region 1B immediately after etching in step S11 is thinner than a thickness T2 of the insulating layer BX in the bulk region 1B immediately before the etching in step S11 (i.e., 0<T4<T2).

Incidentally, a structure immediately before the etching in step S11 corresponds to FIG. 13, and a structure immediately after the etching in step S11 corresponds to FIG. 14. Therefore, the thickness T1 of the insulating film ZM1 in the SOI region 1A and the thickness T2 of the insulating layer BX in the bulk region 1B immediately before the etching in step S11 are shown in FIG. 13, and the thickness T3 of the insulating film ZM1 in the SOI region 1A and the thickness T4 of the insulating layer BX in the bulk region 1B immediately after the etching of step S11 are shown in FIG. 14.

The etching in step S11 is performed in such a manner that the top surface of the device isolation region ST, the top surface of the insulating film ZM1 in the SOI region 1A, and the top surface of the insulating layer BX in the bulk region 1B are exposed. Therefore, in step S11, a surface-layer portion of the device isolation region ST, a surface-layer portion of the insulating film ZM1 in the SOI region 1A, and a surface-layer portion of the insulating layer BX in the bulk region 1B are removed by etching. However, the etching amount (etching thickness) of the insulating film ZM1 in the SOI region 1A in the step S11 is smaller than the thickness T1 of the insulating film ZM1 in the SOI region 1A immediately before step S11 is performed, and the etching amount (etching thickness) of the insulating layer BX in the bulk region 1B in step S11 is smaller than the thickness T2 of the insulating layer BX in the bulk region 1B immediately before step S11 is performed. Therefore, even if step S11 is performed, such a state is maintained that the insulating film ZM1 remains as a layer shape on the semiconductor layer SM in the SOI region 1A and the insulating layer BX remains as a layer shape on the semiconductor substrate SB in the bulk region 1B; and the semiconductor layer SM is not exposed in the SOI region 1A, and the semiconductor substrate SB is not exposed in the bulk region 1B. In step S11, the device isolation region ST can also be etched to almost the same degree as the etching amount (etching thickness) of the insulating film ZM1 in the SOI region 1A.

Figure 15:
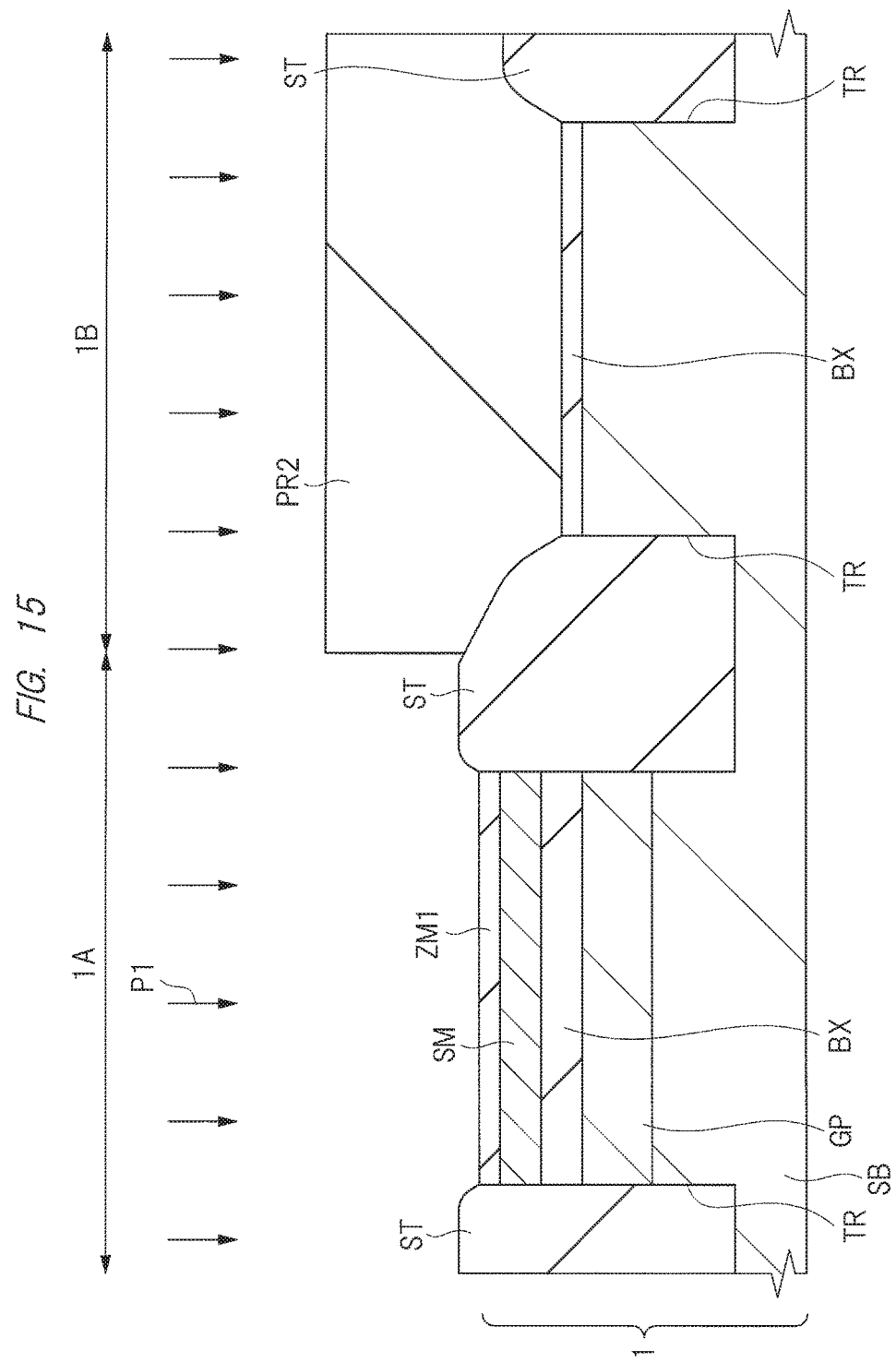
FIG. 15 is a cross-sectional view illustrating a main portion of the semiconductor device during its manufacturing process subsequent to FIG. 14.

Subsequently, as shown in FIG. 15, a photoresist pattern (resist pattern, mask layer) PR2 covering the bulk region 1B and exposing the SOI region 1A is formed, as a mask layer, on the SOI substrate 1 by using a photolithography technique. The insulating layer BX in the bulk region 1B is covered with the photoresist pattern PR2, but the insulating film ZM1 in the SOI region 1A is exposed without being covered with the photoresist pattern PR2. An end portion (side surface) of the photoresist pattern PR2 is located on the device isolation region ST located at a boundary between the SOI region 1A and the bulk region 1B.

Subsequently, by using the photoresist pattern PR2 as a mask (ion implantation blocking mask), ion implantation for adjusting the threshold value is performed onto the semiconductor substrate SB in the SOI region 1A (step S12 of FIG. 2). The ion implantation performed in this step S12 is schematically shown by arrows in FIG. 15, and will be hereinafter referred to as ion implantation P1. In FIG. 15, reference symbol "GP" is attached to a region, into which impurities are introduced by the ion implantation P1, to be shown as a semiconductor region (impurity diffusion layer) GP. The impurity is introduced into the semiconductor substrate SB in the SOI region 1A by the ion implantation P1 of step S12 to form the semiconductor region GP.

The ion implantation P1 is an ion implantation for controlling a threshold voltage (threshold value) of a MISFET which is to be formed later in the SOI region 1A. In this ion implantation P1, impurity ions are introduced into the semiconductor substrate SB of the SOI substrate 1 in the SOI region 1A, but it is desirable that the impurity ions are not introduced into the semiconductor layer SM of the SOI substrate 1. In this ion implantation P1, impurities are not introduced into the bulk region 1B of the SOI substrate 1 since the photoresist pattern PR2 functions as an ion implantation blocking mask. For this reason, the impurities are not introduced into the semiconductor substrate SB in the bulk region 1B and the semiconductor layer SM.

In the ion implantation P1, it is desirable that the impurity ions are not implanted into the semiconductor layer SM in the SOI region 1A. However, this is because the implantation of the impurity ions into the semiconductor layer SM of SOI region 1A by the ion implantation P1 causes variations in electric characteristics of the MISFETs formed later in the SOI region 1A.

Therefore, the ion implantation P1 is preferably performed with high implantation energy that allows impurity ions to penetrate through the semiconductor layer SM. The implantation energy of the ion implantation P1 is adjusted in accordance with the thickness of the insulating film ZM1, the thickness of the semiconductor layer SM, and the thickness of the insulating layer BX, and is set so that at least an impurity-ion range (flight distance) is located within the semiconductor substrate SB. As a result, in the ion implantation P1, the impurity ions can be implanted into the semiconductor substrate SB in the SOI region 1A without implanting the impurity ions into the semiconductor layer SM in the SOI region 1A.

In the ion implantation P1, the impurities are implanted into the semiconductor substrate SB under the insulating layer BX in the SOI region 1A, but the impurity ions are preferably also implanted in a region close to the insulating layer BX (region adjacent to the insulating layer BX) and in the semiconductor substrate SB. More specifically, the semiconductor region GP formed in the semiconductor substrate SB is preferably in contact with (adjacent to) the insulating layer BX. The threshold value of the MISFET, which is to be formed later in the SOI region 1A, can be controlled by adjusting an impurity concentration of this semiconductor region GP with an implantation amount (dose amount) of the ion implantation P1. Therefore, in the manufactured semiconductor device, the impurities become introduced into a region (corresponding to the semiconductor region GP) adjacent to the insulating layer BX in the semiconductor substrate SB on the SOI region 1A. After the ion implantation P1, the photoresist pattern PR2 is removed.

In the ion implantation P1 in step S12, it is desirable that the impurity ions are not injected into the semiconductor layer SM of the SOI substrate 1 as much as possible. However, the ion implantation energy is considerably high to achieve this. The ion implantation P1 needs a considerably large dose amount and, for example, it is about ten times as large as the dose amount of general channel doping ion implantation. If an example is given, the dose amount of the ion implantation P1 is about $1 \times 10^{12}$ to $1 \times 10^{14}$/cm$^2$. For this reason, in the ion implantation P1, a large amount of impurity ions are also implanted into a portion of the device isolation region ST not covered by the photoresist pattern PR2. More specifically, by the ion implantation P1, a large amount of impurity ions are also implanted into the portion of the device isolation region ST adjacent to the semiconductor layer SM in the SOI region 1A in a plan view. The device isolation region ST tends to be easily etched when the impurity ions are implanted, and an etching speed tends to easily increase in an etching process in step S14, which is performed later. However, in the present embodiment, both of the thickness of the insulating film ZM1 in the SOI region 1A and the thickness of the insulating layer BX in the bulk region 1B are thinned in the etching process of step S11, so that the etching amount can be reduced in step S14 described later, and thereby the device isolation region ST can be prevented from being excessively etched. Therefore, it is possible to suppress or prevent an occurrence of a divot DT, which will be described later, in the device isolation region ST in step S14 explained later.

Incidentally, the ion implantation process is not performed on the SOI substrate 1 from formation of the device isolation region ST in step S6 to a finish of the etching process in step S11, and so the etching process in step S10 and the etching process in step S11 are performed in such a state that the impurities are not implanted into the device isolation region ST. On the other hand, the ion implantation process (steps S12 and S13) are performed on the SOI substrate 1 after the etching process in step S11 and before the etching in step S14, and so the etching process in step S14 is performed in such a state that the ion implantation is also performed on the device isolation region ST.

In the ion implantation P1, p-type impurities (for example, boron or the like) or n-type impurities (for example, phosphorus, arsenic, or the like) are implanted. When the p-type impurities are implanted by the ion implantation P1, the semiconductor region GP is a p-type semiconductor region into which the p-type impurities are introduced. When n-type impurities are implanted by the ion implantation P1, the semiconductor region GP is an n type semiconductor region into which the n-type impurities are introduced. Incidentally, when the MISFET formed in the SOI region 1A is an n-channel type MISFET, it is more preferable that the impurity implanted in the ion implantation P1 is a p-type impurity. If so, even in a case where the impurity ions are implanted not only in the semiconductor substrate SB but also in the semiconductor layer SM by the ion implantation P1, problems associated therewith are less likely to occur.

The semiconductor region GP is formed to control the threshold voltage of the MISFET formed in the SOI region 1A. In the manufactured semiconductor device, the threshold voltage of the MISFET formed in the SOI region 1A can be controlled by applying a predetermined voltage (potential) to the semiconductor region GP formed in the semiconductor substrate SB in the SOI region 1A.

It is not desirable to directly form a photoresist pattern on a surface (silicon surface) of the semiconductor layer SM or on a surface (silicon surface) of the semiconductor substrate SB. In the present embodiment, the photoresist pattern PR2 is formed in such a state that the semiconductor layer SM and the semiconductor substrate SB are not exposed, and the photoresist pattern PR2 is formed on the device isolation region ST and on the insulating layer BX in the bulk region 1B. Therefore, the photoresist pattern PR2 does not need to come into contact with the surface of the semiconductor substrate SB (silicon surface) or the surface of the semiconductor layer SM (silicon surface). Further, the photoresist pattern PR1 is formed in such a state that the semiconductor layer SM and the semiconductor substrate SB are not exposed, and the photoresist pattern PR1 is formed on the device isolation region ST and on the insulating film ZM1 in the SOI region 1A. Therefore, the pattern PR1 does not need to be in contact with the surface (silicon surface) of the semiconductor substrate SB or the surface (silicon surface) of the semiconductor layer SM. Additionally, a later-described photoresist pattern PR3 is formed in such a state that the semiconductor layer SM and the semiconductor substrate SB are not exposed, and the photoresist pattern PR3 is formed on the device isolation region ST and on the insulating film ZM1 in the SOI region 1A. Therefore, the photoresist pattern PR3 does not need to be in contact with the surface (silicon surface) of the semiconductor substrate SB or the surface (silicon surface) of the semiconductor layer SM.

In the SOI region 1A, even after step S12 is finished, the insulating film ZM1 remains in a layer form, and a top surface of the insulating film ZM1 is kept in an exposed state. In the bulk region 1B, the insulating layer BX remains in a layer form and a top surface of the insulating layer BX is kept in an exposed state. In the SOI region 1A, the semiconductor layer SM is not exposed, and in the bulk region 1B, the semiconductor substrate SB is not exposed.

Figure 16:
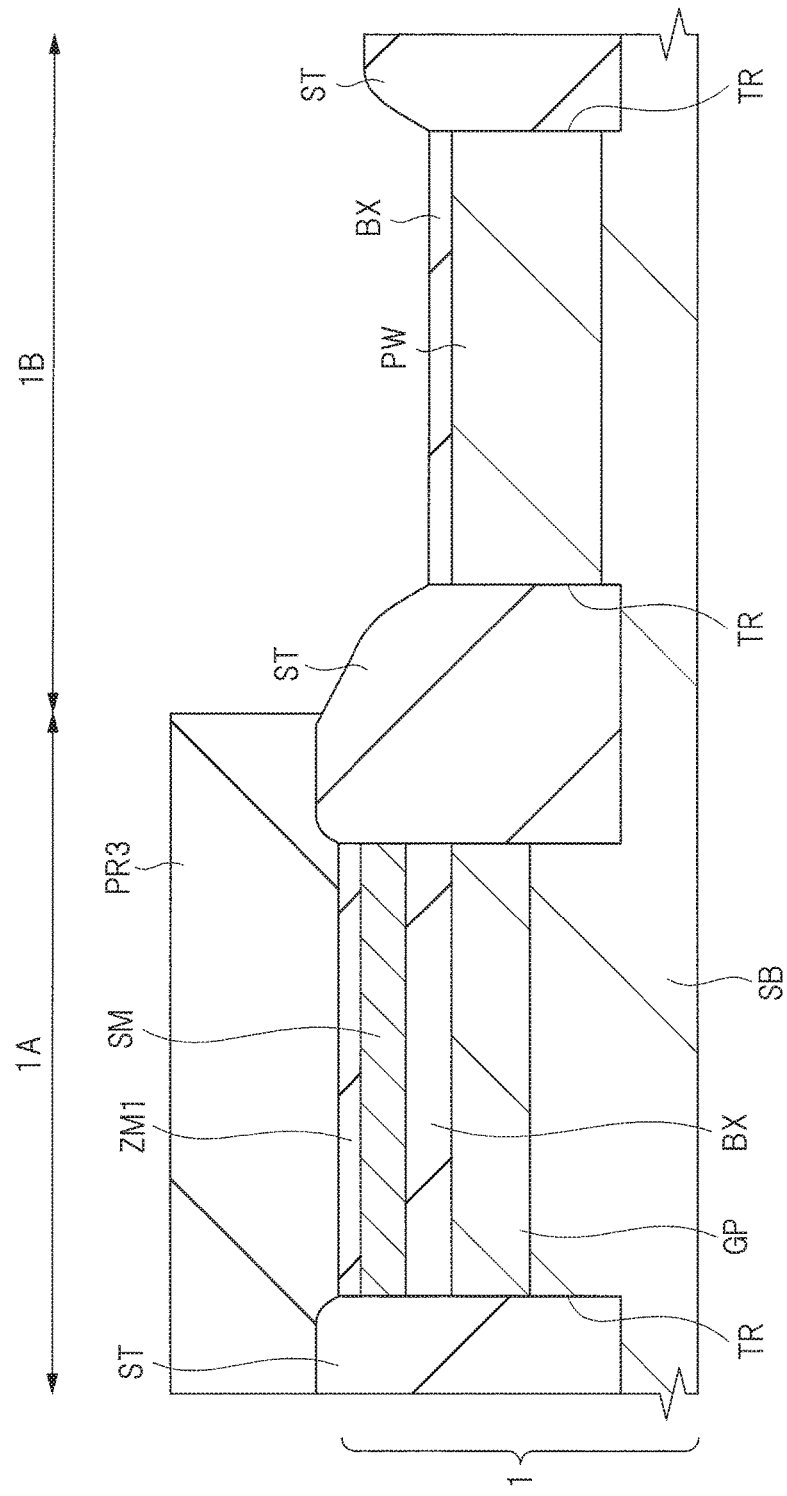
FIG. 16 is a cross-sectional view illustrating a main portion of the semiconductor device during its manufacturing process subsequent to FIG. 15.

Subsequently, as shown in FIG. 16, a photoresist pattern (resist pattern, mask layer) PR3 covering the SOI region 1A and exposing the bulk region 1B is formed as a mask layer on the SOI substrate 1 by using a photolithography technique. The insulating film ZM1 in the SOI region 1A is covered with the photoresist pattern PR3, but the insulating layer BX in the bulk region 1B is exposed without being covered with the photoresist pattern PR3. Each end portion (side surface) of the photoresist pattern PR3 is located on the device isolation region ST.

Subsequently, by using the photoresist pattern PR3 as a mask (ion implantation blocking mask), p-type impurities (for example, boron or the like) are implanted into the semiconductor substrate SB in the bulk region 1B, and thereby a p type well PW is formed (step S13 in FIG. 2).

Figure 17:
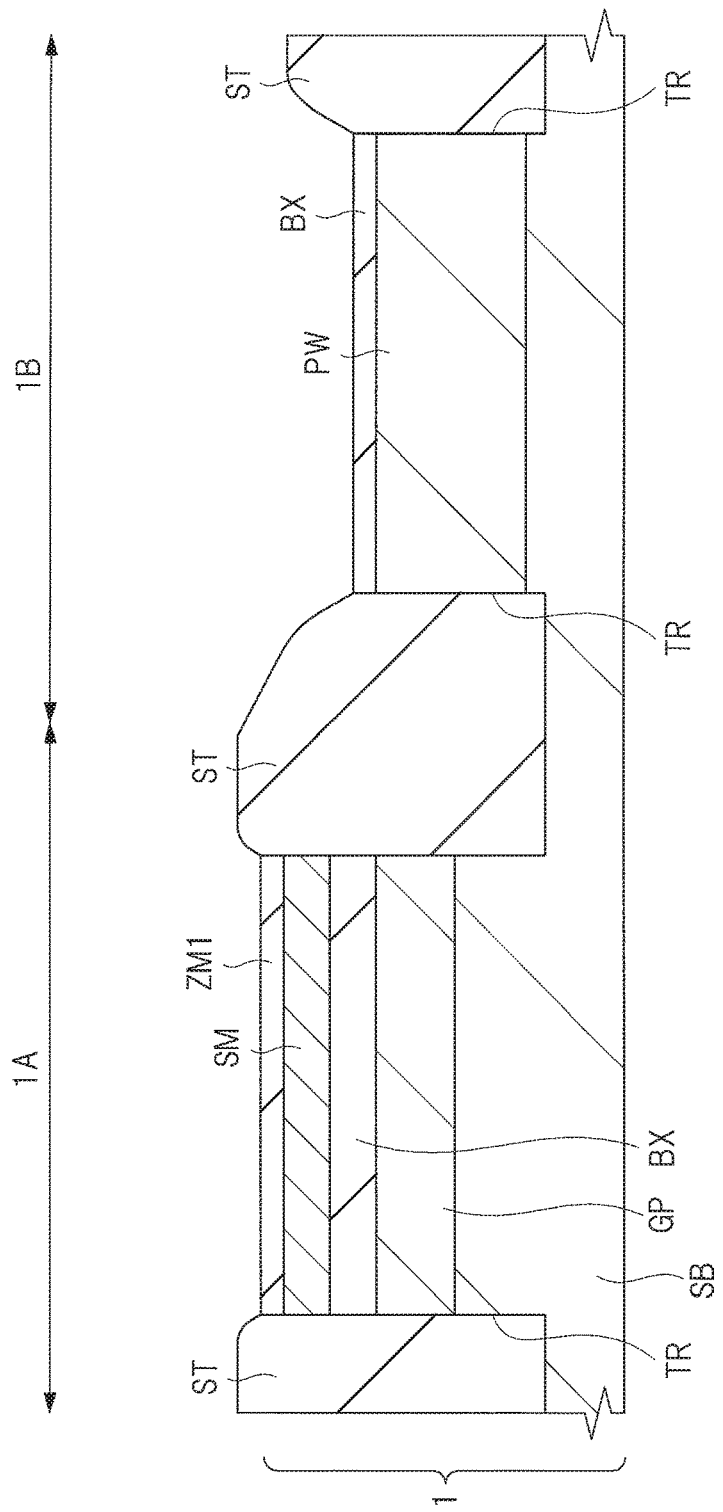
FIG. 17 is a cross-sectional view illustrating a main portion of the semiconductor device during its manufacturing process subsequent to FIG. 16.

In the ion implantation for forming the p type well PW, since the photoresist pattern PR3 functions as an ion implantation blocking mask, impurities are not introduced into the SOI region 1A of the SOI substrate 1. Therefore, the impurities are not introduced into the semiconductor layer SM and the semiconductor substrate SB in the SOI region 1A. The p type well PW is formed on the semiconductor substrate SB in bulk region 1B. After the ion implantation in step S13, the photoresist pattern PR3 is removed as shown in FIG. 17.

Channel doping ion implantation can be performed on the semiconductor substrate SB in the bulk region 1B by using the photoresist pattern PR3 as a mask (ion implantation blocking mask) before or after the ion implantation for forming the p type well PW.

Further, here, a case of performing the step S13 after the step S12 is explained. But, it can be performed as another embodiment that: order of step S12 and step S13 is exchanged; step S13 is performed first before step S12 is performed; and thereafter step S12 is performed. In this case, after the etching process of step S11, the following process is performed in order: a photoresist pattern PR3 forming process, the ion implantation (p type well PW forming process) of step S13, a photoresist pattern PR3 removing process, a photoresist pattern PR2 forming process, the ion implantation P1 (semiconductor region GP forming process) of step S12, and a photoresist pattern PR2 removing process.

Figure 18:
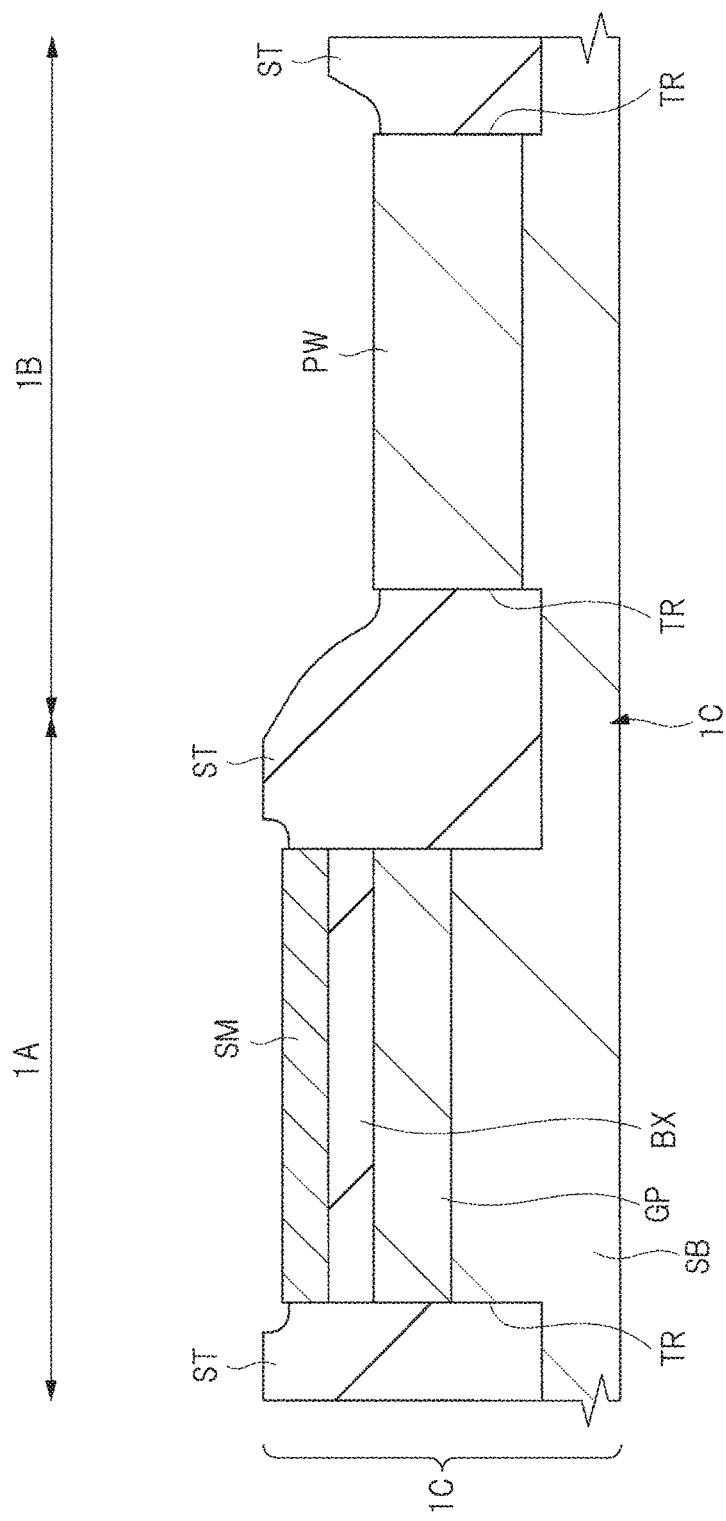
FIG. 18 is a cross-sectional view illustrating a main portion of the semiconductor device during its manufacturing process subsequent to FIG. 17.

Subsequently, as shown in FIG. 18, the insulating film ZM1 in the SOI region 1A and the insulating layer BX in the bulk region 1B are removed by etching (step S14 of FIG. 2).

In this step S14, the insulating film ZM1 in the SOI region 1A and the insulating layer BX in the bulk region 1B are preferably removed by etching under the condition that the semiconductor layer SM and the semiconductor substrate SB are less easily etched than the insulating film ZM1 and the insulating layer BX. In other words, in step S14, the insulating film ZM1 in the SOI region 1A and the insulating layer BX in the bulk region 1B are preferably removed by etching under the condition that the etching speed of the semiconductor layer SM and the etching speed of the semiconductor substrate SB are smaller than the etching speed of the insulating film ZM1 and the etching speed of the insulating layer BX. Therefore, the insulating film ZM1 in the SOI region 1A and the insulating layer BX in the bulk region 1B are removed by etching, and the semiconductor layer SM in the SOI region 1A and the semiconductor substrate SB in the bulk region 1B can function as etching stoppers, and it is possible to suppress or prevent the etching of the semiconductor layer SM in the SOI region 1A and the semiconductor substrate SB in the bulk region 1B.

Wet etching can be suitably used for the etching in step S14. Targets to be etched in step S11 and step S14 are the same, and the target to be etched in step S14 is the insulating film ZM1 and the insulating layer BX. Therefore, the same kind of etching solution as an etching solution used in step S11 can be used for etching in step S14. When the insulating film ZM1 and the insulating layer BX are made of silicon oxide as one another, hydrofluoric acid can be suitably used as an etching solution also in step S14 just like step S11. Incidentally, when hydrofluoric acid is used for both of the etching solution in step S11 and the etching solution in step S14, concentrations of hydrofluoric acid in step S11 and step S14 may be the same or may be different.

More specifically, the same type of etching solution as that used in step S11 is used for the etching of step S14, but this means that hydrofluoric acid is also used in step S14 when the etching solution used in step S11 is hydrofluoric acid, and the concentrations of the etching solutions (here, the concentrations of hydrofluoric acid) used in step S11 and step S14 may be different from each other. More specifically, the same type of etchant means that the types of the etchants are the same, and includes not only a case where the concentrations of the etchants are the same but also a case where the concentrations of the etchants are different.

The etching in step S14 is performed in such a state that the top surface of the device isolation region ST, the top surface of the insulating film ZM1 in the SOI region 1A, and the top surface of the insulating layer BX in the bulk region 1B are exposed. Therefore, in step S14, a surface layer portion of the device isolation region ST, the insulating film ZM1 in the SOI region 1A, and the insulating layer BX in the bulk region 1B are removed by etching. The etching of step S14 is terminated when the insulating film ZM1 is removed in the SOI region 1A to expose the top surface of the semiconductor layer SM and when the insulating layer BX is removed in the bulk region 1B to expose the top surface of the semiconductor substrate SB. In step S14, the device isolation region ST can also be etched by etching amounts (etching thicknesses) almost equal to the etching amounts (etching thicknesses) of the insulating film ZM1 in the SOI region 1A and the insulating layer BX in the bulk region 1B.

As shown in FIG. 18, when step S14 is completed, the insulating film ZM1 is removed and the top surface of the semiconductor layer SM is exposed in the SOI region 1A, and the insulating layer BX is removed and the top surface of the semiconductor substrate SB (p type well PW) is exposed in the bulk region 1B.

In this way, the device isolation region ST is formed on the SOI substrate 1, and the semiconductor layer SM and the insulating layer BX are removed in the bulk region 1B to expose the top surface of the semiconductor substrate SB (this is not the SOI structure), and the semiconductor layer SM and the insulating layer BX still remain in the SOI region 1A so that the SOI structure (a layered structure including the semiconductor substrate SB, the insulating layer BX, and the semiconductor layer SM) is maintained in the SOI region 1A. In addition, a semiconductor region GP for threshold adjustment is formed in the semiconductor substrate SB within the SOI region 1A.

The SOI substrate 1 at this stage will be referred to as a substrate 1C. In this state, in the bulk region 1B of the substrate 1C, the semiconductor layer SM and the insulating layer BX are removed, the bulk region 1B of the substrate 1C is composed of the semiconductor substrate SB, and the SOI region 1A of the substrate 1C maintains the SOI structure (layered structure including the semiconductor substrate SB, the insulating layer BX, and the semiconductor layer SM). Hereinafter, a main surface of the substrate 1C is synonymous with a main surface of the semiconductor layer SM in the SOI region 1A and a main surface of the semiconductor substrate SB in the bulk region 1B. Although the substrate 1C has the SOI region 1A and the bulk region 1B, the SOI region 1A can be regarded as a region in which the insulating layer BX is embedded and that has the SOI structure, and the bulk region 1B can be regarded as a region in which the insulating layer BX is not embedded and that does not have the SOI structure. More specifically, the SOI region 1A in the substrate 1C is a region having the layered structure (SOI structure) in which the semiconductor substrate SB, the insulating layer BX on the semiconductor substrate SB, and the semiconductor layer SM on the insulating layer BX are stacked; and the bulk region 1B in the substrate 1C is a region where the entire thickness is composed of the semiconductor substrate SB. However, the SOI region 1A and the bulk region 1B may also include a region where the device isolation region ST exists. In the bulk region 1B, a part of the device isolation region ST (a part located lower than a lower surface of the insulating layer BX) remains in such a state that the part is embedded in the semiconductor substrate SB even after the removal of the semiconductor layer SM and the insulating layer BX; and this part becomes the device isolation region ST in bulk region 1B.

Subsequently, a semiconductor device such as a MISFET (transistor) is formed in each of the SOI region 1A and the bulk region 1B (step S15 in FIG. 2).

In the SOI region 1A of the substrate 1C, the semiconductor layer SM is partitioned into multiple regions (active regions) surrounded by the device isolation region ST in a plan view, and the MISFET is formed on the semiconductor layer SM of each active region. In the SOI region 1A of the substrate 1C, the semiconductor layer SM of each active region is, in a plan view, surrounded by the device isolation region ST, and has a lower surface adjacent to the insulating layer BX. Therefore, the semiconductor layer SM of each active region becomes surrounded by the device isolation region ST and the insulating layer BX. In the bulk region 1B of the substrate 1C, the semiconductor substrate SB is partitioned into a plurality of regions (active regions) surrounded by the device isolation region ST in a plan view, and the MISFET is formed on the semiconductor substrate SB within each active region. In the bulk region 1B of substrate 1C, each active region is surrounded by the device isolation region ST in a plan view.

An example of step S15 will be concretely described in details below.

Figure 19:
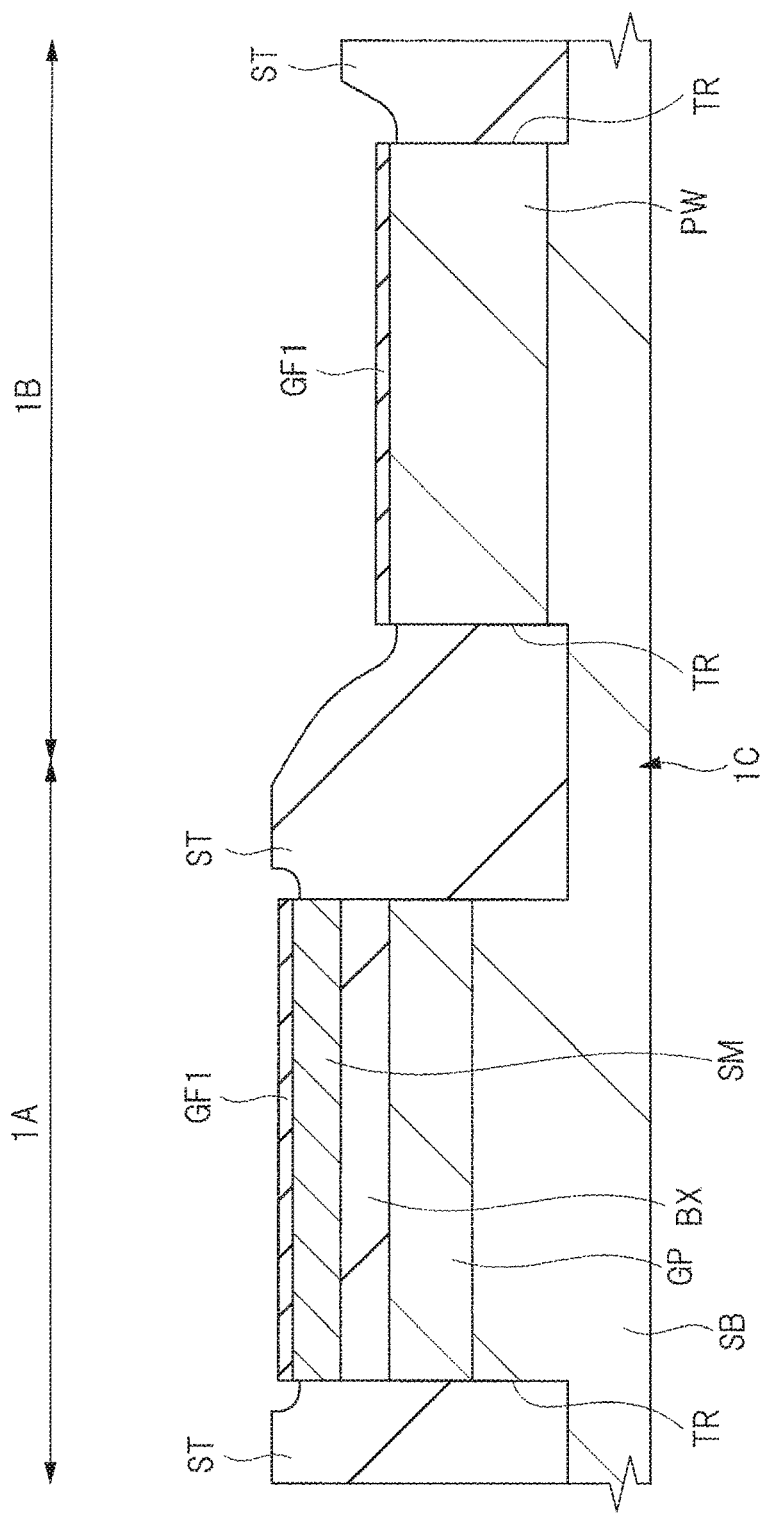
FIG. 19 is a cross-sectional view illustrating a main portion of the semiconductor device during its manufacturing process subsequent to FIG. 18.

First, as shown in FIG. 19, gate insulating films GF1 are formed on the top surface of the semiconductor layer SM in the SOI region 1A and the top surface of the semiconductor substrate SB in the bulk region 1B. The gate insulating film GF1 is made of oxidized silicon film or the like and can be formed by a thermal oxidation method or the like.

Figure 20:
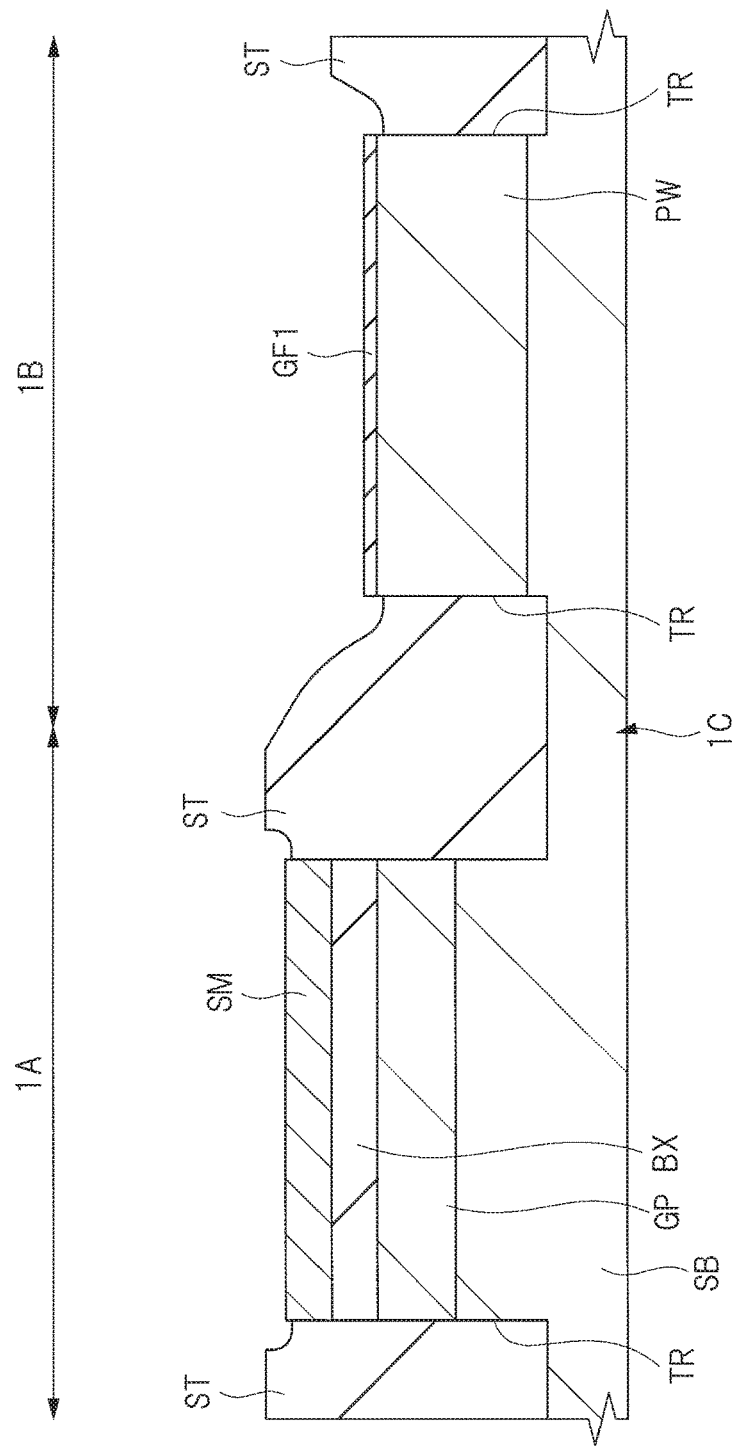
FIG. 20 is a cross-sectional view illustrating a main portion of the semiconductor device during its manufacturing process subsequent to FIG. 19.

Subsequently, a photoresist pattern (not shown) covering the gate insulating film GF1 in the bulk region 1B and exposing the gate insulating film GF1 in the SOI region 1A is formed on the SOI substrate 1 by a photolithography technique. Then, by using the photoresist pattern as an etching mask, the gate insulating film GF1 in the SOI region 1A is removed by etching. At this time, since the gate insulating film GF1 in the bulk region 1B is covered with the photoresist pattern, the gate insulating film GF1 in the bulk region 1B remains without being etched. Then, the photoresist pattern is removed. This state is shown in FIG. 20.

Figure 21:
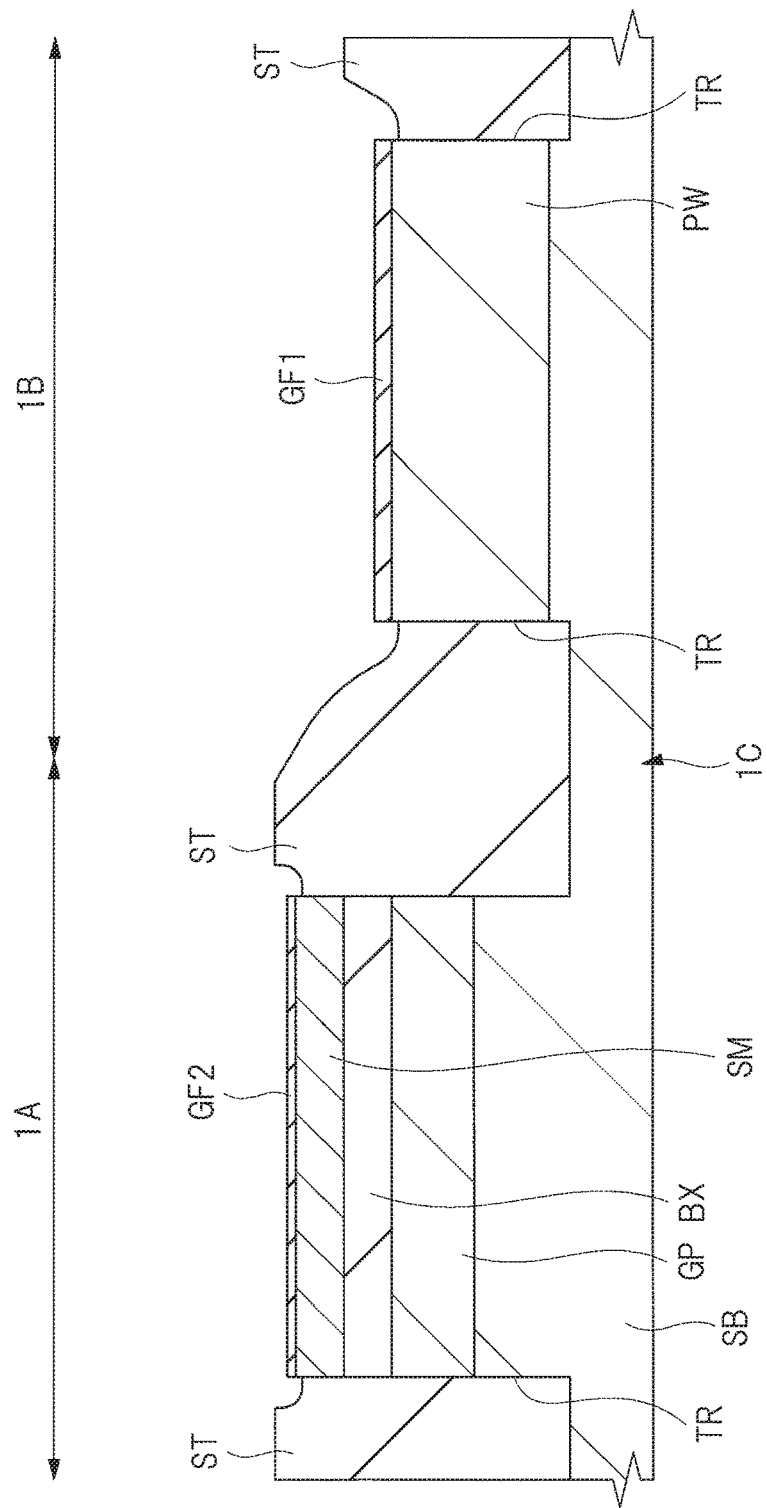
FIG. 21 is a cross-sectional view illustrating a main portion of the semiconductor device during its manufacturing process subsequent to FIG. 20.

Subsequently, as shown in FIG. 21, the gate insulating film GF2 is formed on the top surface of the semiconductor layer SM in the SOI region 1A. The gate insulating film GF2 is made of oxidized silicon film or the like and can be formed by a thermal oxidation method or the like. In a thermal oxidation processing for forming the gate insulating film GF2, a thickness of the gate insulating film GF1 in the bulk region 1B may be thick.

Obtained by this is a state in which the gate insulating film GF2 is formed on the top surface of the semiconductor layer SM in the SOI region 1A, and the gate insulating film GF1 is formed on the top surface of the semiconductor substrate SB in the bulk region 1B. At this state, the gate insulating film GF1 is thicker than the gate insulating film GF2.

Figure 22:
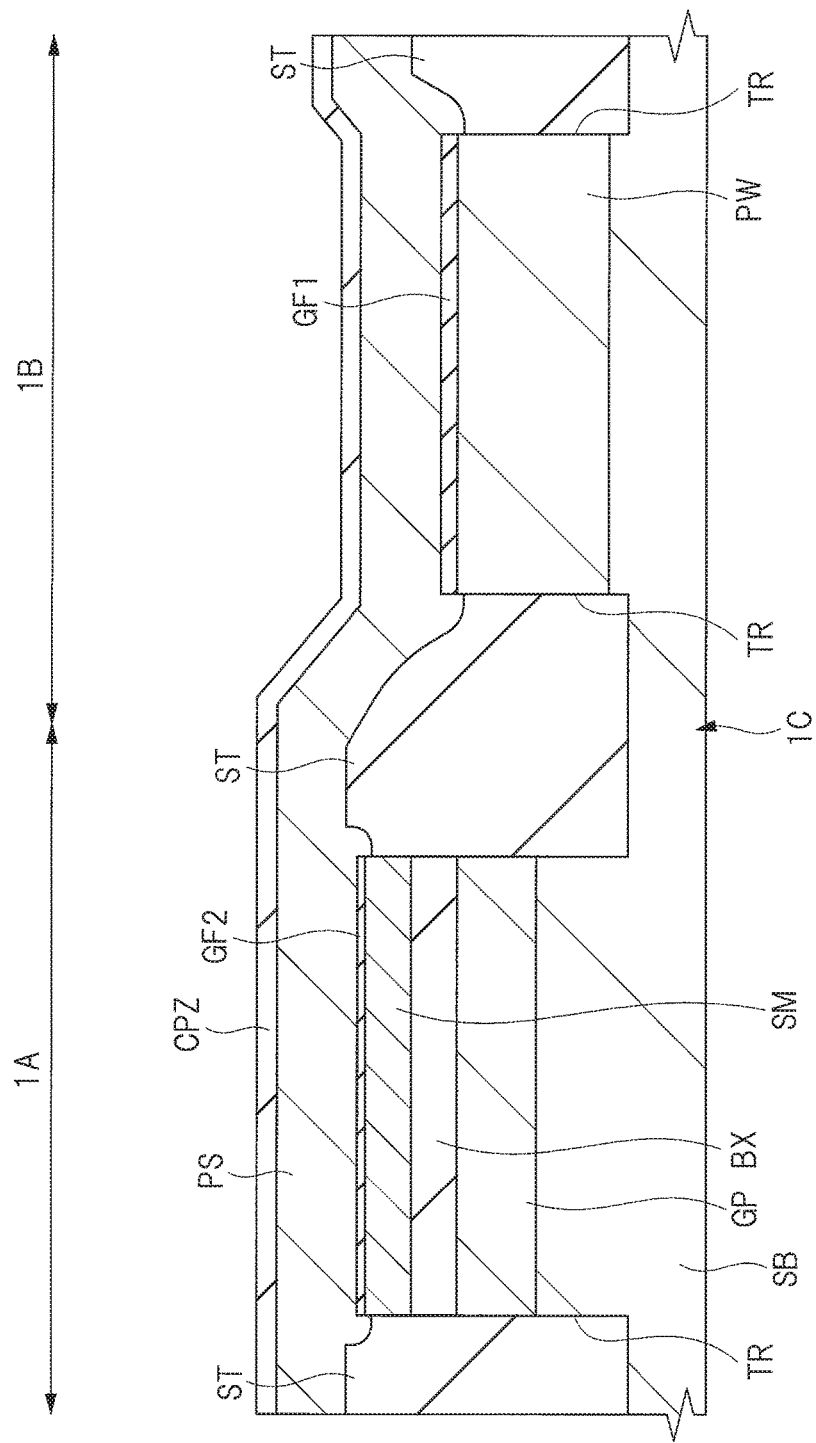
FIG. 22 is a cross-sectional view illustrating a main portion of the semiconductor device during its manufacturing process subsequent to FIG. 21.

Subsequently, as shown in FIG. 22, on the main surface of the substrate 1C, i.e., on the gate insulating films GF1, GF2 and the device isolation region ST, a silicon film PS such as a doped polysilicon film is formed as a conductive film for gate-electrode formation, and thereafter an insulating film CPZ such as a silicon nitride film is formed on the silicon film PS. Then, as shown in FIG. 23, the insulating film CPZ is patterned by using the photolithography method and the dry etching method, and then the silicon film PS is dry etched and patterned by using the patterned insulating film CPZ as an etching mask.

Figure 23:
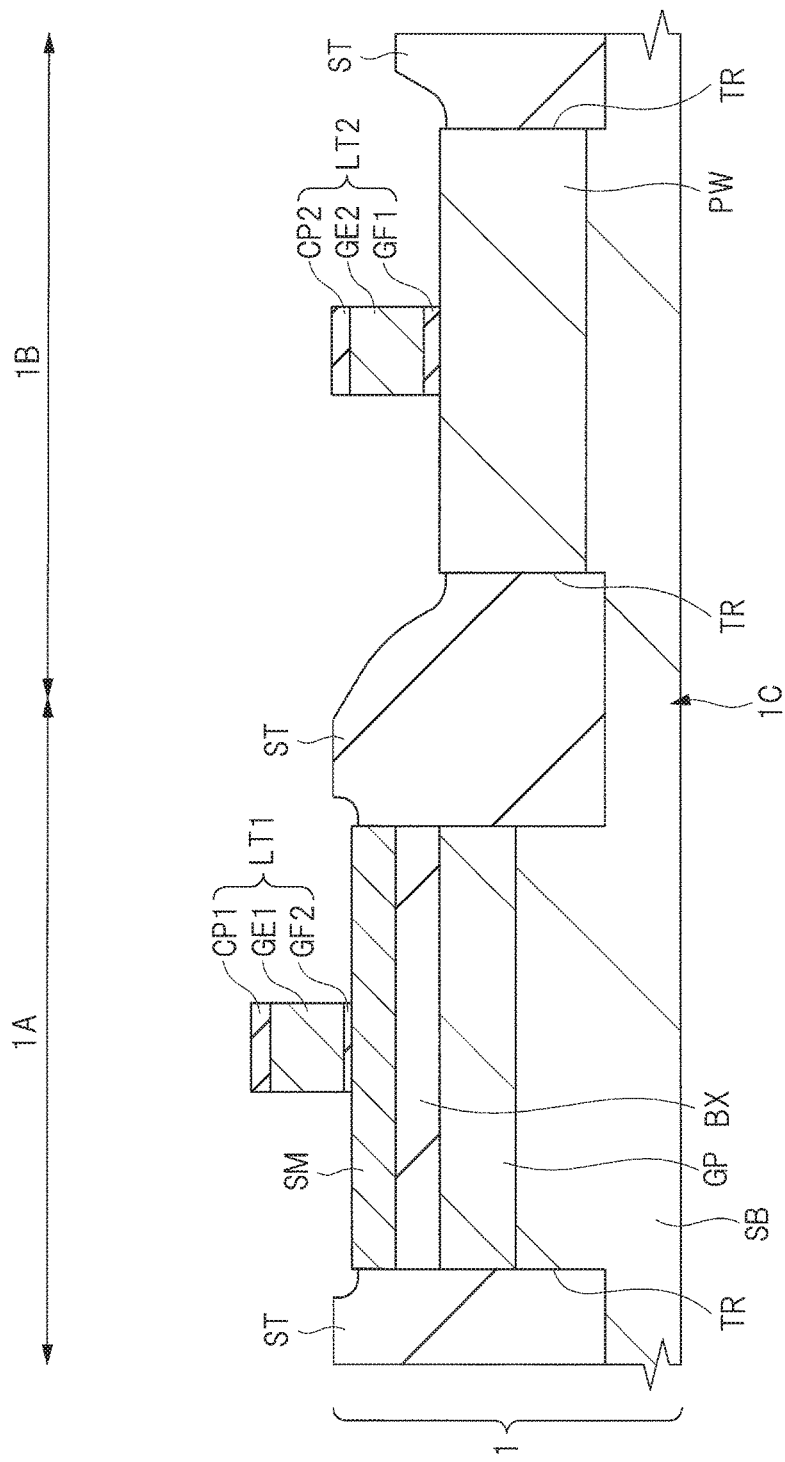
FIG. 23 is a cross-sectional view illustrating a main portion of the semiconductor device during its manufacturing process subsequent to FIG. 22.

As shown in FIG. 23, gate electrodes GE1, GE2 are formed by the patterned silicon film PS. The gate electrode GE1 is formed on the semiconductor layer SM in the SOI region 1A via the gate insulating film GF2. The gate electrode GE2 is formed over the semiconductor substrate SB (on p type well PW) in the bulk region 1B via the gate insulating film GF1. A cap insulating film CP1 including the patterned insulating film CPZ is formed on the gate electrode GE1, and a cap insulating film CP2 including the patterned insulating film CPZ is formed on the gate electrode GE2. The cap insulating film CP1 has substantially the same planar shape as the gate electrode GE1, and the cap insulating film CP2 has substantially the same planar shape as the gate electrode GE2. The gate insulating films GF1 and GF2 in portions not covered with the gate electrodes GE1 and GE2 can be removed by dry etching on patterning of the silicon film PS or by wet etching or the like subsequently performed.

Here, a laminated structure body including the gate insulating film GF2, the gate electrode GE1, and the cap insulating film CP1 formed in the SOI region 1A will be hereinafter referred to as a laminated body LT1. A laminated structure body including the gate insulating film GF1, the gate electrode GE2, and the cap insulating film CP2 formed in the bulk region 1B will be hereinafter referred to as a laminated body LT2.

FIG. 24 and FIG. 25 are plan views illustrating main portions in the same process step as that of FIG. 23. FIG. 24 shows the SOI region 1A. FIG. 25 shows the bulk region 1B. As can be seen from FIG. 24 and FIG. 25, both end portions of each of the laminated bodies LT1, LT2 in a gate width direction are located in the device isolation region ST. Incidentally, in the process of FIG. 19 and the process of FIG. 21, the gate insulating films GF1, GF2 are not formed on the device isolation region ST. Therefore, a part of the laminated body LT1 located on the device isolation region ST has a layered structure including the gate electrode GE1 and the cap insulating film CP1 without the gate insulating film GF2. A part of the laminated body LT2 located on the device isolation region ST has a layered structure including the gate electrode GE2 and the cap insulating film CP2 without the gate insulating film GF1.

Subsequently, a sidewall spacer SW1 is formed as a sidewall insulating film on a side surface of the laminated body LT1. A process of forming the sidewall spacer SW1 can be performed as follows.

Figure 26:
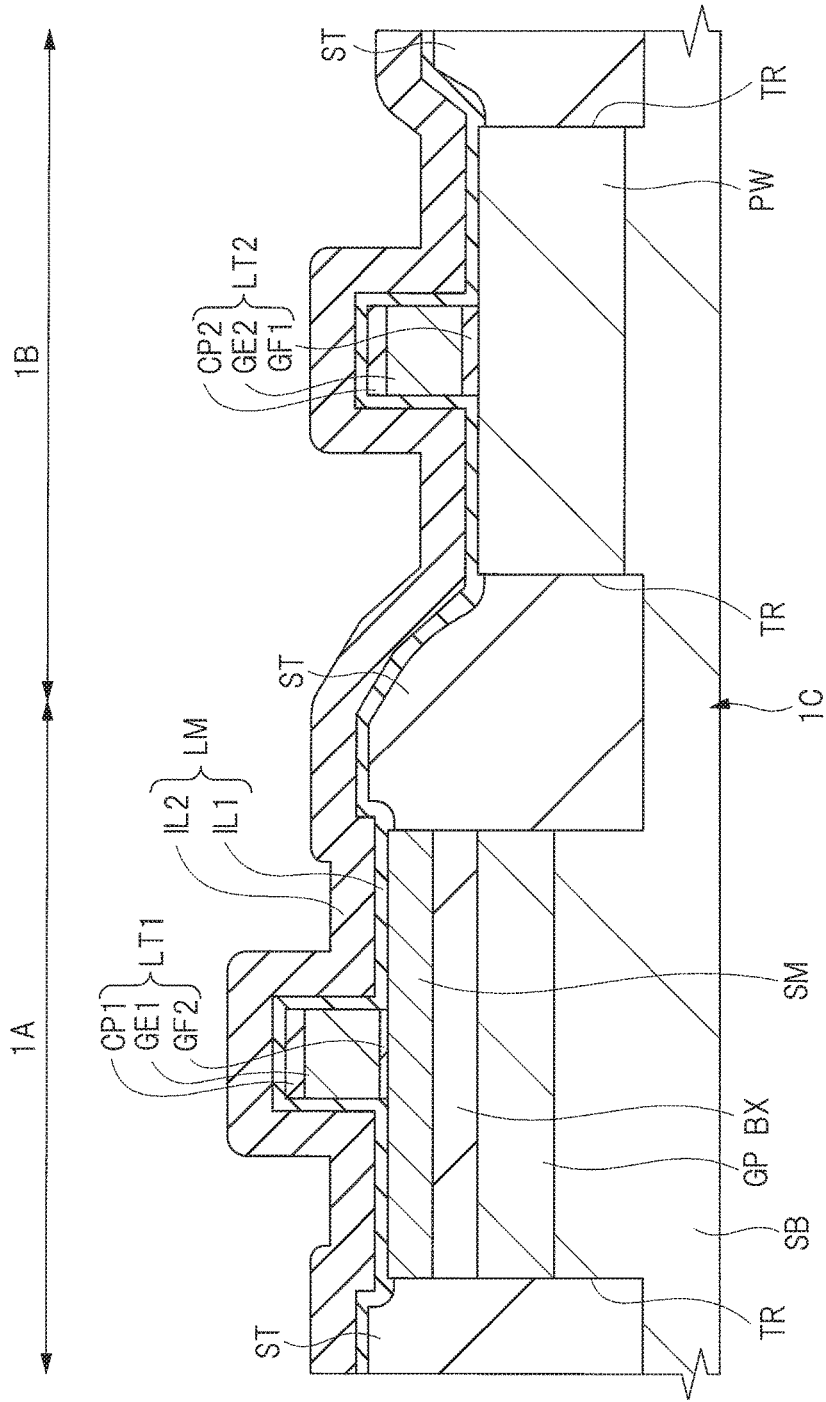
FIG. 26 is a cross-sectional view illustrating a main portion of the semiconductor device during its manufacturing process subsequent to FIG. 25.
Figure 27:
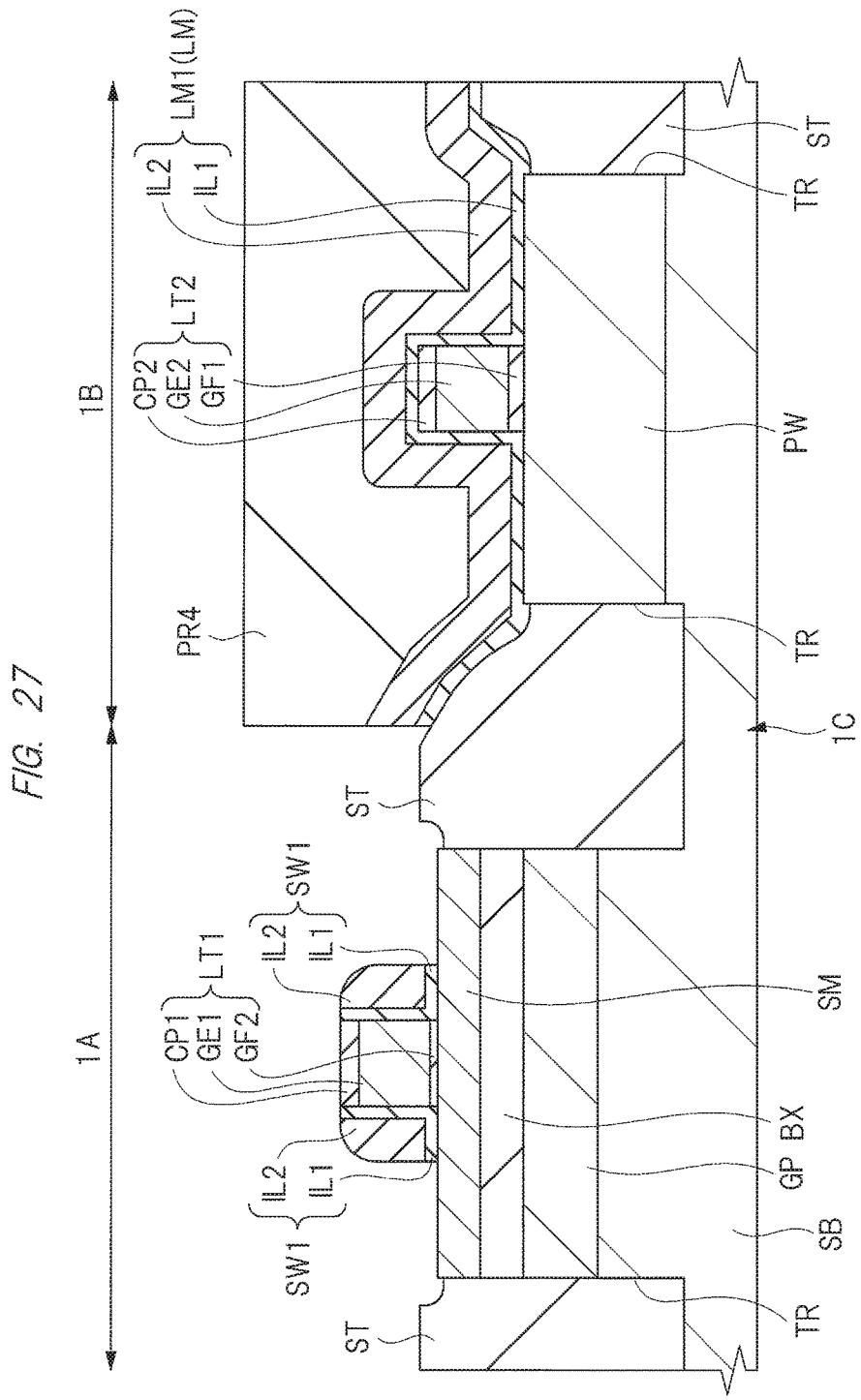
FIG. 27 is a cross-sectional view illustrating a main portion of the semiconductor device during its manufacturing process subsequent to FIG. 26.

First, as shown in FIG. 26, a layered film LM including an insulating film IL1 and an insulating film IL2 disposed on the insulating film IL1 is formed on the entire main surface of the substrate 1C so as to cover the laminated bodies LT1 and LT2. The insulating film IL1 and the insulating film IL2 are made of different materials and, more preferably, the insulating film IL1 is made of an oxidized silicon film, and the insulating film IL2 is made of a silicon nitride film. Thereafter, a photoresist pattern PR4 covering the layered film LM in the bulk region 1B and exposing the layered film LM in the SOI region 1A is formed on the layered film LM by the photolithography technique. Then, the layered film LM is etched back by an anisotropic etching technique, and thereby the sidewall spacers SW1 are formed on both side surfaces of the laminated body LT1. This state is shown in FIG. 27. The layered film LM in the bulk region 1B is covered with the photoresist pattern PR4, and so the layered film LM in the bulk region 1B remains without being etched. Here, the layered film LM remaining in the bulk region 1B will be hereinafter referred to as a layered film LM1. Thereafter, the photoresist pattern PR4 is removed. The sidewall spacer SW1 has an insulating film IL1 having substantially uniform thickness and continuously extending from above the semiconductor layer SM to the side surface of the laminated body LT1; and an insulating film IL2 spaced apart from the semiconductor layer SM and the laminated body LT1 via the insulating film IL1.

Figure 28:
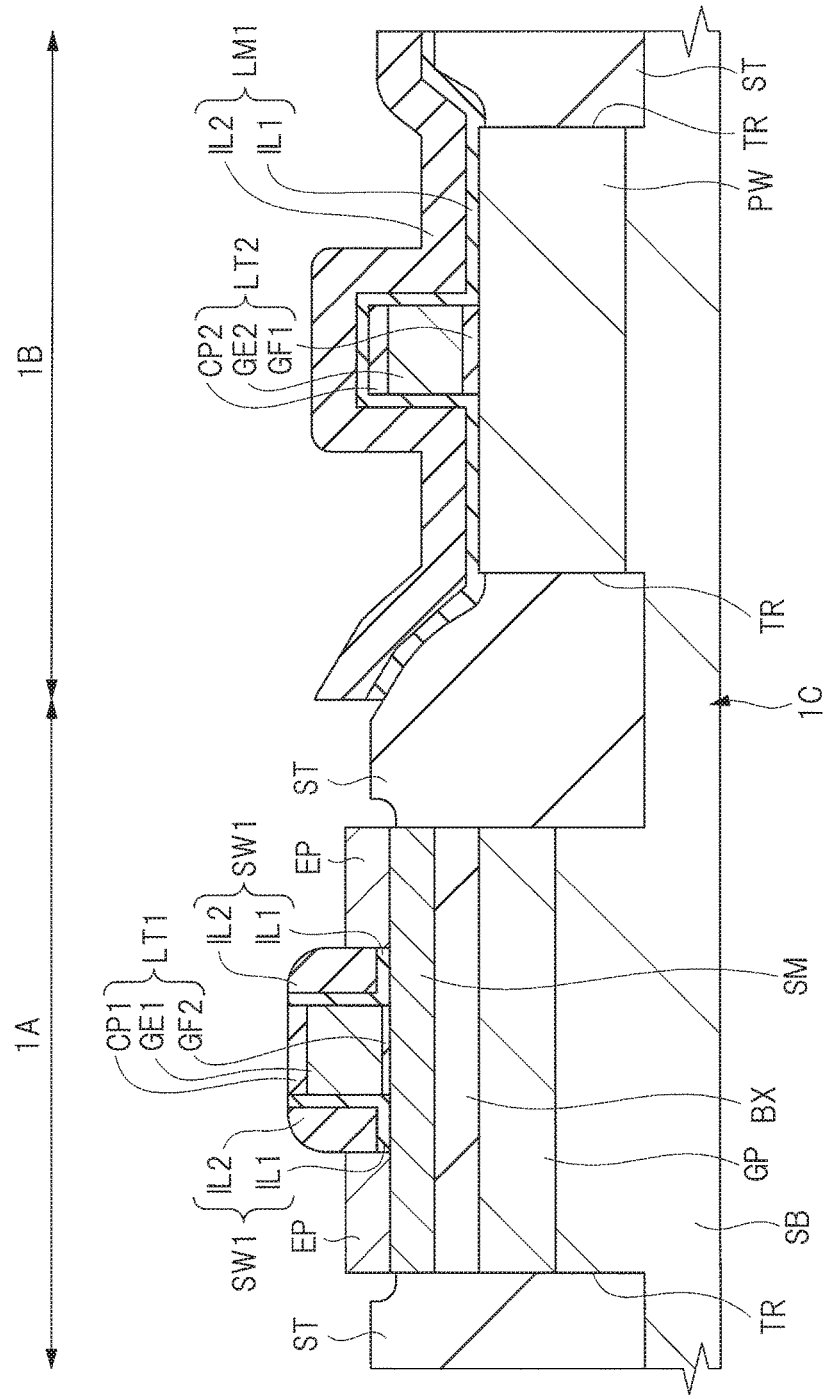
FIG. 28 is a cross-sectional view illustrating a main portion of the semiconductor device during its manufacturing process subsequent to FIG. 27.

Subsequently, as shown in FIG. 28, a semiconductor layer EP is formed on the semiconductor layer SM in the SOI region 1A by epitaxial growth. The semiconductor layer EP is an epitaxial layer formed by the epitaxial growth, and is made of, for example, single crystal silicon.

Since the semiconductor layer EP is formed by the epitaxial growth, an epitaxial layer (semiconductor layer EP) selectively grows on the exposed surface (Si surface) of the semiconductor layer SM, and the epitaxial layer does not grow on the insulating film. Therefore, the semiconductor layer EP selectively grows on a region (exposed surface) that are not covered with the laminated body LT1 and the sidewall spacer SW1 out of a surface range of the semiconductor layer SM in the SOI region 1A. Accordingly, in the SOI region 1A, the semiconductor layer EP is formed on each of both sides of a structure body including the laminated body LT1 and the sidewall spacer SW1. In the bulk region 1B, since the semiconductor substrate SB is covered with the layered film LM1, an epitaxial layer (semiconductor layer EP) is not formed in the bulk region 1B.

Incidentally, a combination of the semiconductor layer SM in the SOI region 1A and the semiconductor layer EP formed on the semiconductor layer SM will be hereinafter referred to as a semiconductor layer SM1.

Figure 29:
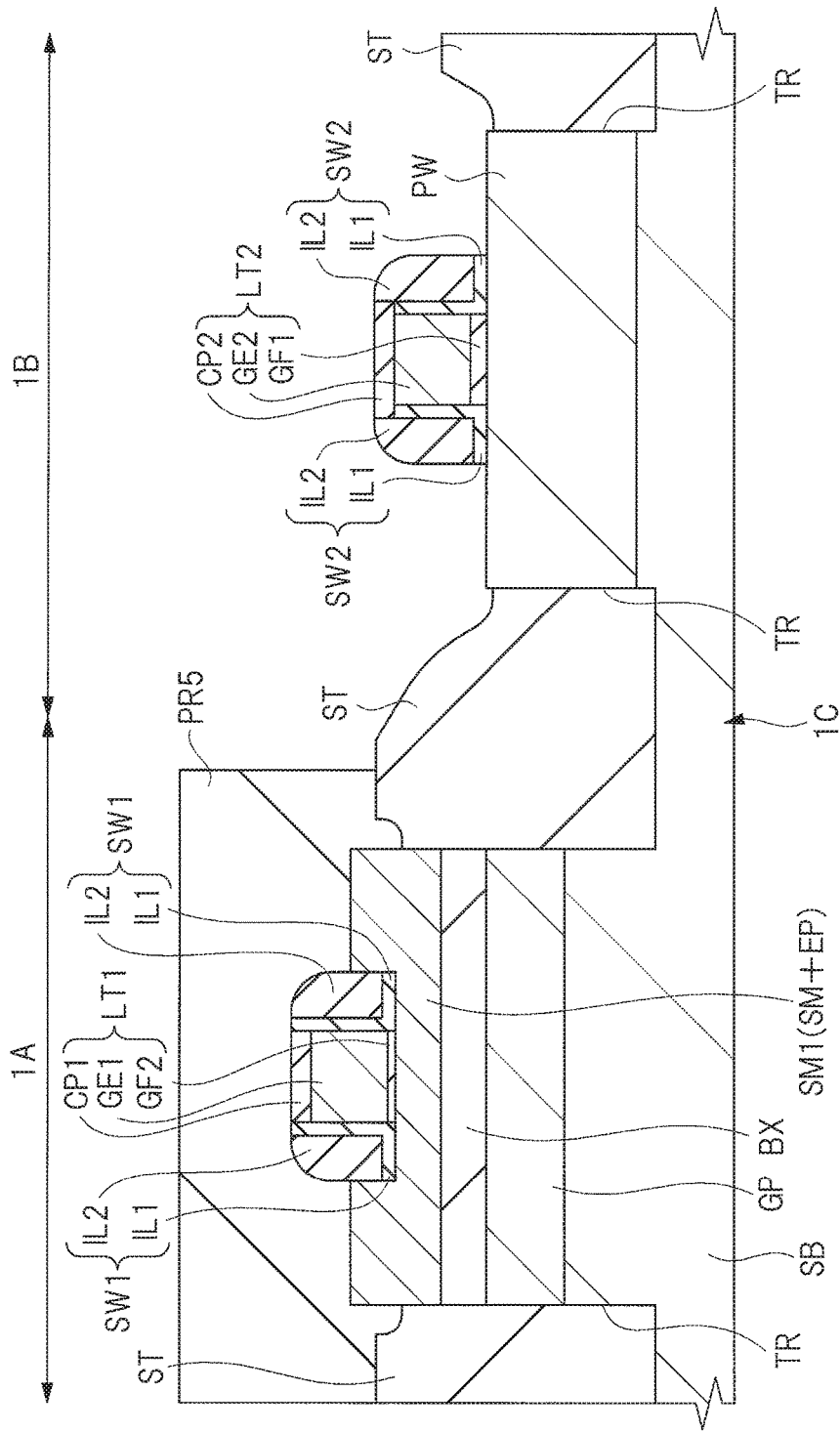
FIG. 29 is a cross-sectional view illustrating a main portion of the semiconductor device during its manufacturing process subsequent to FIG. 28.
Figure 30:
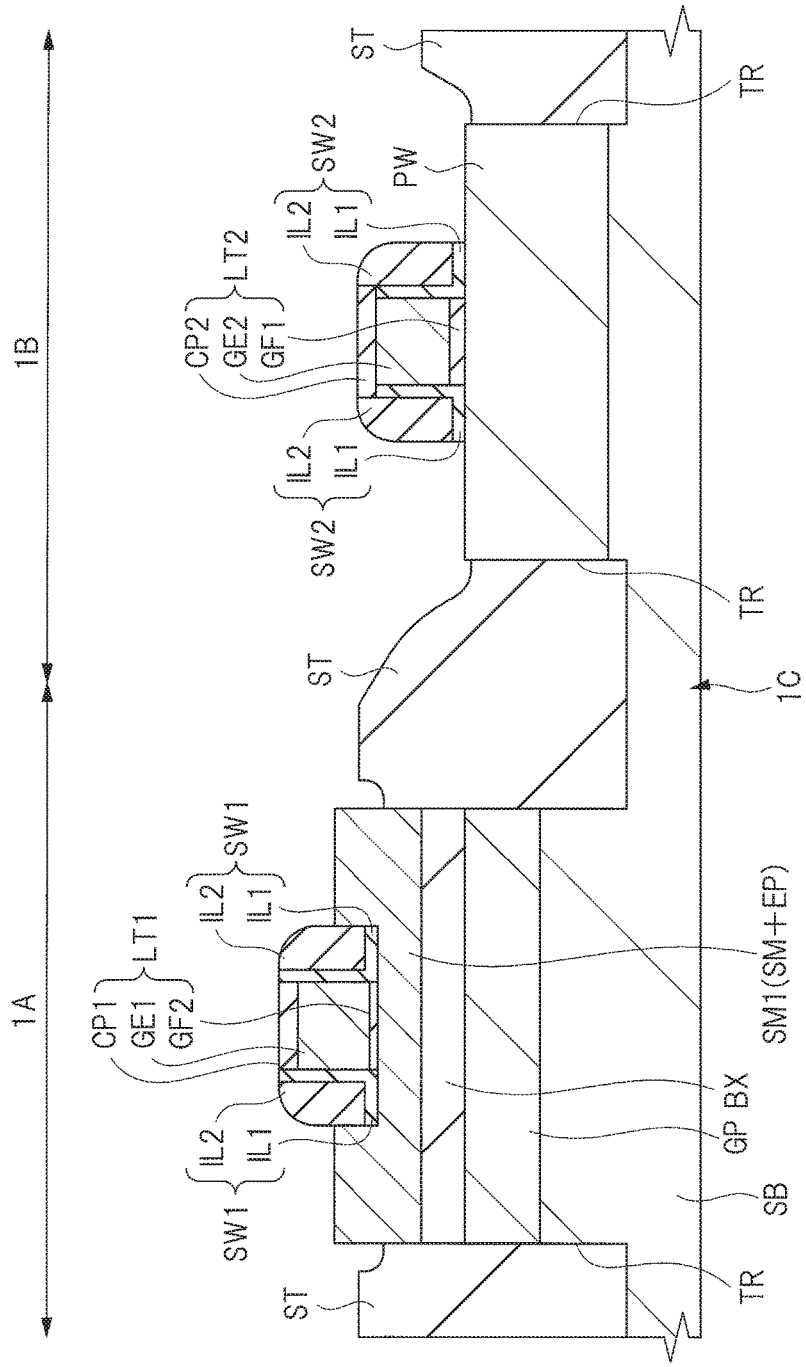
FIG. 30 is a cross-sectional view illustrating a main portion of the semiconductor device during its manufacturing process subsequent to FIG. 29.

Subsequently, as shown in FIG. 29, a photoresist pattern PR5 covering the SOI region 1A and exposing the bulk region 1B is formed by using a photolithography technique. Then, the layered film LM1 in the bulk region 1B is etched back by an anisotropic etching technique, so that sidewall spacers SW2 are formed on both side surfaces of the laminated body LT2. Since the laminated body LT1 and the sidewall spacer SW1 in the SOI region 1A are covered with the photoresist pattern PR5, the laminated body LT1 and the sidewall spacer SW1 in the SOI region 1A remain without being etched. Then, photoresist pattern PR5 is removed. This state is shown in FIG. 30. A configuration of the sidewall spacer SW2 is basically the same as that of the sidewall spacer SW1, and is formed by the layered film LM including the insulating film IL1 and the insulating film IL2.

Figure 31:
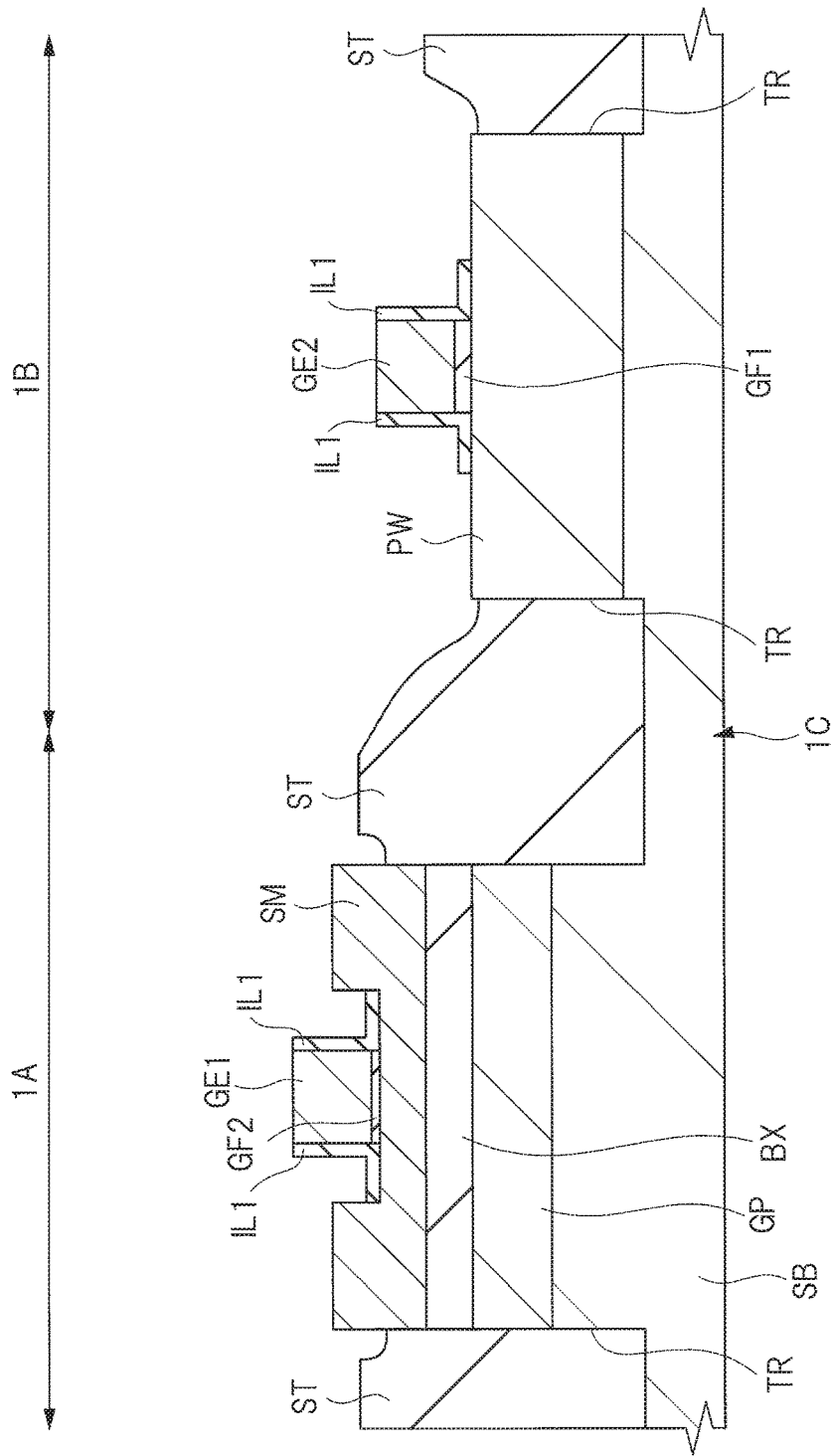
FIG. 31 is a cross-sectional view illustrating a main portion of the semiconductor device during its manufacturing process subsequent to FIG. 30.

Subsequently, as shown in FIG. 31, the insulating film IL2 constituting each of the sidewall spacers SW1 and SW2 is removed by etching. At this time, since the insulating film IL2 is removed by etching under the condition that the insulating film IL1 is less easily etched than the insulating film IL2, the insulating film IL1 constituting each of the sidewall spacers SW1 and SW2 is hardly etched and remains. Since the insulating film IL2 is formed of the same material as those of the cap insulating films CP1 and CP2, the cap insulating films CP1 and CP2 can also be removed at this time of the etching. By removing the cap insulating films CP1 and CP2, a metal silicide layer SL described later can be formed on the gate electrodes GE1 and GE2.

Figure 32:
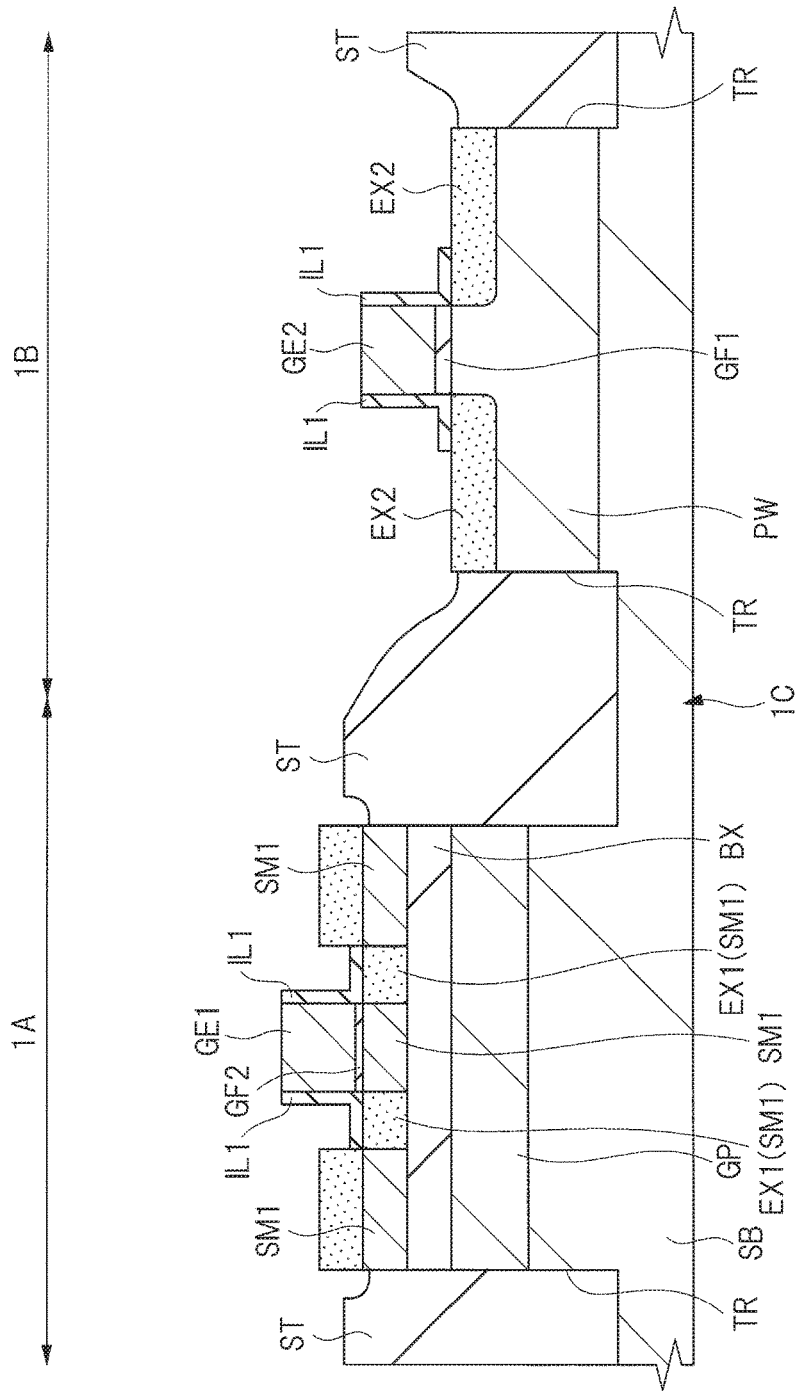
FIG. 32 is a cross-sectional view illustrating a main portion of the semiconductor device during its manufacturing process subsequent to FIG. 31.

Subsequently, as shown in FIG. 32, n-type impurities such as phosphorus (P) or arsenic (As) are implanted into regions located on both sides of the gate electrode GE1 on the semiconductor layer SM1 in the SOI region 1A, so that an $n^-$ type semiconductor regions (extension regions) EX1 are formed. As shown in FIG. 32, $n^-$ type impurities such as phosphorus (P) or arsenic (As) are implanted into regions located on both sides of the gate electrode GE2 over the semiconductor substrate SB (p type well PW) in the bulk region 1B, so that $n^-$ type semiconductor regions (extension regions) EX2 are formed. In FIG. 32, the regions where the impurities are implanted at this time are indicated with hatching of dots.

In the ion implantation for forming then type semiconductor region EX1, the gate electrode GE1 and a portion of the insulating film IL1 extending on each side surface of the gate electrode GE1 can function as an ion implantation blocking mask. In the ion implantation for forming then type semiconductor region EX2, the gate electrode GE2 and a portion of the insulating film IL1 extending on each side surface of the gate electrode GE2 can function as an ion implantation blocking mask. The $n^-$ type semiconductor region EX1 and the $n^-$ type semiconductor region EX2 may be formed by the same ion implantation process or may be formed by different ion implantation processes.

Figure 33:
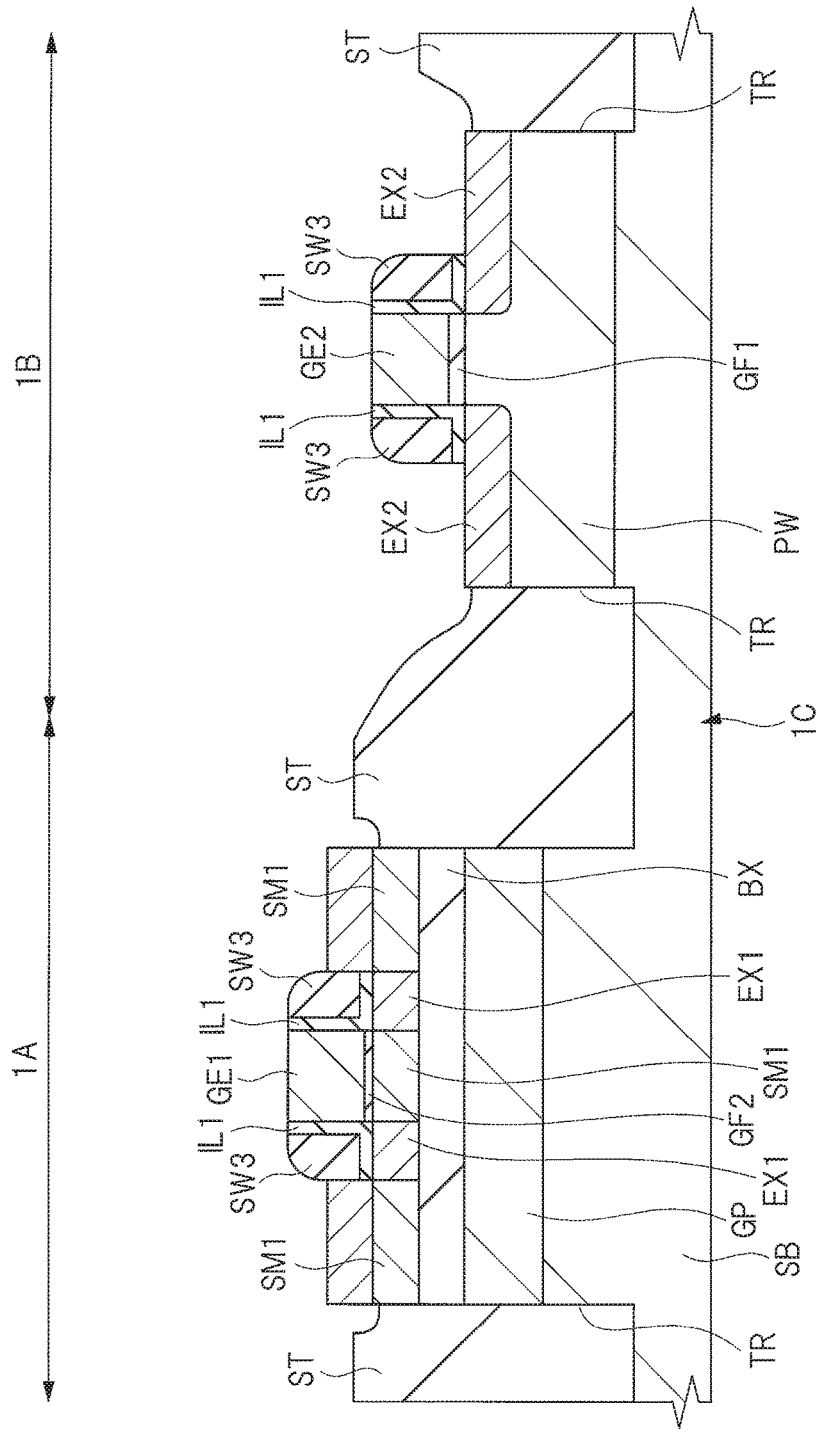
FIG. 33 is a cross-sectional view illustrating a main portion of the semiconductor device during its manufacturing process subsequent to FIG. 32.

Subsequently, as shown in FIG. 33, a sidewall spacer SW3 is formed, as a sidewall insulating film, on side surfaces of the gate electrodes GE1 and GE2. A forming process of the sidewall spacer SW3 can be performed as follows.

More specifically, an insulating film (for example, a silicon nitride film) for forming the sidewall spacer SW3 is formed on the main surface of the substrate 1C so as to cover the gate electrodes GE1 and GE2 and the insulating film IL1, and then, the sidewall spacers SW3 can be formed on the side surfaces of the gate electrodes GE1 and GE2 by etching back this insulating film by using an anisotropic etching technique. In the SOI region 1A, the sidewall spacer SW3 is formed on each side surface of the gate electrode GE1 via the insulating film IL1. In the bulk region 1B, the sidewall spacer SW3 is formed on each side surface of the gate electrode GE2 via the insulating film IL1.

Figure 34:
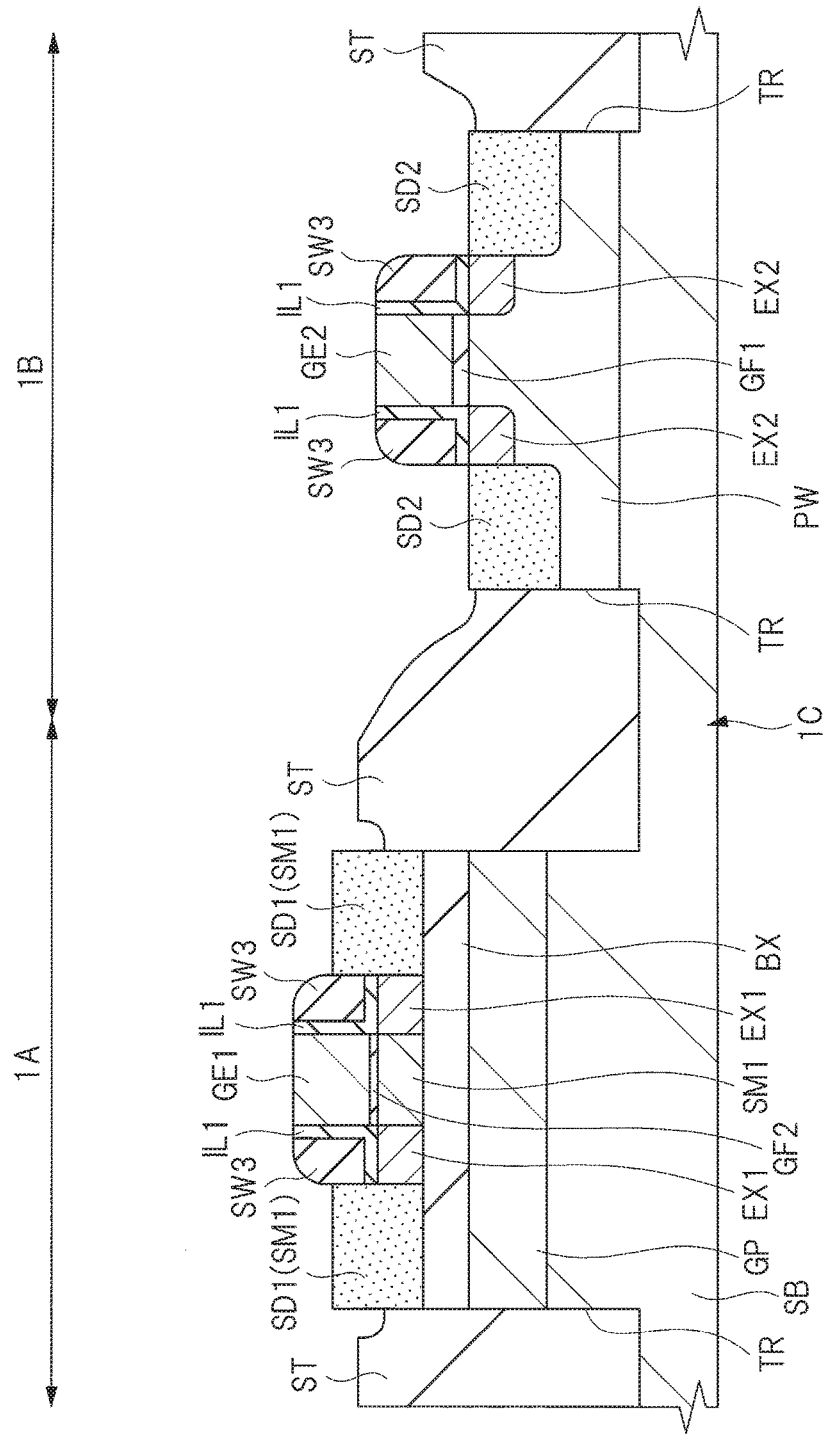
FIG. 34 is a cross-sectional view illustrating a main portion of the semiconductor device during its manufacturing process subsequent to FIG. 33.

Subsequently, as shown in FIG. 34, n-type impurities such as phosphorus (P) or arsenic (As) are implanted into regions located on both sides of the gate electrode GE1 and the sidewall spacers SW3 over the semiconductor layer SM1 in the SOI region 1A, so that $n^+$ type semiconductor regions (source/drain regions) SD1 are formed. As shown in FIG. 34, n-type impurities such as phosphorus (P) or arsenic (As) are implanted into regions located on both sides of gate electrode GE2 and the sidewall spacers SW3 over the semiconductor substrate SB (p type well PW) in the bulk region 1B, so that $n^+$ type semiconductor regions (source/drain regions) SD2 are formed. In FIG. 34, the regions where the impurities are implanted at this time are shown with hatching of dots.

In the ion implantation for forming the $n^+$ type semiconductor region SD1, the gate electrode GE1 and the sidewall spacers SW3 on both sides thereof can function as an ion implantation blocking mask. In the ion implantation for forming the $n^+$ type semiconductor region SD2, the gate electrode GE2 and the sidewall spacers SW3 on both sides thereof can function as an ion implantation blocking mask. The $n^+$ type semiconductor region SD1 has a higher impurity concentration than the $n^-$ type semiconductor region EX1, and the $n^+$ type semiconductor region SD2 has a higher impurity concentration than the $n^-$ type semiconductor region EX2. The $n^+$ type semiconductor region SD1 and the $n^+$ type semiconductor region SD2 may be formed by the same ion implantation process or may be formed by different ion implantation processes.

The $n^-$ type semiconductor region EX1 is formed adjacently to a channel forming region in the semiconductor layer SM1, and the $n^+$ type semiconductor region SD1 is away from the channel forming region by a distance equivalent to the $n^-$ type semiconductor region EX1 and is formed at a position adjacent to the $n^-$ type semiconductor region EX1 in the semiconductor layer SM1. The $n^-$ type semiconductor region EX2 is formed adjacently to a channel forming region in the semiconductor substrate SB (p type well PW). The $n^+$ type semiconductor region SD2 is away from the channel forming region by a distance equivalent to the $n^-$ type semiconductor region EX2 and is formed at a position adjacent to the $n^-$ type semiconductor region EX2 in the semiconductor substrate SB (p type well PW).

Subsequently, performed is activation annealing which is thermal treatment for activating the impurities introduced into the $n^+$ type semiconductor regions SD1, SD2 and the $n^-$ type semiconductor regions EX1, EX2, and the like. When the ion implantation regions are amorphized, the ion implantation region can be crystallized at a time of this activation annealing.

Figure 35:
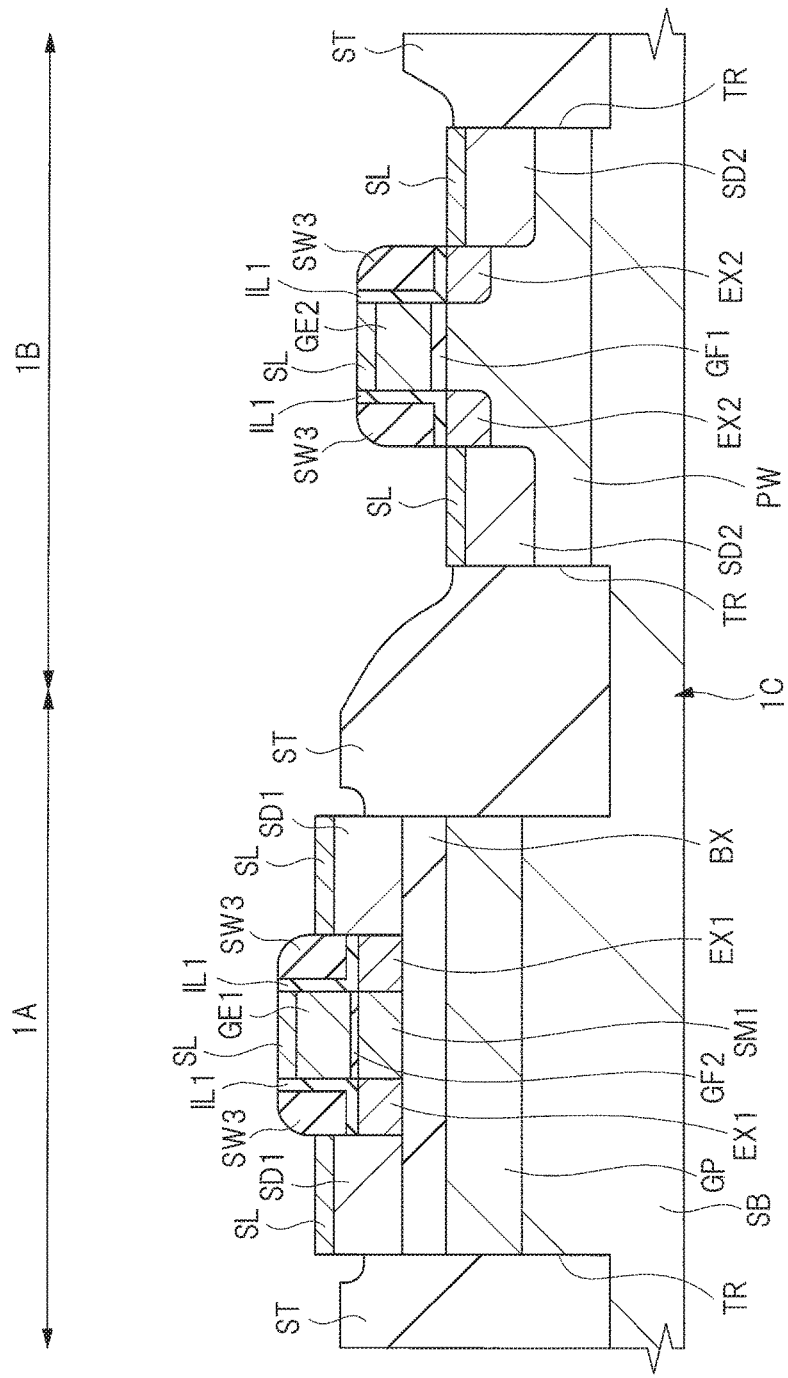
FIG. 35 is a cross-sectional view illustrating a main portion of the semiconductor device during its manufacturing process subsequent to FIG. 34.

Subsequently, as shown in FIG. 35, by a salicide (Self Aligned Silicide) technique, a low resistance metal silicide layer SL is formed on each top portion (top layer portion) of the $n^+$ type semiconductor regions SD1, SD2 and the gate electrodes GE1, GE2 (the top layer portions).

The metal silicide layer SL can be formed as follows. More specifically, a metal film for forming the metal silicide layer SL is formed on the main surface of the substrate 1C so as to cover the gate electrodes GE1, GE2 and the sidewall spacer SW3. This metal film is made of, for example, a cobalt film, a nickel film, a nickel platinum alloy film, or the like. Thereafter, thermal treatment is applied to the substrate 1C, so that each upper portion of the $n^+$ type semiconductor regions SD1 and SD2 and the gate electrodes GE1 and GE2 are reacted with the metal film. As a result, the metal silicide layer SL is formed on each of the upper portions of the $n^+$ type semiconductor regions SD1, SD2 and the gate electrodes GE1, GE2. Thereafter, unreacted metal films are removed. FIG. 35 shows a cross-sectional view in this state.

Since the metal silicide layer SL is thus formed, diffusion resistances, contact resistances, and the like of the gate electrodes GE1 and GE2 and the n+ type semiconductor regions SD1 and SD2 can be reduced in resistance.

In this manner, step S15 is performed, and a semiconductor device such as a MISFET (transistor) can be formed in each of the SOI region 1A and the bulk region 1B.

Figure 36:
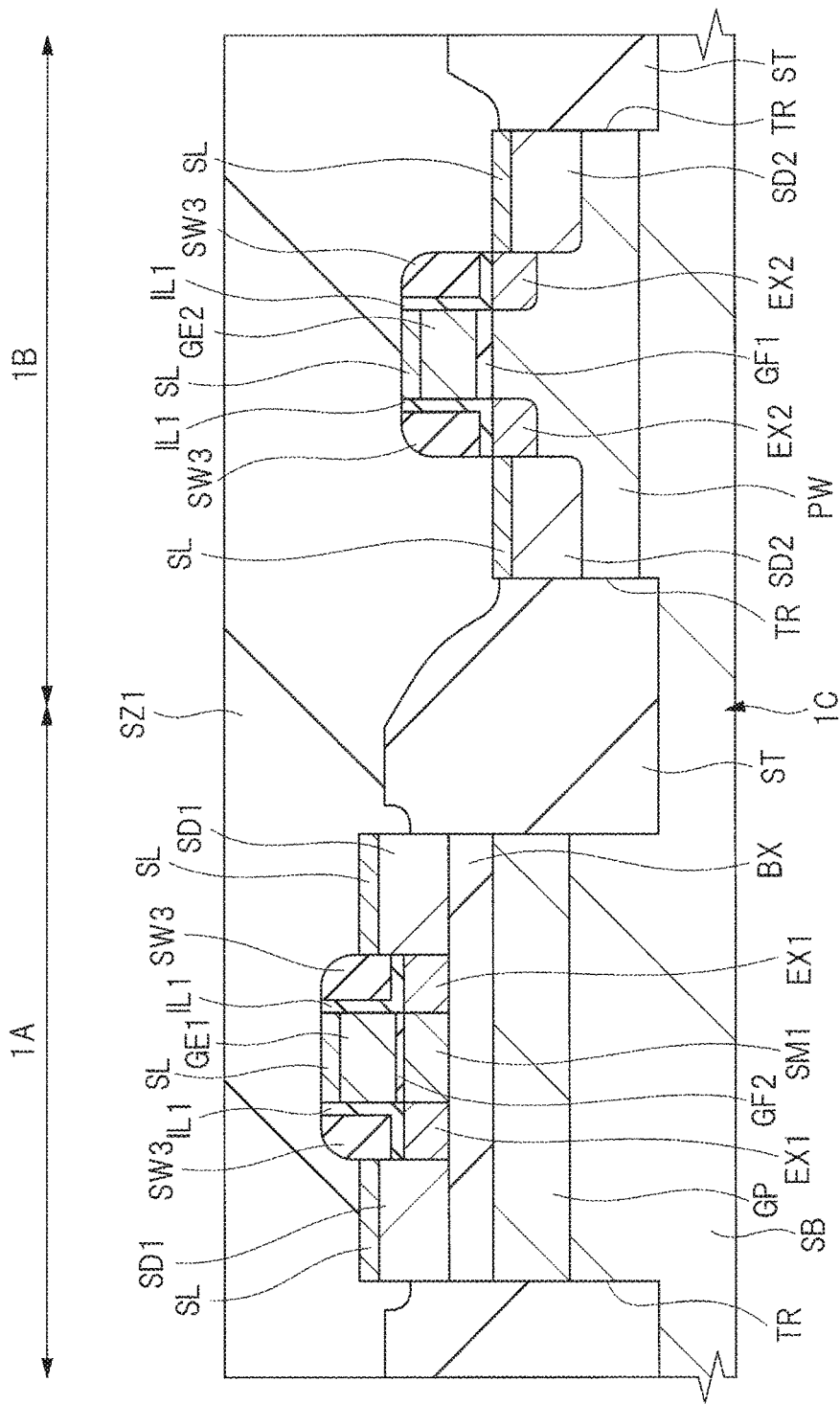
FIG. 36 is a cross-sectional view illustrating a main portion of the semiconductor device during its manufacturing process subsequent to FIG. 35.

Subsequently, as shown in FIG. 36, an insulating film SZ1 is formed as an interlayer insulating film on the main surface of the substrate 1C so as to cover the gate electrodes GE1 and GE2 and the sidewall spacer SW3. The insulating film SZ1 may be made of, e.g., a single film of an oxidized silicon film, or a layered film of a silicon nitride film and a thick silicon oxide film formed on the silicon nitride film. After the insulating film SZ1 is formed, a top surface of the insulating film SZ1 can be polished by a CMP method if necessary.

Figure 37:
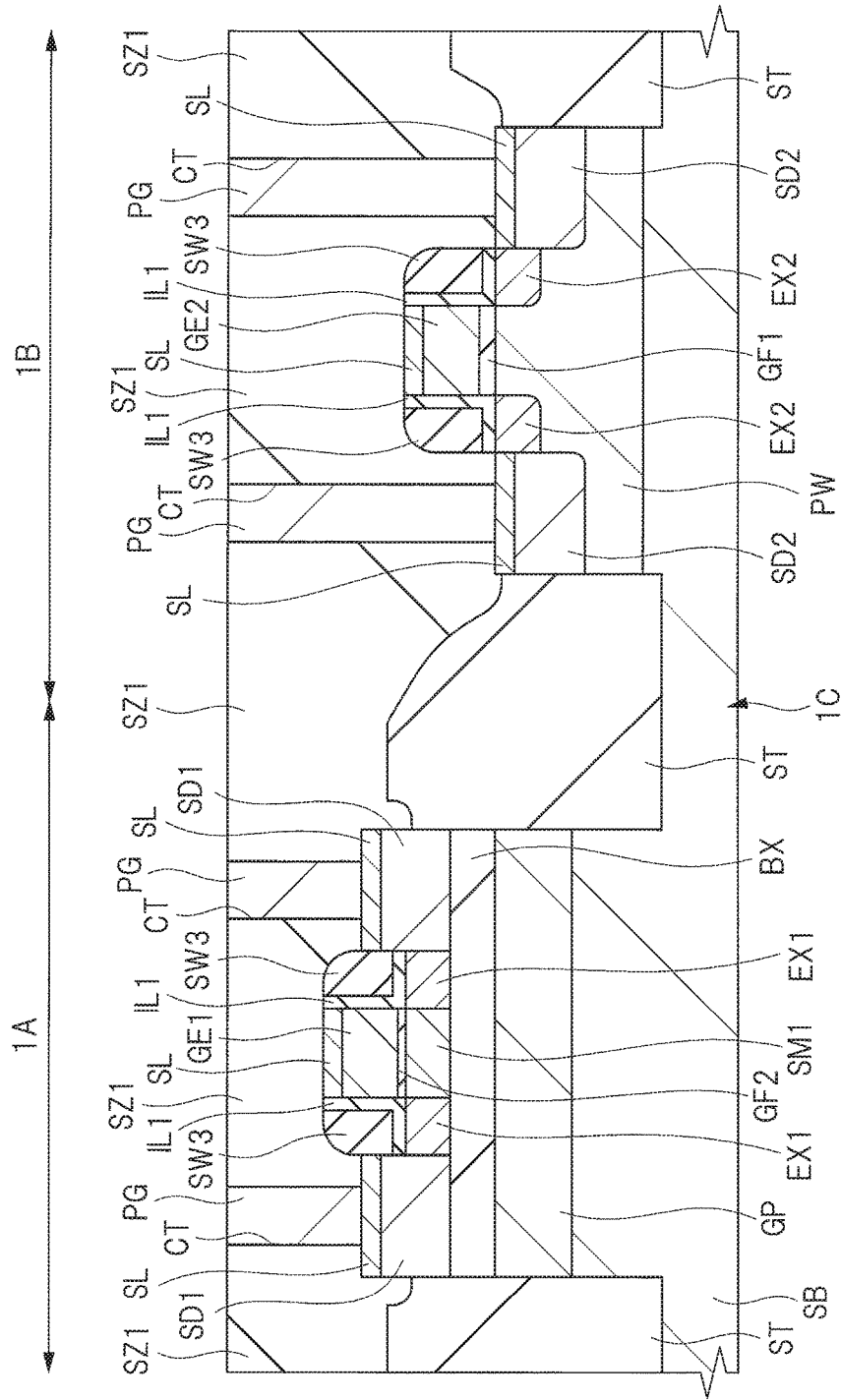
FIG. 37 is a cross-sectional view illustrating a main portion of the semiconductor device during its manufacturing process subsequent to FIG. 36.

Subsequently, as shown in FIG. 37, the insulating film SZ1 is dry-etched by using a photoresist pattern (not shown) formed on the insulating film SZ1 as an etching mask to form contact holes (through holes) CT in the insulating film SZ1.

Subsequently, a conductive plug PG made of tungsten (W) or the like is formed in each of the contact holes CT.

To form the plug PG, first, a barrier conductor film is formed on the insulating film SZ1 including a bottom surface and a sidewall of each contact hole CT, and then a main conductor film made of a tungsten film or the like is formed on the barrier conductor film to fill each contact hole CT. Thereafter, unnecessary main conductor film and barrier conductor film outside each contact hole CT are removed by the CMP method, etch back method, or the like. As a result, the plug PG is formed by the barrier conductor film and the main conductor film which are embedded and remaining in each contact hole CT of the insulating film SZ1. Incidentally, for simplicity of the drawing, in FIG. 37, the barrier conductor film and the main conductor film constituting each plug PG are shown in an integrated manner. The plugs PG are electrically connected to: the metal silicide layer SL on the n+ type semiconductor region SD1; the metal silicide layer SL on the n+ type semiconductor region SD2; the metal silicide layer SL on the gate electrode GE1; or the metal silicide layer SL on the gate electrode GE2.

Subsequently, a wire M1 which is a first-layer wire is formed on the insulating film SZ1 in which the plugs PG are embedded. A case where this wire M1 is formed by using a damascene technique will be described.

Figure 38:
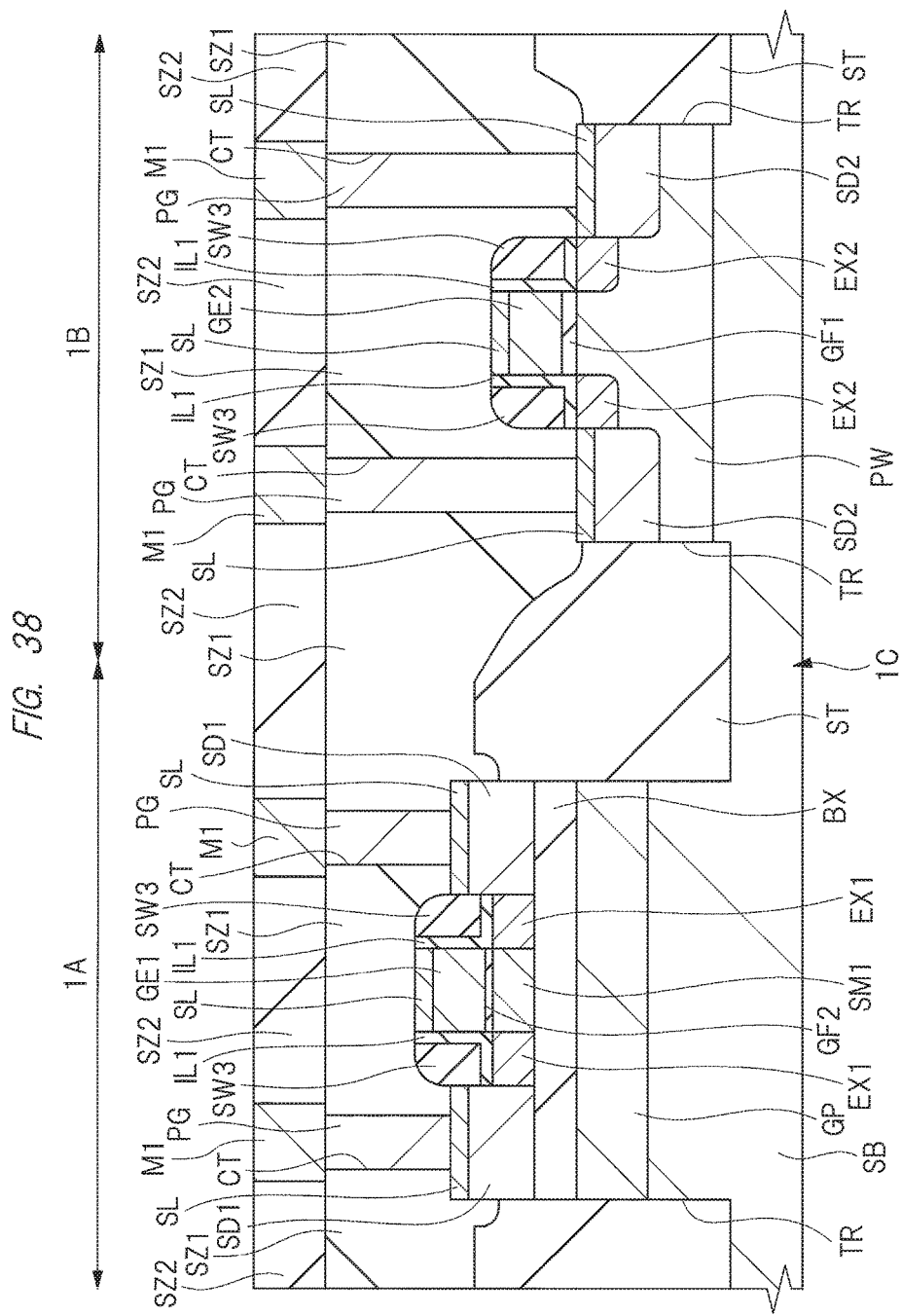
FIG. 38 is a cross-sectional view illustrating a main portion of the semiconductor device during its manufacturing process subsequent to FIG. 37.

First, as shown in FIG. 38, an insulating film SZ2 is formed on the insulating film SZ1 in which the plugs PG are embedded. Then, after forming a wire trench in a predetermined region of the insulating film SZ2 by dry etching by using a photoresist pattern (not shown) as an etching mask, a barrier conductor film is formed on the insulating film SZ2 including the bottom surface and the side wall of the wire trench. Then, a seed layer of copper is formed on the barrier conductor film; a copper plating film is formed on the seed layer; and an inside of the wire trench is filled with a copper plating film. Subsequently, the copper plating film, the seed layer, and the barrier conductor film which are located in a region other than the wire trench are removed by the CMP method to form the first-layer wire M1 by using copper embedded in the wire trench as a main conductive material. In FIG. 38, to simplify the drawing, the wire M1 is shown in such a manner that the barrier conductor film, the seed layer, and the copper plating film are integrated.

Thereafter, a second-layer wires and subsequent-layer wires thereto are also formed by a dual damascene method or the like, but illustrations and descriptions thereof are omitted here. The wire M1, and upper-layer wires above the wire M1 are not limited to damascene wires, but can also be formed by patterning a conductor film for wire and formed as, e.g., tungsten wires or aluminum wires.

The semiconductor device according to the present embodiment is manufactured as described above.

In the explanation about the present embodiment, the n channel-type MISFET is formed as a MISFE. Alternatively, a p channel-type MISFET can also be formed by inverting a conductivity type. One or both of then channel-type MISFET and the p channel-type MISFET can be formed in the SOI region 1A, and one or both of the n channel-type MISFET and the p channel-type MISFET can be formed in the bulk region 1B.

Reviewing Examples

Figure 39:
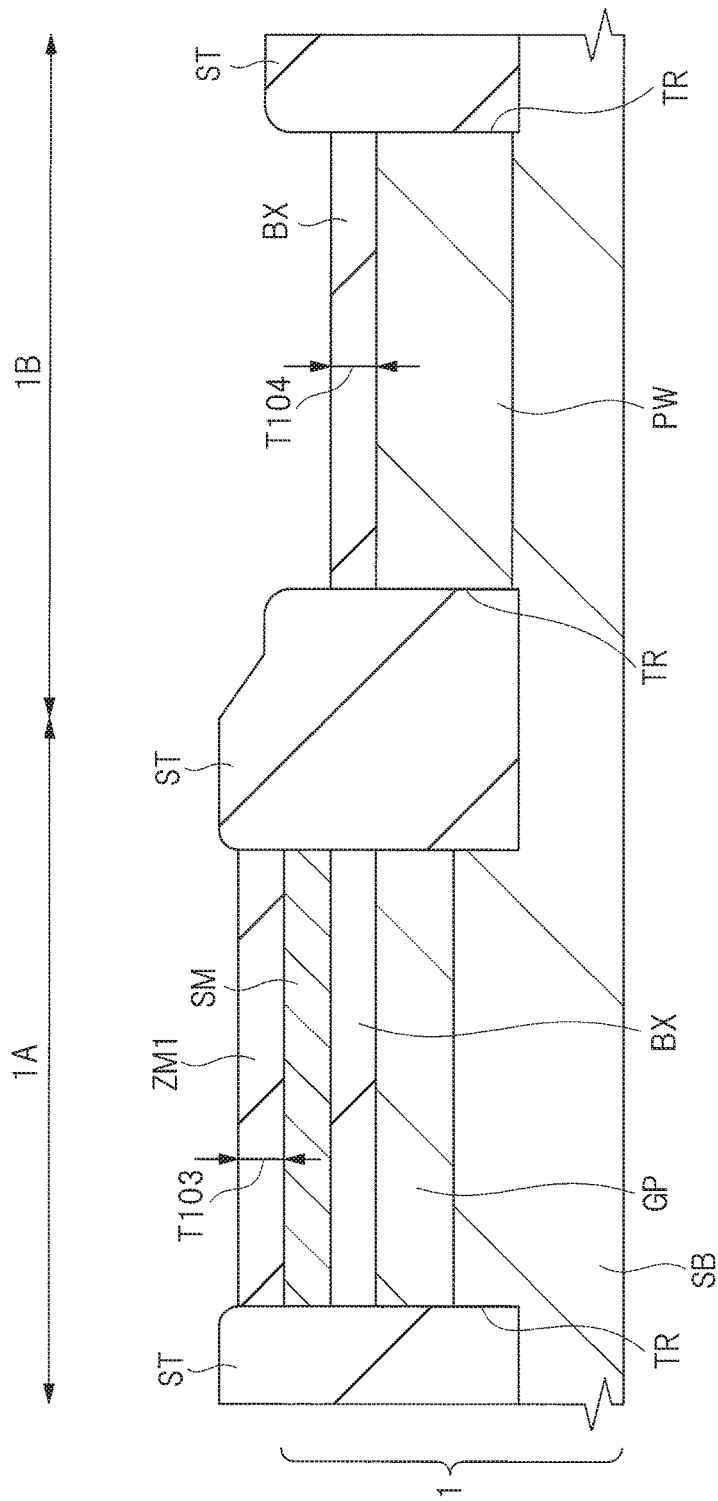
FIG. 39 is a cross-sectional view illustrating a main portion of a semiconductor device according to a first reviewing example during its manufacturing process.
Figure 40:
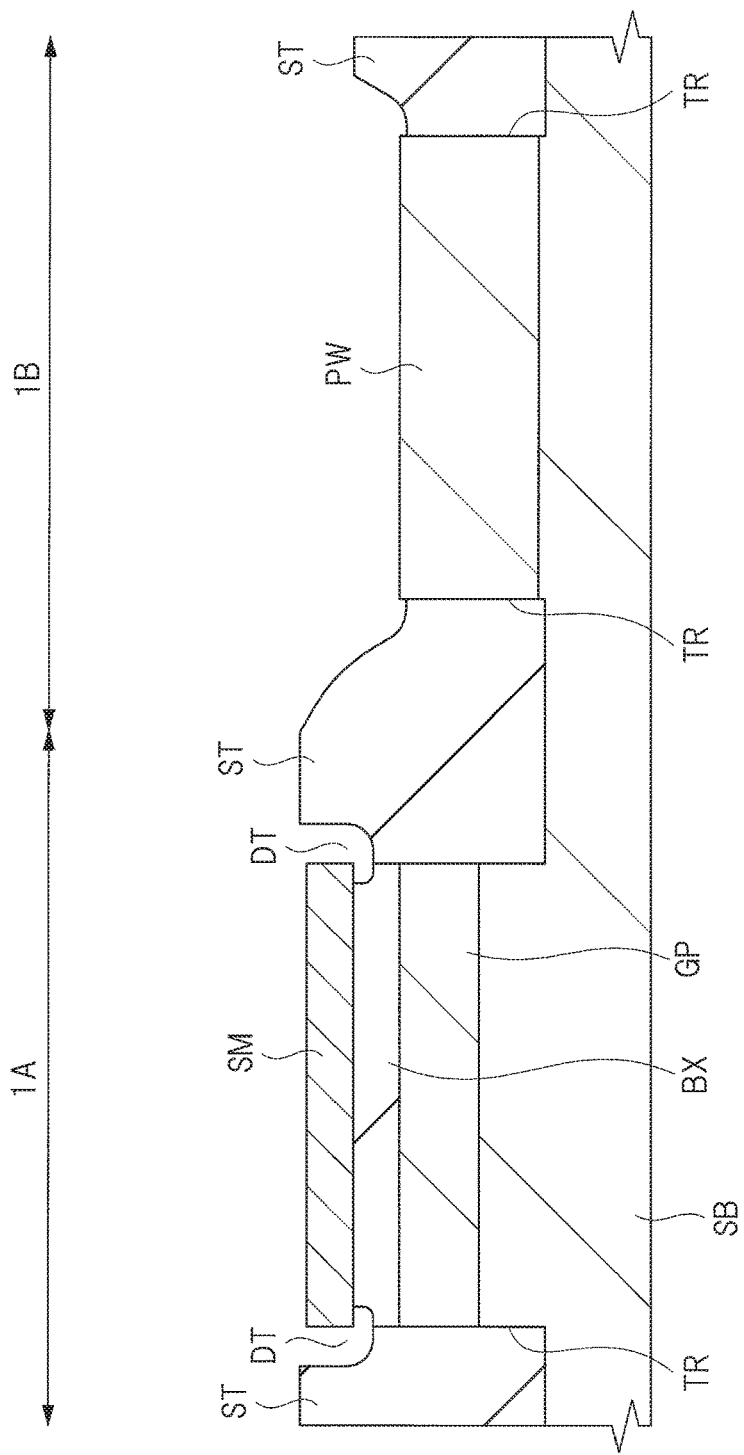
FIG. 40 is a cross-sectional view illustrating a main portion of the semiconductor device according to the first reviewing example during its manufacturing process subsequent to FIG. 39.

A first reviewing example studied by the inventor of the present application will be explained with reference to FIG. 39 and FIG. 40. FIG. 39 and FIG. 40 are cross-sectional views illustrating a main portion of a semiconductor device according to the first reviewing example during a manufacturing process.

A manufacturing process of the semiconductor device according to the first reviewing example is almost the same as the manufacturing process of the semiconductor device according to the present embodiment from performance of step S10 to obtainment of the structure of above FIG. 13. Therefore, here, the explanation thereabout is omitted.

In a case of the first reviewing example, a process similar to the above step S10 is performed to remove the semiconductor layer SM in the bulk region 1B by etching, and then the same processes as those of above step S12 and step S13 are performed without performing above step S11 to form a semiconductor region GP and a p type well PW as shown in FIG. 39. Thereafter, in the case of the first reviewing example, a process corresponding to above step S14 is performed to remove the insulating film ZM1 in the SOI region 1A and the insulating layer BX in the bulk region 1B by etching as shown in FIG. 40. Thereafter, also in the case of the first reviewing example, a process similar to step S15 explained above is performed to form the MISFET in each of the SOI region 1A and the bulk region 1B. However, illustrations and descriptions thereof are omitted here.

In a case of a manufacturing process of the first reviewing example, above step S11 is not performed unlike the present embodiment. Therefore, a thickness T103 of the insulating film ZM1 in the SOI region 1A and a thickness T104 of the insulating layer BX in the bulk region 1B in a step immediately before performing an etching process corresponding to the step S14 are very thick (see FIG. 39). More specifically, the thickness T103 of the insulating film ZM1 in the SOI region 1A shown in FIG. 39 is almost the same as the thickness T1 of the insulating film ZM1 in the SOI region 1A shown in above FIG. 13 (T103=T1), and the thickness T104 of the insulating layer BX in the bulk region 1B shown in FIG. 39 is almost the same as the thickness T2 of the insulating layer BX in the bulk region 1B shown in the above FIG. 13 (T104=T2).

In the case of the first reviewing example, processes corresponding to above steps S12 and S13 are performed to obtain the structure of FIG. 39; thereafter an etching process corresponding to step S14 is performed; and the insulating film ZM1 in the SOI region 1A and the insulating layer BX in the bulk region 1B are removed; and so the top surface of the semiconductor layer SM in the SOI region 1A and the top surface of the semiconductor substrate SB in the bulk region 1B are exposed. However, when the etching process corresponding to this step S14 is performed, divots (recesses, depressions) DT may be generated in the device isolation region ST as shown in FIG. 40. The divots DT are likely to occur at ends of the device isolation region ST (end portion adjacent to the semiconductor layer SM). The divot DT of each device isolation region ST can be generated when the device isolation region ST is excessively etched by a chemical solution (etching solution) used in the etching process.

As shown in FIG. 40, when the divots DT of the device isolation regions ST occur at positions adjacent to the semiconductor layer SM in the SOI region 1A, various problems may occur, and their examples will be described below.

As shown in FIG. 40, the following case will be considered: the divots DT of the device isolation regions ST occur at the positions adjacent to the semiconductor layer SM in the SOI region 1A; each divot DT reaches the insulating layer BX in the SOI region 1A; and the insulating layer BX exposed from the divots DT is side-etched. In this case, when the above-mentioned silicon film PS is formed and then the silicon film PS is patterned to form the gate electrodes GE1 and GE2, a remaining portion of the silicon film PS (hereinafter referred to as the "remaining portion of the silicon film PS") is generated in each divot DT. When the remaining portion of the silicon film PS is generated in each divot DT, the remaining portion of the silicon film PS comes to be adjacent to the semiconductor layer SM via the thin insulating film, and so the remaining portion of the silicon film PS comes to be adjacent to the $n^+$ type semiconductor region SD1 (source/drain region) via the thin insulating film. A thin insulating film interposed between the remaining portion of the silicon film PS in each divot DT and the semiconductor layer SM ($n^+$ type semiconductor region SD1) is an insulating film on the same layer formed in the same process as that of the gate insulating film GF2. Since an end of the gate electrode GE1 in the gate width direction is located on the device isolation region ST, the remaining portion of the silicon film PS in each divot DT becomes in a state of being integrally connected with the gate electrode GE1. Therefore, the remaining portion of the silicon film PS in each divot DT is electrically connected to the gate electrode GE1. Accordingly, occurrence of the remaining portion of the silicon film PS in each divot DT means that the remaining portion of the silicon film PS in each divot DT, which is electrically connected to the gate electrode GE1, comes to be adjacent to the source/drain region ($n^+$ type semiconductor region SD1) via the thin insulating film, and that there is a fear of making a leakage current generated between the gate electrode GE1 and the source/drain region ($n^+$ type semiconductor region SD1). This may degrade reliability of the semiconductor device.

As described above, when the divots DT are likely to occur in the device isolation region ST and depth of each divot DT is deep, this leads to degradation in the reliability of the semiconductor device. Therefore, in order to improve the reliability of the semiconductor device, it is desirable to suppress occurrence of the divots DT in the device isolation region ST or, even if the divots DT occur, to make their depth shallower. Since the divots DT that have occurred before the process of forming the gate insulating films GF1 and GF2 are likely to lead to the degradation in the reliability of the semiconductor device, it is desirable to suppress the occurrence of the divots DT in the device isolation region ST before the process for forming the gate insulating films GF1 and GF2.

The divots DT of the device isolation region ST occur when the device isolation region ST is excessively etched in the etching process corresponding to step S14. The divots DT hardly occur in the device isolation region ST before the etching process corresponding to step S14 is performed. However, if the device isolation region ST is excessively etched in the etching process corresponding to step S14, the divots DT are formed, and their depth becomes deep.

There are two factors in the occurrence of the divots DT when the device isolation region ST is excessively etched in the etching process corresponding to step S14. The first factor is that the ion implantation process is performed before the etching process corresponding to step S14, and that impurity ions are also injected into the device isolation region ST during the ion implantation. The second factor is that the etching amount of etching process corresponding to step S14 is large.

When the impurity ions are implanted into the device isolation region ST before the etching process corresponding to step S14, the device isolation region ST becomes etched easily, and when the etching process corresponding to step S14 is performed, the etching speed becomes increased easily.

Therefore, it is also considered to: make the impurity ions not implanted into the device isolation region ST before the etching process corresponding to step S14; thus prevent the device isolation region ST from being excessively etched by the etching process corresponding to step S14; and suppress the occurrence of the divots DT. However, it is sometimes desirable to form the semiconductor region GP in the semiconductor substrate SB within the SOI region 1A so that the threshold value voltage of the MISFET formed in the SOI region 1A can be controlled. In such a case, it is desirable to perform the ion implantation to form the semiconductor region GP before performing the etching process corresponding to step S14. This is because if the semiconductor region GP is formed by the ion implantation after the etching process corresponding to step S14 and before forming the gate insulating film, a photoresist pattern corresponding to the photoresist pattern PR2 is directly formed on a surface (silicon surface) of the semiconductor substrate SB exposed in the bulk region 1B, which is undesirable. On the contrary, if the semiconductor region GP is formed by the ion implantation after forming the gate insulating film or after forming the silicon film PS, the gate insulating film and the silicon film PS are affected by the ion implantation, and there is a fear of affecting characteristics of the MISFET, which is also undesirable. If the semiconductor region GP is formed by the ion implantation after forming the gate electrode, the gate electrode may become an obstacle, and thereby there is a fear of making it impossible to form the semiconductor region GP well. Therefore, it is desirable to form the semiconductor region GP by the ion implantation before performing the etching process corresponding to step S14.

When the ion implantation is performed to form the semiconductor region GP, the ion implantation is performed with the photoresist pattern (PR2) being formed in order to prevent the ion implantation from being performed into the semiconductor substrate SB in the bulk region 1B. However, the impurity ions to be implanted are implanted into not only in the semiconductor substrate SB in the SOI region 1A but also a portion of the device isolation region ST not covered by the photoresist pattern (PR2). More specifically, the impurity ions are also implanted into a region of the device isolation region ST adjacent to the semiconductor layer SM in the SOI region 1A in a plan view. For this reason, after the ion implantation is performed to form the semiconductor region GP and immediately before the etching process corresponding to step S14 is performed, a large amount of impurity ions become injected into a position (region) of the device isolation region ST adjacent to the semiconductor layer SM in the SOI region 1A in a plan view. The device isolation region ST is etched easily when the impurity ions are implanted, and the etching speed is made easily high. More specifically, in the device isolation region ST, a region through which the impurity ions implanted have passed and a region where the impurity ions are present become easily etched (the etching speed is made easily high). Therefore, if the large amount of impurity ions are injected into the region of the device isolation region ST adjacent to the semiconductor layer SM in the SOI region 1A in the plan view, there is a fear for occurrence of the divot DT at the position adjacent to the semiconductor layer SM in the SOI region 1A when the etching process corresponding to step S14 is performed.

Therefore, it is considered to thin the thickness of the insulating layer BX when the SOI substrate 1 is prepared in step S1 and the thickness of the insulating film ZM1 when the insulating film ZM1 is formed in step S2. If so, in the etching process corresponding to step S14, the thickness of the insulating film ZM1 in the SOI region 1A and the thickness of the insulating layer BX in the bulk region 1B which are to be etched are thinned, so that the etching amount of the device isolation region ST in the etching process corresponding to step S14 can be reduced. This can: prevent the device isolation region ST from being excessively etched by the etching process corresponding to the step S14; suppress the occurrence of the divots DT; and, even when the divots DT are formed, make the depth of the divots DT shallow.

However, it is not easy to thin the thickness of the insulating layer BX when preparing the SOI substrate 1 in step S1. This is because if the thickness of the insulating layer BX is thinned at preparation for the SOI substrate 1 in the step S1, the thickness of the insulating layer BX in the SOI region 1A is inevitably made thin in the manufactured semiconductor device, but the thickness of the insulating layer BX in the SOI region 1A is to be set to the optimum thickness according to required characteristics etc. of the semiconductor device. Incidentally, the thickness of the insulating layer BX in the SOI region 1A in the manufactured semiconductor device is maintained at the thickness of the insulating layer BX at the preparation for the SOI substrate 1 in step S1. If the thickness of the insulating layer BX in the SOI region 1A is made thin, there is a fear of affecting the characteristics of the semiconductor device. Additionally, even if the thickness of the insulating film ZM1 is made thin at formation of the insulating film ZM1 in step S2, the etching amount in the etching process corresponding to the step S14 cannot be reduced thereby. This reason is as follows: when the thickness of the insulating layer BX is thick even if the thickness of the insulating film ZM1 is thin at formation of the insulating film ZM1 in step S2, the etching amount in the etching process corresponding to step S14 needs to be set to an etching amount sufficient for removing the insulating layer BX in the bulk region 1B.

Additionally, when a voltage is applied to the semiconductor region GP to control the threshold value voltage of the MISFET in the SOI region 1A, there is a fear of reducing the reliability of the insulating layer BX, for example, the TDDB (Time Dependence on Dielectric Breakdown) lifetime if the thickness of the insulating layer BX in the SOI region 1A is too thin. Therefore, it is desirable that the insulating layer BX of SOI region 1A has a certain thickness or more. For example, the thickness of the insulating layer BX in the SOI region 1A, i.e., the thickness of the insulating layer BX at the preparation for the SOI substrate 1 in step S1 can be about 10 to 20 nm.

As described above, it is necessary to set the thickness of the insulating layer BX in the SOI region 1A in view of the required characteristics etc. of the semiconductor device, and it is not easy to thin the thickness of the insulating layer BX at the preparation for the SOI substrate 1 in step S1. For this reason, in the case of the manufacturing process of the first reviewing example of FIG. 39 and FIG. 40, the thickness T103 of the insulating film ZM1 in the SOI region 1A and the thickness T104 of the insulating layer BX of the bulk region 1B are considerably thick immediately before the etching process corresponding to step S14 is performed. As a result, the etching amount in the etching process corresponding to step S14 becomes considerably large. In the case of the manufacturing process according to the first reviewing example of FIG. 39 and FIG. 40, the ion implantation for forming the semiconductor region GP in the semiconductor substrate SB within the SOI region 1A is performed before performing the etching process corresponding to step S14, so that the large amount of impurity ions have been implanted into the device isolation region ST during the ion implantation.

Accordingly, in the case of the manufacturing process according to the first reviewing example of FIG. 39 and FIG. 40, the etching speed for performing the etching process corresponding to step S14 is made easily increased in the device isolation region ST in which the large amount of impurity ions have been implanted, and that the etching amount in the etching process corresponding to step S14 is considerably large. Therefore, there is a fear of the occurrence of the divots DT at the position adjacent to the semiconductor layer SM in the SOI region 1A. Since the occurrence of divots DT leads to the degradation in the reliability of the manufactured semiconductor device, it is preferable to suppress the occurrence of divots DT in the device isolation region ST or it is preferable to thin each thickness of the divots DT even if the divot DT occurs in order to improve the reliability of the semiconductor device.

Main Features of Present Embodiment

One of the main features of the present embodiment is to perform the etching process of step S11.

More specifically, in the present embodiment, prepared for steps S1 to S8 is the substrate (SOI substrate 1) which includes the semiconductor substrate SB; the insulating layer BX on the semiconductor substrate SB; the semiconductor layer SM on the insulating layer BX, the insulating film ZM1 (first insulating film) on the semiconductor layer SM; the trench TR penetrating through the insulating film ZM1, the semiconductor layer SM, and the insulating layer BX and reaching the semiconductor substrate SB; and the device isolation region ST embedded in the trench TR. Incidentally, the insulating layer BX, the insulating film ZM1, and the device isolation region ST are made of the same material, and preferably made of silicon oxide. Then, in step S9, the insulating film ZM1 (first insulating film) in the bulk region 1B (first region) is removed by etching to expose the semiconductor layer SM in the bulk region 1B and leave the insulating film ZM1 (first insulating film) in the SOI region 1A (second region). Thereafter, in step S10, the semiconductor layer SM in the bulk region 1B is removed by etching to expose the insulating layer BX in the bulk region 1B. Thereafter, in step S11, the insulating layer BX in the bulk region 1B and the insulating film ZM1 in the SOI region 1A are etched to thin the thickness of the insulating layer BX in the bulk region 1B and the thickness of the insulating film ZM1 in the SOI region 1A. Thereafter, in step S12, the impurities are implanted into the semiconductor substrate SB in the SOI region 1A to form the semiconductor region GP (first semiconductor region). Then, in step S14, the insulating layer BX in the bulk region 1B and the insulating film ZM1 in the SOI region 1A are removed by etching to expose the semiconductor substrate SB in the bulk region 1B and the semiconductor layer SM in the SOI region 1A. After that, a first transistor (MISFET) is formed over the semiconductor substrate SB in the bulk region 1B, and a second transistor (MISFET) is formed on the semiconductor layer SM in the SOI region 1A.

In the present embodiment, after the semiconductor layer SM in the bulk region 1B is removed to expose the insulating layer BX in the bulk region 1B in the etching process of step S10, the etching process of step S11 is performed, so that the thickness of the insulating film ZM1 in the SOI region 1A and the thickness of the insulating layer BX in the bulk region 1B are thinned. Therefore, both of the thickness of the insulating film ZM1 in the SOI region 1A and the thickness of the insulating layer BX in the bulk region 1B can be made to be thin immediately before performing the etching process in step S14, so that the etching amount in the etching process of step S14 can be reduced, and this can suppress or prevent the device isolation region ST from being excessively etched in the etching process of step S14. Therefore, the divots (DT) can be suppressed or prevented from being generated in the device isolation region ST in the etching process of step S14, and even when the divots (DT) are formed in the device isolation region ST in the etching process of step S14, the depth of the divot (DT) can be reduced. Accordingly, since defects caused by the divot (DT) of the device isolation region ST can be suppressed or prevented, the reliability of the semiconductor device can be improved.

More specifically, if the etching process of step S11 is not performed after the etching process of step S10 unlike the present embodiment, both of the thickness of the insulating film ZM1 in the SOI region 1A and the thickness of the insulating layer BX in the bulk region 1B become thick immediately before the etching process of step S14 is performed just like the first reviewing example of FIG. 39 and FIG. 40. Therefore, the etching amount in step S14 increases. Then, the large amount of impurity ions are also implanted into the device isolation region ST in the ion implantation process of step S12 before step S14, and so the etching speed of the device isolation region ST in step S14 is made easily increased. In this case, in the device isolation region ST into which the large amount of impurity ions are injected, the etching speed easily increases in the etching process of step S14, and the etching amount of the etching process of step S14 is high. Therefore, since there is a fear of the occurrence of the divots (DT) in the device isolation region ST, the reliability of the semiconductor device is reduced.

In contrast, in the present embodiment, the etching process of step S11 is performed after the etching process of step S10, and so both of the thickness of the insulating film ZM1 in the SOI region 1A and the insulating layer BX in the bulk region 1B can be made to be thin immediately before the etching process of step S14 is performed, and thereby the etching amount of step S14 can be reduced. Therefore, the large amount of impurity ions are also injected into the device isolation region ST in the ion implantation process of step S12, and so even if the etching speed of the device isolation region ST is likely to be large, the reduction in the etching amount of step S14 which makes it possible to suppress or prevent the divots from being generated in the device isolation region ST, and even if the divots are formed, the depth of each divot can be reduced. Therefore, since the defects caused by the divots of the device isolation region ST can be suppressed or prevented, the reliability of the semiconductor device can be improved.

As described above, in the case of the first reviewing example of FIG. 39 and FIG. 40, there are two factors in the fact that the device isolation region ST is excessively etched by the etching process corresponding to step S14 and the divots DT are generated. The first factor is that the ion implantation process (corresponding to step S12) is performed before the etching process corresponding to step S14, and the impurity ions are also implanted into the device isolation region ST during the ion implantation. The second factor is that the etching amount of the etching process corresponding to step S14 is large. When the first factor and the second factor are combined, the divots DT occur in the device isolation region ST in the etching process corresponding to step S14. In the present embodiment, after the etching process of step S10 and before the ion implantation of step S12, the etching process of step S11 is performed to thin the thickness of the insulating film ZM1 in the SOI region 1A and the thickness of the insulating layer BX in the bulk region 1B, and so the second factor is improved, which suppresses or prevents the divots (DT) from being generated in the device isolation region ST in step S14.

Additionally, in the present embodiment, by performing step S11, even if the thickness of the insulating layer BX is not thinned at the preparation for the SOI substrate 1 in step S1, both of the thickness of the insulating film ZM1 in the SOI region 1A and the thickness of the insulating layer BX in the bulk region 1B can be made to be thin immediately before the etching process of step S14 is performed, and the etching amount of step S14 can be reduced. For this reason, in the present embodiment, the thickness of the insulating layer BX in the SOI region 1A can be set to the optimum thickness in view of the required characteristics etc. of the semiconductor device. Simultaneously therewith, by performing the etching process of step S11, both of the thickness of the insulating film ZM1 in the SOI region 1A and the thickness of the insulating layer BX in the bulk region 1B can be thinned immediately before the etching process of step S14 is performed. Therefore, in view of the required characteristics etc. of the semiconductor device, the followings are compatible with each other: the thickness of the insulating layer BX in the SOI region 1A is set to the optimum thickness; and the etching amount of step S14 is reduced. As a result, the followings are compatible with each other: the improvement in the performance of the semiconductor device due to the settability of the thickness of the insulating layer BX in the SOI region 1A to the optimum thickness; and the improvement in the reliability of the semiconductor device due to suppression or prevention of the divots in the device isolation region ST by reducing the etching amount of step S14.

Another main feature of the present embodiment is as follows. More specifically, wet etching can be performed in both of the etching process of step S10 and the etching process of step S11, but the etching process of step S10 and the etching process of step S11 use etching liquids different from each other. That is, in step S10, a first etching liquid is used, and in step S11, a second etching liquid different from the first etching liquid is used.

The etching process of step S10 is a process for actively etching the semiconductor layer SM in the bulk region 1B. On the other hand, the etching process of step S11 is a process for actively etching the insulating film ZM1 in the SOI region 1A and the insulating layer BX in the bulk region 1B. Therefore, the etching process of step S10 and the etching process of step S11 are different from each other in the etching target, and so the used etching liquids are different from each other.

The etching liquid (first etching liquid) used in step S10 and the etching liquid (second etching liquid) used in step S10 are selected so as to satisfy a first condition and a second condition as follows. More specifically, the first condition is that the etching speed of each of the insulating film ZM1 and the insulating layer BX due to using the etching liquid (first etching liquid) used in step S10 is smaller (slower, lower) than the etching speed of the semiconductor layer SM due to using the etching liquid (first etching liquid) used in step S10. The second condition is that the etching speed of each of the insulating film ZM1 and the insulating layer BX due to using the etching liquid (second etching liquid) used in step S11 are larger (faster, higher) than the etching speed of each of the insulating film ZM1 and the insulating layer BX due to using the etching liquid (first etching liquid) used in step S10.

The first condition is a condition that is required because a main object of step S10 is to remove the semiconductor layer SM in the bulk region 1B by etching. When the etching liquid to be used in step S10 is selected so as to satisfy the above first condition, the etching speed of the insulating layer BX and the etching speed of the insulating film ZM1 in the etching process of step S10 are smaller than the etching speed of the semiconductor layer SM. From another viewpoint, in the etching process of step S10, the etching liquid used in step S10 is selected so that the etching speed of the insulating layer BX and the etching speed of the insulating film ZM1 are smaller than the etching speed of the semiconductor layer SM. By doing so, the semiconductor layer SM in the bulk region 1B can be removed properly in the etching process of step S10.

The second condition is a condition that is required because a main object of step S11 is to thin the thickness of the insulating film ZM1 in the SOI region 1A and the thickness of the insulating layer BX in the bulk region 1B. When the etching liquid to be used in step S11 is selected so as to satisfy the second condition, the etching speed of the insulating film ZM1 in the SOI region 1A and the etching speed of the insulating layer BX in the bulk region 1B in the etching process of step S11 are more than the etching speed of the insulating film ZM1 in the SOI region 1A and the etching speed of the insulating layer BX in the bulk region 1B in the etching process of step S10. From another viewpoint, the etching liquid to be used in step S11 is selected so that the etching speed of the insulating film ZM1 in the SOI region 1A and the etching speed of the insulating layer BX in the bulk region 1B in the etching process of step S11 are more than the etching speed of the insulating film ZM1 in the SOI region 1A and the etching speed of the insulating layer BX in the bulk region 1B in the etching process of step S10.

More specifically, when the semiconductor layer SM is made of silicon, APM liquid is preferable as the etching liquid used in step S10. When each of the insulating film ZM1 and the insulating layer BX is composed of silicon oxide, hydrofluoric acid is preferable as the etching liquid used in step S11. If an APM liquid is used in step S10 and hydrofluoric acid is used in step S11, the first condition and the second condition can be satisfied.

Unlike the present embodiment, in step S10, the semiconductor layer SM in bulk region 1B may be removed by the wet etching by using the APM liquid or the like to expose the insulating layer BX in the bulk region 1B; thereafter the wet etching may be continued without changing the etching liquid; and thus reducing the thickness of the insulating film ZM1 in the SOI region 1A and the thickness of the insulating layer BX in the bulk region 1B is also considered. This case will be hereinafter referred to as a second reviewing example. In the second reviewing example, in the etching process of step S10, over-etching is performed for a long period of time after the semiconductor layer SM in the bulk region 1B is removed and the insulating layer BX in the bulk region 1B is exposed, so that the thickness of the insulating film ZM1 in the SOI region 1A and the thickness of the insulating layer BX in the bulk region 1B are thinned. That is, the case of the second reviewing example corresponds to a case where step S11 is not performed and the over-etching is performed for a long period of time in step S10.

However, in the case of the second reviewing example, it is difficult to accurately control the thickness of the insulating film ZM1 in the SOI region 1A and the thickness of the insulating layer BX in the bulk region 1B immediately before the etching process of step S14 is performed.

Namely, the etching liquid (more preferably, APM liquid) used in step S10 is the etching liquid suitable for etching the semiconductor layer SM, and the semiconductor layer SM can be selectively etched by using this etching liquid, so that the above first condition can be satisfied. By using such etching liquid, the semiconductor layer SM in the bulk region 1B can be appropriately removed in step S10. However, since the etching liquid (more preferably APM liquid) used in step S10 is an etching liquid suitable for etching the semiconductor layer SM, the etching speed of the semiconductor layer SM by using this etching liquid can be controlled accurately to some extent, whereas the etching speed of the insulating film ZM1 and the etching speed of the insulating layer BX by using this etching liquid cannot be controlled very accurately. Therefore, in the case of the second reviewing example, even when the semiconductor layer SM in the bulk region 1B is removed to expose the insulating layer BX in the bulk region 1B and thereafter the wet etching is continued, as it is, without changing the etching liquid to thin the thickness of the insulating film ZM1 in the SOI region 1A and the thickness of the insulating layer BX in the bulk region 1B, each remaining film thickness of the insulating film ZM1 in the SOI region 1A and the insulating layer BX in the bulk region 1B cannot be very accurately controlled. Therefore, in the case of the second reviewing example, it is difficult to accurately control the thickness of the insulating film ZM1 in the SOI region 1A and the thickness of the insulating layer BX in the bulk region 1B immediately before the etching process of step S14 is performed.

As described above, in order to prevent occurrence of the divots (DT) in the device isolation region ST in the etching process of step S14, it is effective to reduce the etching amount of step S14. In order to reduce the etching amount of step S14, it is effective to thin the thickness of the insulating film ZM1 in the SOI region 1A and the thickness of the insulating layer BX in the bulk region 1B immediately before the etching process of step S14 is performed. However, even when the thickness of the insulating film ZM1 in the SOI region 1A and the thickness of the insulating layer BX in the bulk region 1B are thinned immediately before the etching process of step S14 is performed, the etching amount of step S14 cannot be reduced unless the thickness of the insulating film ZM1 in the SOI region 1A and the thickness of the insulating layer BX in the bulk region 1B can be somewhat accurately controlled. This is because when there is variation in the thickness of the insulating film ZM1 in the SOI region 1A and the thickness of the insulating layer BX in the bulk region 1B immediately before the etching process of step S14 is performed, the etching amount of the etching process of step S14 has to be set to somewhat a high level so that the insulating film ZM1 in the SOI region 1A and the insulating layer BX in the bulk region 1B do not cause remains due to the removal after step S14. In order to reduce the etching amount of step S14, it is necessary not only to thin the thickness of the insulating film ZM1 in the SOI region 1A and the thickness of the insulating layer BX in the bulk region 1B immediately before the etching process of step S14 is performed but also to somewhat accurately control the thickness of the insulating film ZM1 in the SOI region 1A and the thickness of the insulating layer BX in the bulk region 1B immediately before the etching process of step S14 is performed.

In contrast, in the present embodiment, in step S10, the semiconductor layer SM in the bulk region 1B is removed by using the first etching liquid (more preferably APM liquid) to expose the insulating layer BX in the bulk region 1B, and thereafter, in step S11, the thickness of the insulating film ZM1 in the SOI region 1A and the thickness of the insulating layer BX in the bulk region 1B are thinned by using the second etching liquid (more preferably, hydrofluoric acid) that is different from the first etching liquid. Therefore, in the case of the present embodiment, the thickness of the insulating film ZM1 in the SOI region 1A and the thickness of the insulating layer BX in the bulk region 1B can be controlled somewhat accurately immediately before the etching process of step S14 is performed.

Namely, the etching liquid (more preferably, hydrofluoric acid) used in step S11 is an etching liquid suitable for etching the insulating film ZM1 and the insulating layer BX, and the etching speed of the insulating film ZM1 and the etching speed of the insulating layer BX can be increased by using this etching liquid, so that the second condition can be satisfied. By using such an etching liquid, the etching speed of the insulating film ZM1 and the etching speed of the insulating layer BX by using this etching liquid can be controlled somewhat accurately. Therefore, in the case of the present embodiment, in the etching process of step S11, the thickness of the insulating film ZM1 in the SOI region 1A and the thickness of the insulating layer BX in the bulk region 1B can be thinned, and the remaining film thickness of the insulating film ZM1 in the SOI region 1A and the remaining film thickness of the insulating layer BX in the bulk region 1B can be controlled somewhat accurately. Accordingly, in the case of the present embodiment, the thickness of the insulating film ZM1 in the SOI region 1A and the thickness of the insulating layer BX in the bulk region 1B can be controlled somewhat accurately immediately before the etching process of step S14 is performed.

Namely, even when the thickness of the insulating film ZM1 in the SOI region 1A and the thickness of the insulating layer BX in the bulk region 1B immediately before the etching process of step S14 is performed are the same in the second reviewing example and the present embodiment, the present embodiment can more accurately control the thickness than the second reviewing example does. Therefore, the thickness of the insulating film ZM1 in the SOI region 1A and the thickness of the insulating layer BX in the bulk region 1B immediately before the etching process of step S14 is performed can be controlled more accurately in the present embodiment than in the second reviewing example, and thus the etching amount of step S14 can be further reduced. Accordingly, the etching amount of step S14 can be further reduced in the present embodiment than in the second reviewing example, so that the present embodiment can more appropriately suppress or prevent the occurrence of the divots (DT) in the device isolation region ST in the etching process of step S14.

The etching process of step S11 is performed before the ion implantation of step S12, and so the device isolation region ST in step S11 is not in a state that can be easily etched (a state into which impurity ions are implanted). For this reason, even when the etching process of step S11 is performed, it can do without the formation of the divots in the device isolation region ST. In the present embodiment, the thickness of the insulating layer BX when the SOI substrate 1 is prepared in step S1 can be set to the optimum thickness depending on the required characteristics etc. of the semiconductor device, and simultaneously the thickness of the insulating film ZM1 in the SOI region 1A and the thickness of the insulating layer BX in the bulk region 1B are thinned in the etching process of step S11. In the etching process of step S10, the etching liquid suitable for etching the semiconductor layer SM, i.e., the etching liquid that easily etches the semiconductor layer SM is used, so that the semiconductor layer SM in the bulk region 1B is appropriately removed. Then, in the etching process of step S11, the etching liquid suitable for etching the insulating film ZM1 and the insulating layer BX, i.e., the etching liquid that easily etches the insulating film ZM1 and the insulating layer BX is used, so that the thickness of the insulating film ZM1 in the SOI region 1A and the thickness of the insulating layer BX in the bulk region 1B are thinned. Therefore, the thickness of the insulating film ZM1 in the SOI region 1A and the thickness of the insulating layer BX in the bulk region 1B can be made to be thin immediately before the etching process of step S14 is performed, and simultaneously each of the thickness of the insulating film ZM1 in the SOI region 1A and the thickness of the insulating layer BX in the bulk region 1B can be precisely controlled to a predetermined thickness immediately before the etching process of step S14 is performed. Therefore, in the etching process of step S14, since the etching amount can be precisely reduced, the occurrence of the divots can be precisely prevented or suppressed in the device isolation region ST, and even when the divots are formed, the depth of each divot can be reduced. Accordingly, since defects caused by the divots of the device isolation region ST can be suppressed or prevented, the reliability of the semiconductor device can be precisely improved.

Other features of the present embodiment will be further explained.

The thickness T3 of the insulating film ZM1 in the SOI region 1A and the thickness T4 of the insulating layer BX in the bulk region 1B immediately after the etching of step S11 is finished are preferably 3 nm or more (i.e., T3≥3 nm, T4≥3 nm), respectively.

When the thickness T3 of the insulating film ZM1 in the SOI region 1A and the thickness T4 of the insulating layer BX in the bulk region 1B are too thin immediately after the etching of step S11 is finished, there is a fear that the semiconductor layer SM in the SOI region 1A and the semiconductor substrate SB in the bulk region 1B may be partially exposed when step S11 is finished. When the semiconductor layer SM in the SOI region 1A and the semiconductor substrate SB in the bulk region 1B are partially exposed at a time of finishing the step S11, the photoresist film formed in step S12 or step S13 comes into contact with an exposed surface of the semiconductor layer SM or the semiconductor substrate SB, which is not desirable. Thus, the thickness T3 of the insulating film ZM1 in the SOI region 1A and the thickness T4 of the insulating layer BX in the bulk region 1B immediately after the etching of step S11 is finished are preferably 3 nm or more, and thereby the semiconductor layer SM in the SOI region 1A and the semiconductor substrate SB in the bulk region 1B can be appropriately prevented from being partially exposed when step S11 is finished.

Additionally, the etching thickness of the insulating film ZM1 in the SOI region 1A and the etching thickness of the insulating layer BX in the bulk region 1B in the etching process of step S11 are preferably 5 nm or more. That is, a difference between the thickness T1 of the insulating film ZM1 in the SOI region 1A immediately before the etching of step S11 is performed and the thickness T3 of the insulating film ZM1 in the SOI region 1A immediately after the etching of step S11 is performed is preferably 5 nm or more (i.e., T1−T3≥5 nm). A difference between the thickness T2 of the insulating layer BX in the bulk region 1B immediately before the etching of step S11 is performed and the thickness T4 of the insulating layer BX in the bulk region 1B immediately after the etching of step S11 is performed is preferably 5 nm or more (i.e., T2−T4≥5 nm). Thereby, the etching amount in the etching process of step S14 can be precisely reduced, so that the effect of suppressing or preventing the occurrence of the divots in the device isolation region ST in the etching process of step S14 can be precisely obtained.

Additionally, the problem in which the divots are formed in the device isolation region ST is a problem of occurring for the reason that the device isolation region ST is also etched when the insulating film ZM1 and the insulating layer BX are etched in the etching process of step S14 due to the material of the device isolation region ST being the same as the materials forming the insulating film ZM1 and the insulating layer BX. Therefore, the effect is high when the present embodiment is applied to the case where the device isolation region ST, the insulating film ZM1, and the insulating layer BX are made of the same material. The device isolation region ST, the insulating film ZM1, and the insulating layer BX are more preferably made of oxide silicon.

In the present embodiment, the thickness of the insulating film ZM1 in the SOI region 1A and the thickness of the insulating layer BX in the bulk region 1B immediately before the etching process of step S14 is performed are preferably the same. Thereby, the etching amount in the etching process of step S14 can be efficiently reduced, so that the effect of suppressing or preventing the occurrence of the divots in the device isolation region ST in the etching process of step S14 can be obtained precisely.

That is, when the insulating film ZM1 in the SOI region 1A is thicker than the insulating layer BX in the bulk region 1B immediately before the etching process of step S14 is performed, it is necessary to set the etching amount of step S14 in accordance with the thickness of the thick insulating film ZM1. When the insulating layer BX in the bulk region 1B is thicker than the insulating film ZM1 in the SOI region 1A immediately before the etching process of step S14 is performed, it is necessary to set the etching amount of step S14 in accordance with the thickness of the thick insulating layer BX. Therefore, in order to efficiently reduce the etching amount of step S14, it is more advantageous to make the thickness of the insulating film ZM1 in the SOI region 1A and the thickness of the insulating layer BX in the bulk region 1B thinner immediately before the etching process of step S14 is performed, and to make the thickness of the insulating film ZM1 in the SOI region 1A and the thickness of the insulating layer BX in the bulk region 1B the same immediately before the etching process of step S14 is performed.

In order to make the thickness of the insulating film ZM1 in the SOI region 1A and the thickness of the insulating layer BX in the bulk region 1B the same as each other immediately before the etching process of step S14 is performed, the thickness T1 of the insulating film ZM1 in the SOI region 1A and the thickness T2 of the insulating layer BX in the bulk region 1B may be the same as each other immediately after the etching process of step S11 is finished (i.e., T1=T2). Additionally, since the insulating film ZM1 and the insulating layer BX are made of the same material, and so the etching thickness of the insulating film ZM1 in the SOI region 1A and the etching thickness of the insulating layer BX in the bulk region 1B in step S11 become substantially the same. Therefore, immediately before the etching process of step S11 is performed, the thickness T1 of the insulating film ZM1 in the SOI region 1A and the thickness T2 of the insulating layer BX in the bulk region 1B are preferably the same (T1=T2), and this can make the thickness of the insulating film ZM1 in the SOI region 1A and the thickness of the insulating layer BX in the bulk region 1B the same immediately before the etching process of step S14 is performed. Incidentally, the thickness of the insulating film ZM1 in the SOI region 1A and the thickness of the insulating layer BX in the bulk region 1B do not change at a time immediately after the etching process of step S10 is finished and a time immediately before the etching process of step S11 is performed. Therefore, immediately after the etching process of step S10 is finished, the thickness (T1) of the insulating film ZM1 in the SOI region 1A and the thickness (T2) of the insulating layer BX in the bulk region 1B are preferably the same (T1=T2), and this can make the thickness of the insulating film ZM1 in the SOI region 1A and the thickness of the insulating layer BX in the bulk region 1B the same immediately before the etching process of step S14 is performed.

Accordingly, the forming film thickness of the insulating film ZM1 in the step S2 is preferably set so that the thickness (T1) of the insulating film ZM1 in the SOI region 1A becomes the same as the thickness (T2) of the insulating layer BX in the bulk region 1B (T1=T2) immediately after the etching process of step S10 is finished. More specifically, the forming film thickness of the insulating film ZM1 in step S2 may be set to the sum of the thickness of the insulating layer BX when step S2 is performed and the etching thickness (etching amount) of the insulating film ZM1 in the SOI region 1A in the step S10. If so, immediately after the etching process of step S10 is finished, the thickness (T1) of the insulating film ZM1 in the SOI region 1A and the thickness (T2) of the insulating layer BX in the bulk region 1B becomes the same as each other (T1=T2). On the other hand, the thickness of the insulating layer BX when the SOI substrate 1 is prepared in step S1 may be set in accordance with the required characteristics etc. of the semiconductor device.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device, the method comprising:
   (a) preparing a substrate including:
      a semiconductor substrate,
      an insulating layer comprised of a first material and formed on the semiconductor substrate,
      a semiconductor layer comprised of a second material different from the first material and formed on the insulating layer,
      a first insulating film comprised of the first material and formed on the semiconductor layer,
      a trench reaching to the semiconductor substrate through the semiconductor layer and the insulating layer, and
      a device isolation region comprised of the first material and embedded in the trench;
   (b) after the operation (a), removing the first insulating film in a first region of the substrate by etching, exposing the semiconductor layer in the first region, and leaving the first insulating film in a second region different from the first region of the substrate;
   (c) after the operation (b), removing the semiconductor layer in the first region by etching, and exposing the insulating layer in the first region;
   (d) after the operation (c), etching the insulating layer in the first region and the first insulating film in the second region, and thinning a thickness of the insulating layer in the first region and a thickness of the first insulating film in the second region;
   (e) after the operation (d), implanting an impurity into the semiconductor substrate in the second region, and forming a first semiconductor region;
   (f) after the operation (e), removing the insulating layer in the first region and the first insulating film in the second region by etching, and exposing the semiconductor substrate in the first region and the semiconductor layer in the second region; and
   (g) after the operation (f), forming a first transistor on the semiconductor substrate in the first region, and forming a second transistor on the semiconductor layer in the second region.

2. The method according to claim 1,
   wherein, in the operation (c), the semiconductor layer in the first region is removed by wet etching using a first etching liquid,
   wherein, in the operation (d), the insulating layer in the first region and the first insulating film in the second region are removed by wet etching using a second etching liquid different from the first etching liquid,
   wherein an etching speed of each of the first insulating film and the insulating layer by using the first etching liquid is smaller than an etching speed of the semiconductor layer by using the first etching liquid, and
   wherein an etching speed of each of the first insulating film and the insulating layer by using the second etching liquid is higher than the etching speed of each of the first insulating film and the insulating layer by using the first etching liquid.

3. The method according to claim 2,
   wherein the first material is silicon oxide, and
   wherein the second material is monocrystalline silicon.

4. The method according to claim 3,
   wherein the first etching liquid is an APM liquid, and
   wherein the second etching liquid is hydrofluoric acid.

5. The method according to claim 4, wherein, in the operation (f), the insulating layer in the first region and the first insulating film in the second region are removed by wet etching using a third etching liquid which is of the same type as the second etching liquid.

6. The method according to claim 1, wherein, in the operation (b), the first insulating film in the first region is removed by etching to expose the semiconductor layer in the first region by using a first mask layer that covers the first insulating film in the second region, and that exposes the first insulating film in the first region, as an etching mask.

7. The method according to claim 1, wherein the operation (a) comprises:
   (a1) preparing the substrate including the semiconductor substrate, the insulating layer formed on the semiconductor substrate, the semiconductor layer formed on the insulating layer, the first insulating film formed on the semiconductor layer and a second insulating film formed on the first insulating film;
   (a2) after the operation (a1), forming the trench reaching to the semiconductor substrate through the second insulating film, the first insulating film, the semiconductor layer and the insulating layer;
   (a3) after the operation (a2), forming a third insulating film on the second insulating film, and filling an inside of the trench with the third insulating film;
   (a4) after the operation (a3), removing the third insulating film existing outside the trench, and forming, inside the trench, the device isolation region made of the third insulating film; and
   (a5) after the operation (a4), removing the second insulating film by etching,
   wherein the second insulating film is made of a material different from the first insulating film.

8. The method according to claim 7,
   wherein the insulating layer, the first insulating film and the third insulating film are made of silicon oxide as one another,
   wherein the second insulating film is made of silicon nitride, and
   wherein, in the operation (a4), the third insulating film existing outside the trench is removed by polishing the third insulating film, and thereby the device isolation region made of the third insulating film is formed in the trench.

9. The according to claim 1, wherein the first semiconductor region is formed to control a threshold value voltage of the second transistor.

10. The method according to claim 1,
    wherein the device isolation region is arranged at a boundary between the first region and the second region, and
    wherein, in the operation (e), the impurity is implanted into a first region of the device isolation region, the first region being adjacent to the semiconductor layer in the second region.

11. The method according to claim 10, further comprising:
- (e1) after the operation (d) and before the operation (e), forming a second mask layer that covers the insulating layer in the first region and a second region of the device isolation region, and that exposes the first insulating film in the second region; and
- (e2) after the operation (e) and before the operation (f), removing the second mask layer.

* * * * *